(12) United States Patent
Otsu et al.

(10) Patent No.: US 10,872,857 B1
(45) Date of Patent: Dec. 22, 2020

(54) THREE-DIMENSIONAL MEMORY DEVICE CONTAINING THROUGH-ARRAY CONTACT VIA STRUCTURES BETWEEN DIELECTRIC BARRIER WALLS AND METHODS OF MAKING THE SAME

(71) Applicant: SANDISK TECHNOLOGIES LLC, Addison, TX (US)

(72) Inventors: Yoshitaka Otsu, Yokkaichi (JP); Kei Nozawa, Nagoya (JP); Naoto Hojo, Yokkaichi (JP); Hirofumi Tokita, Yokkaichi (JP); Eiji Hayashi, Nagoya (JP); Masanori Terahara, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/444,186

(22) Filed: Jun. 18, 2019

(51) Int. Cl.
*H01L 23/52* (2006.01)
*H01L 23/522* (2006.01)
(Continued)

(52) U.S. Cl.
CPC .... *H01L 23/5226* (2013.01); *H01L 27/11556* (2013.01); *H01L 27/11582* (2013.01);
(Continued)

(58) Field of Classification Search
CPC ......... H01L 29/78696; H01L 21/76895; H01L 21/76816; H01L 21/76877; H01L 23/5226; H01L 23/528; H01L 21/76805
See application file for complete search history.

(56) References Cited

U.S. PATENT DOCUMENTS 9,806,093 B2 10/2017 Toyama et al.
9,818,693 B2 11/2017 Toyama et al.
(Continued)

OTHER PUBLICATIONS

USPTO Office Communication, Non-Final Office Action, for U.S. Appl. No. 16/444,125, dated May 15, 2020, 24 pages.
(Continued)

*Primary Examiner* — Nicholas J Tobergte
(74) *Attorney, Agent, or Firm* — The Marbury Law Group, PLLC

(57) ABSTRACT

An alternating layer stack of insulating layers and sacrificial material layers is formed over a semiconductor substrate, and memory stack structures are formed through the vertically-alternating layer stack. A pair of unconnected barrier trenches or a moat trench is formed through the alternating stack concurrently with formation of backside trenches. Backside recesses are formed by isotropically etching the sacrificial material layers selective to the insulating layers while a dielectric liner covers the barrier trenches or the moat trench. A vertically alternating sequence of the insulating plates and the dielectric spacer plates is provided between the pair of barrier trenches or inside the moat trench. Electrically conductive layers are formed in the backside recesses. A first conductive via structure is formed through the vertically alternating sequence concurrently with formation of a second conductive via structure through a dielectric material portion adjacent to the alternating stack.

20 Claims, 92 Drawing Sheets

(51) Int. Cl.
  *H01L 29/06* (2006.01)
  *H01L 27/11556* (2017.01)
  *H01L 27/11582* (2017.01)
  *H01L 29/786* (2006.01)
  *H01L 21/768* (2006.01)
  *H01L 23/528* (2006.01)

(52) U.S. Cl.
  CPC .... *H01L 29/0653* (2013.01); *H01L 21/76805* (2013.01); *H01L 21/76816* (2013.01); *H01L 21/76877* (2013.01); *H01L 21/76895* (2013.01); *H01L 23/528* (2013.01); *H01L 29/7869* (2013.01)

(56) References Cited

U.S. PATENT DOCUMENTS

| | | | |
|---|---|---|---|
| 9,818,759 | B2 | 11/2017 | Kai et al. |
| 9,824,966 | B1 | 11/2017 | Kanakamedala et al. |
| 9,876,031 | B1 * | 1/2018 | Shimizu ............ H01L 29/42344 |
| 9,991,282 | B1 * | 6/2018 | Shimizu ............ H01L 29/42344 |
| 10,038,006 | B2 | 7/2018 | Furihata et al. |
| 10,115,632 | B1 | 10/2018 | Masamori et al. |
| 10,115,681 | B1 | 10/2018 | Ariyoshi |
| 10,192,784 | B1 | 1/2019 | Cui et al. |
| 10,269,620 | B2 | 4/2019 | Yu et al. |
| 10,290,645 | B2 | 5/2019 | Nakatsuji et al. |
| 10,304,852 | B1 * | 5/2019 | Cui .................. H01L 27/11519 |
| 10,319,680 | B1 | 6/2019 | Sel et al. |
| 10,355,009 | B1 * | 7/2019 | Kai ...................... H01L 21/8221 |
| 10,388,666 | B1 * | 8/2019 | Kai ...................... H01L 21/022 |
| 2016/0233227 | A1 | 8/2016 | Zhang et al. |
| 2017/0148800 | A1 | 5/2017 | Nishikawa et al. |
| 2017/0179026 | A1 | 6/2017 | Toyama et al. |
| 2017/0179153 | A1 | 6/2017 | Ogawa et al. |
| 2017/0352678 | A1 | 12/2017 | Lu et al. |
| 2017/0358593 | A1 | 12/2017 | Yu et al. |
| 2019/0081065 | A1 | 3/2019 | Lee |
| 2020/0235120 | A1 * | 7/2020 | Kai .................. H01L 29/40117 |

OTHER PUBLICATIONS

Notification of Transmittal of the International Search Report and Written Opinion of the International Search Authority or International Patent Application No. PCT/US2019/068956, dated Apr. 23, 2020, 13 pages.
U.S. Appl. No. 16/251,780, filed Jan. 18, 2019, SanDisk Technologies LLC.
U.S. Appl. No. 16/020,637, filed Jun. 27, 2018, SanDisk Technologies LLC.
U.S. Appl. No. 16/020,739, filed Jun. 27, 2018, SanDisk Technologies LLC.
U.S. Appl. No. 16/020,817, filed Jun. 27, 2018, SanDisk Technologies LLC.
U.S. Appl. No. 16/353,048, filed Mar. 14, 2019, SanDisk Technologies LLC.
U.S. Appl. No. 15/950,616, filed Apr. 11, 2018, SanDisk Technologies LLC.
U.S. Appl. No. 16/181,721, filed Nov. 6, 2018 SanDisk Technologies LLC.
U.S. Appl. No. 15/979,885, filed May 15, 2018, SanDisk Technologies LLC.
U.S. Appl. No. 16/251,863, filed Jan. 18, 2019, SanDisk Technologies LLC.
U.S. Appl. No. 16/251,782, filed Jan. 18, 2019, SanDisk Technologies LLC.
U.S. Appl. No. 16/404,844, filed May 7, 2019, SanDisk Technologies LLC.
U.S. Appl. No. 16/404,961, filed May 7, 2019, SanDisk Technologies LLC.
U.S. Appl. No. 16/366,245, filed Mar. 27, 2019, SanDisk Technologies LLC.
U.S. Appl. No. 16/366,330, filed Mar. 27, 2019, SanDisk Technologies LLC.

* cited by examiner

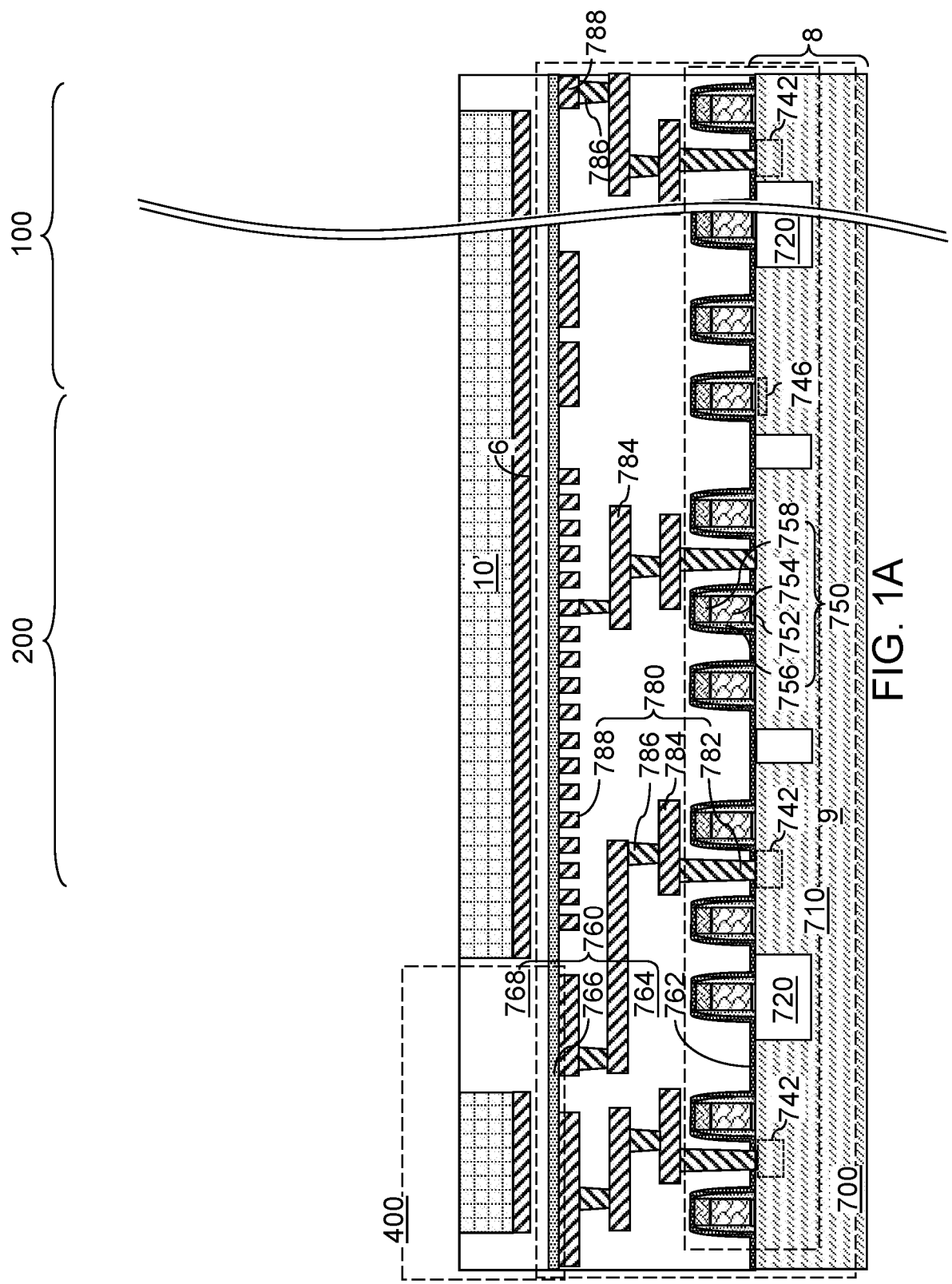

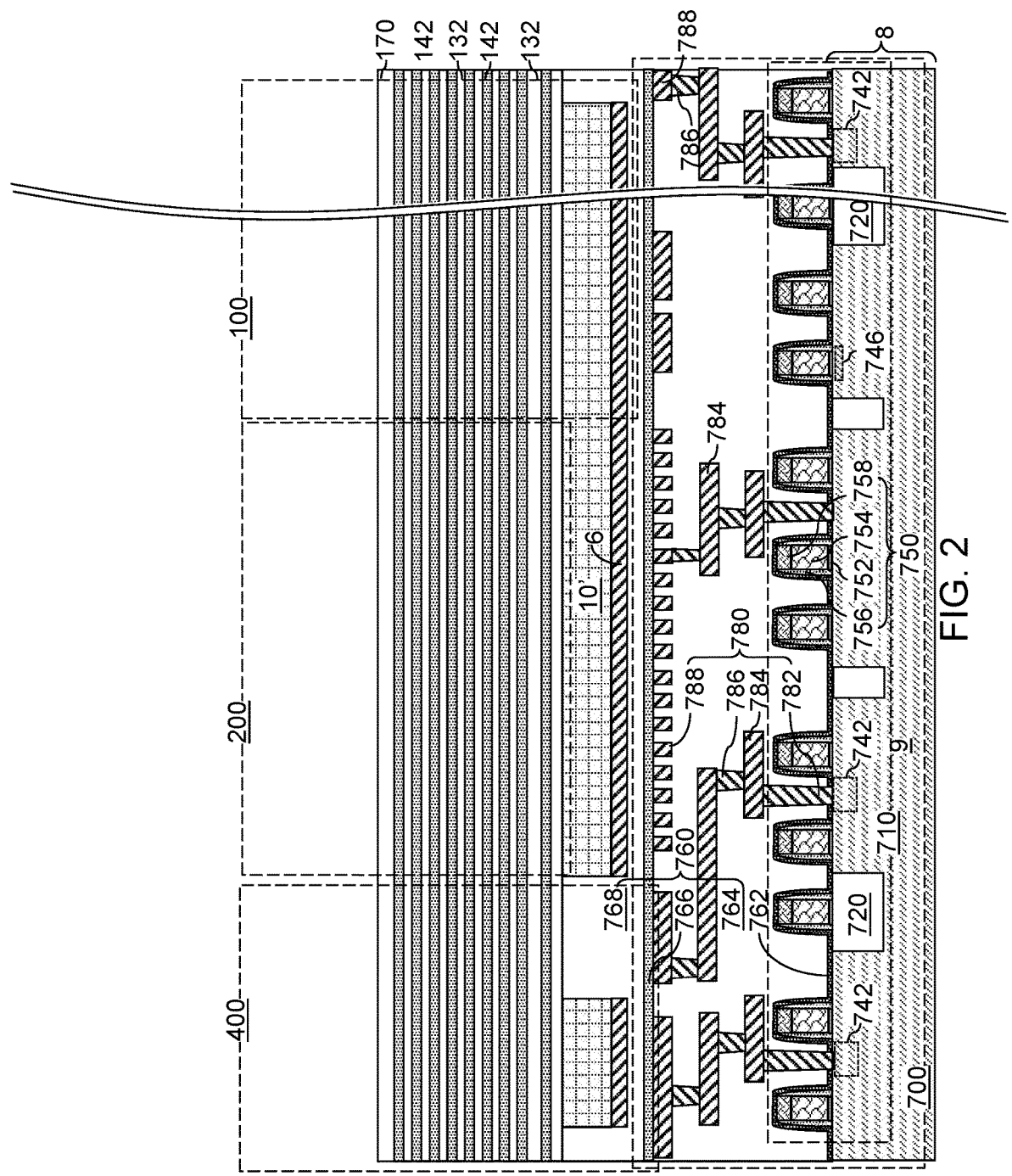

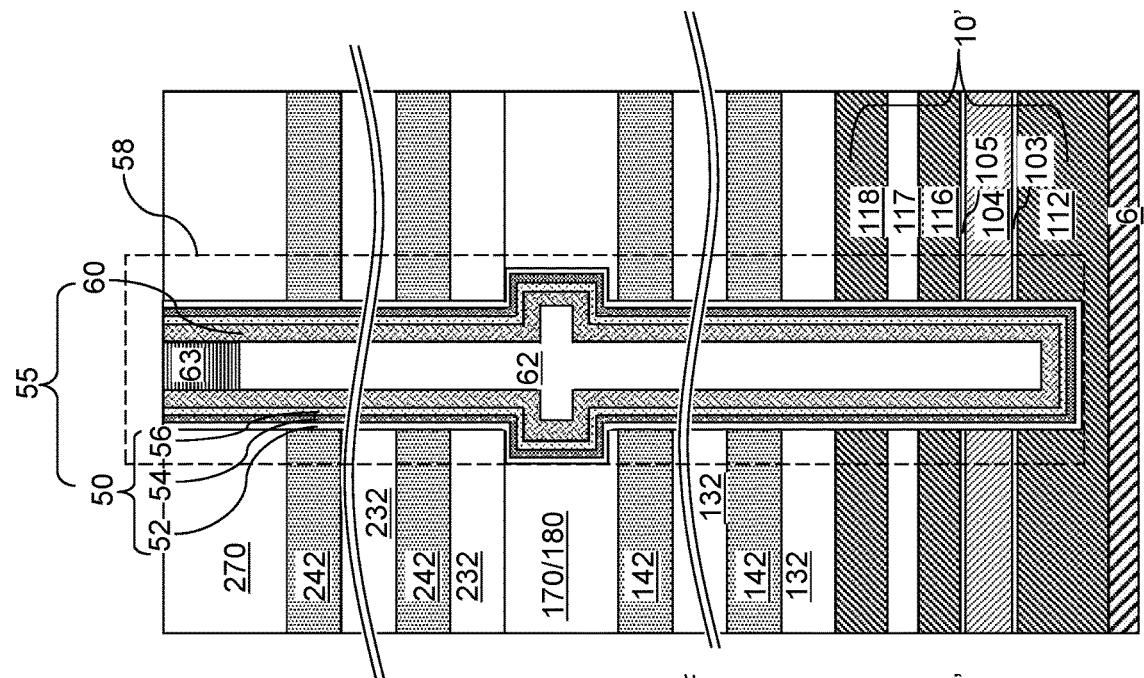
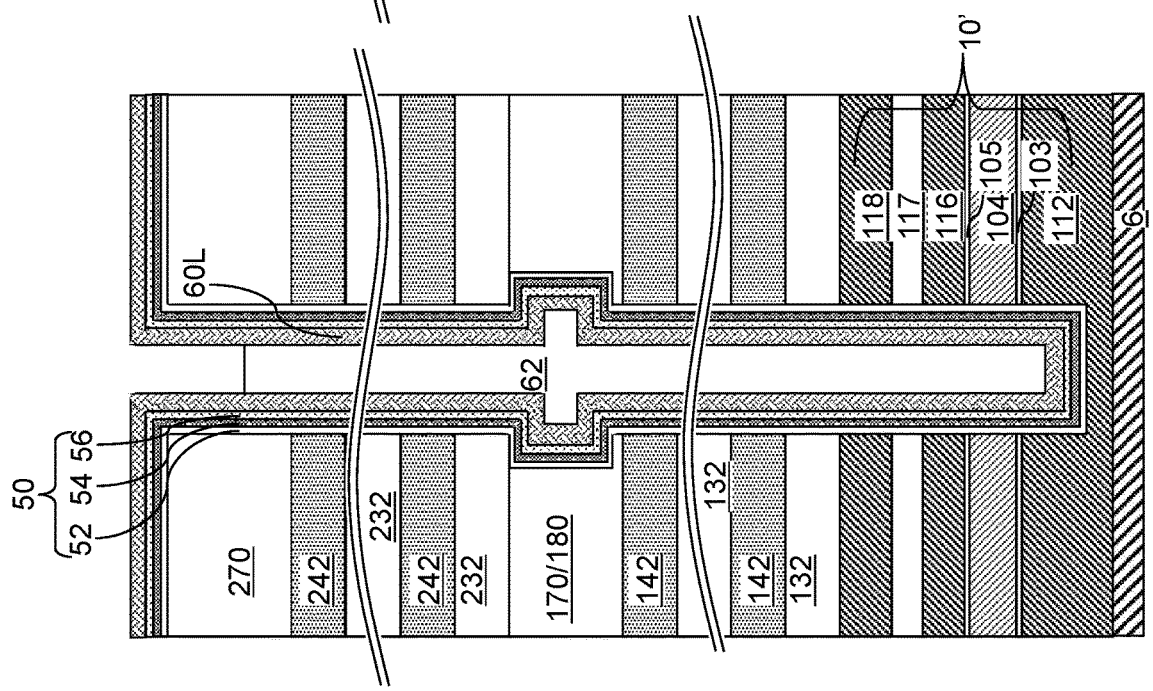
FIG. 9C
FIG. 9D

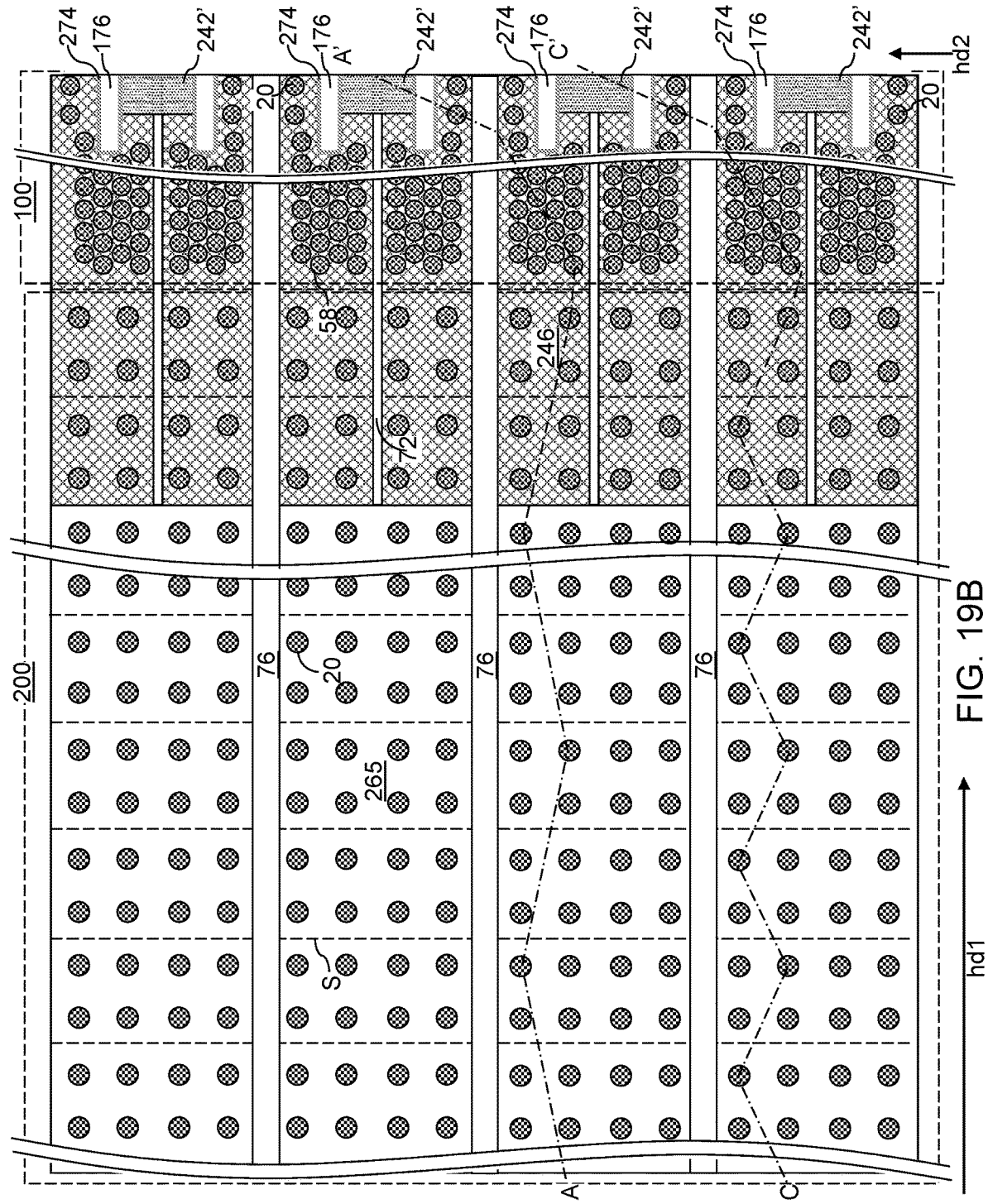

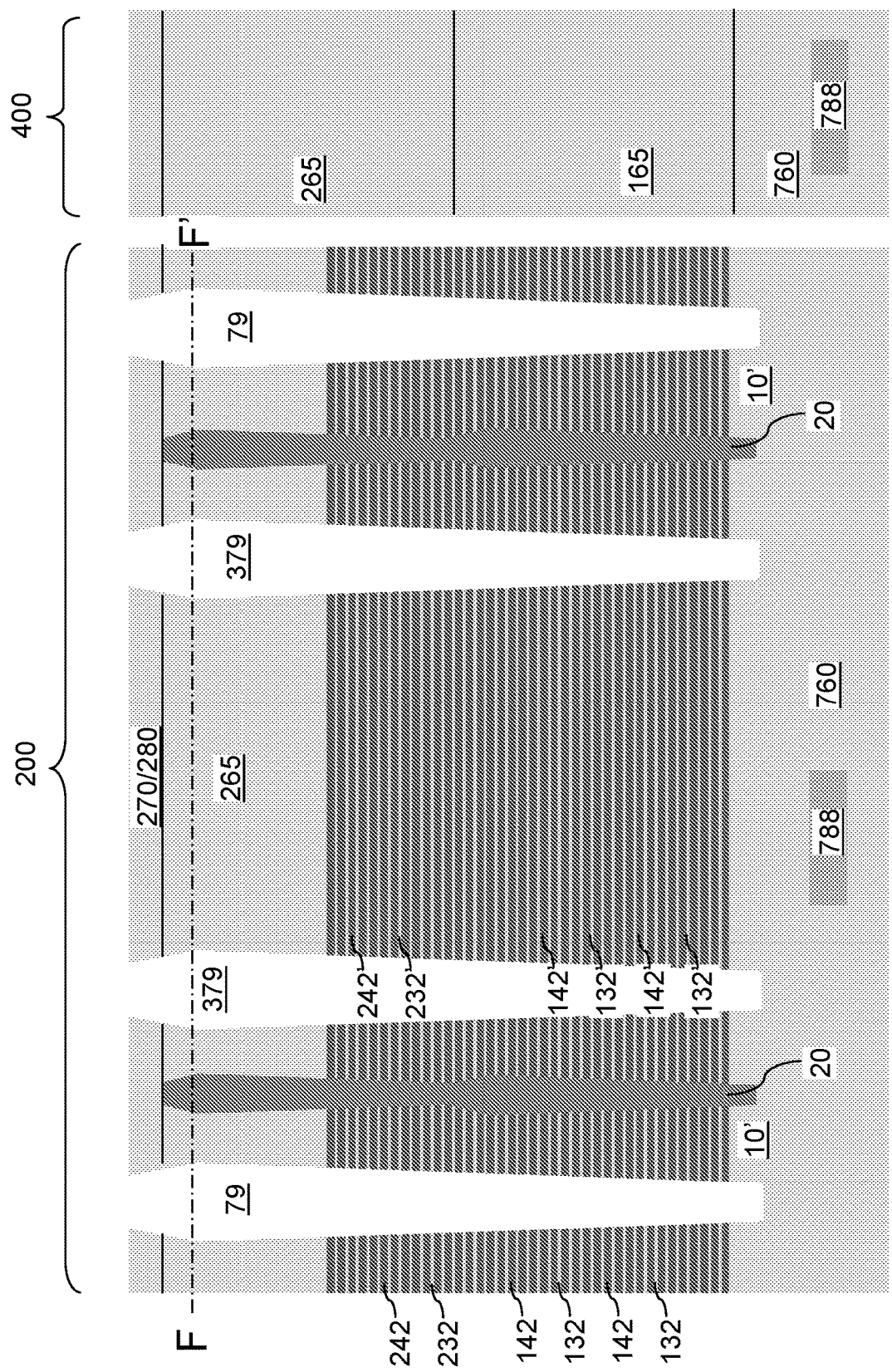

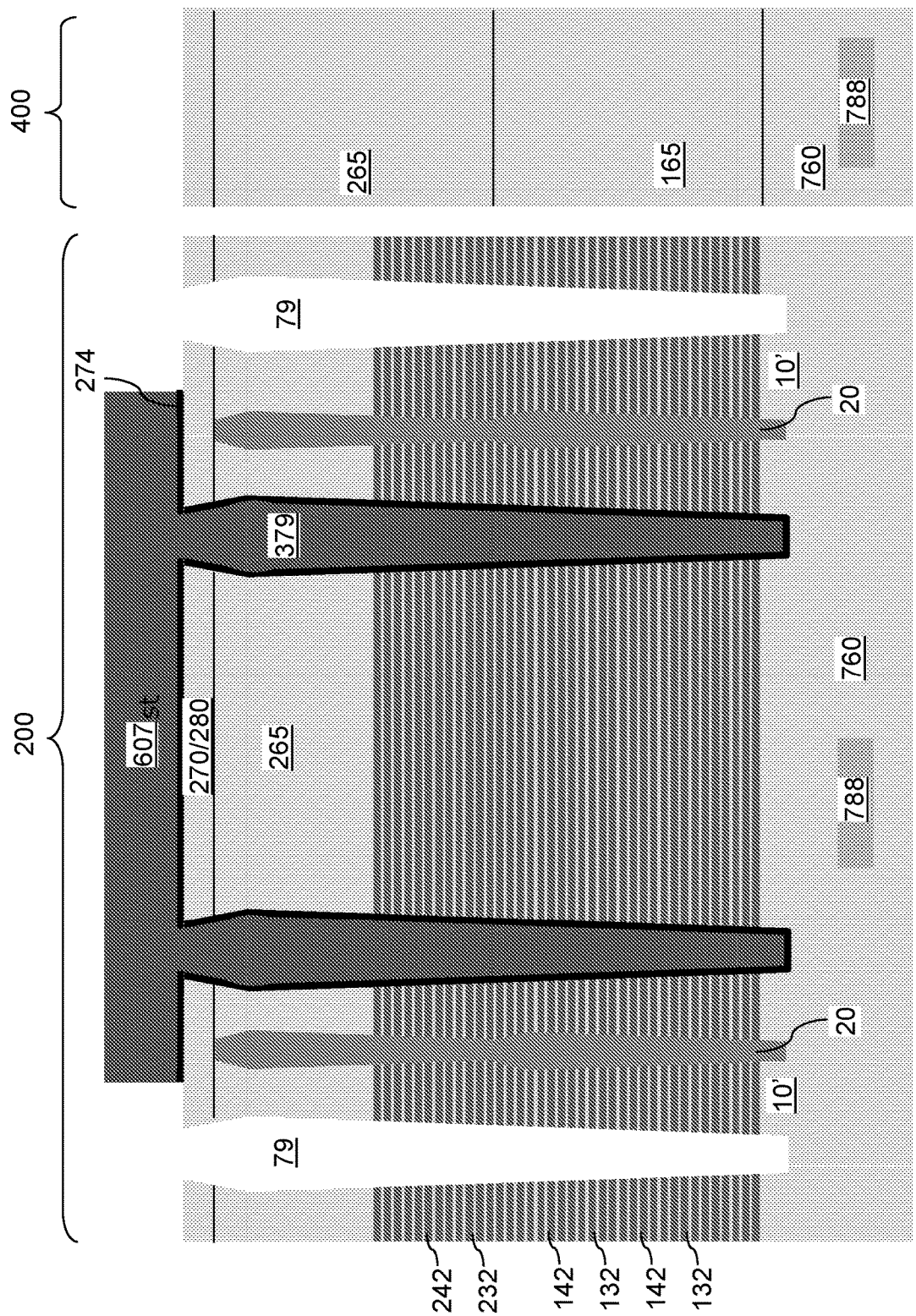

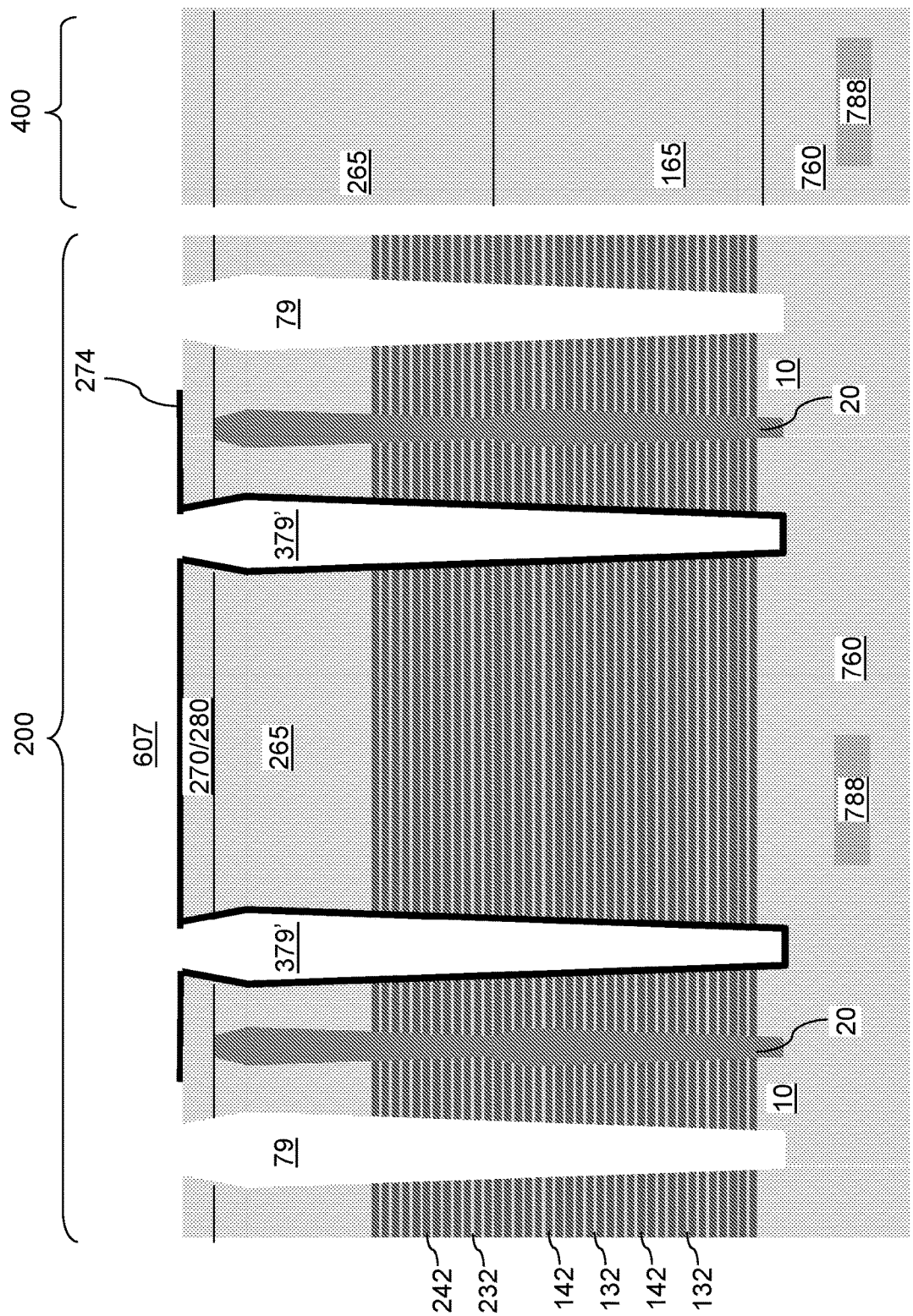

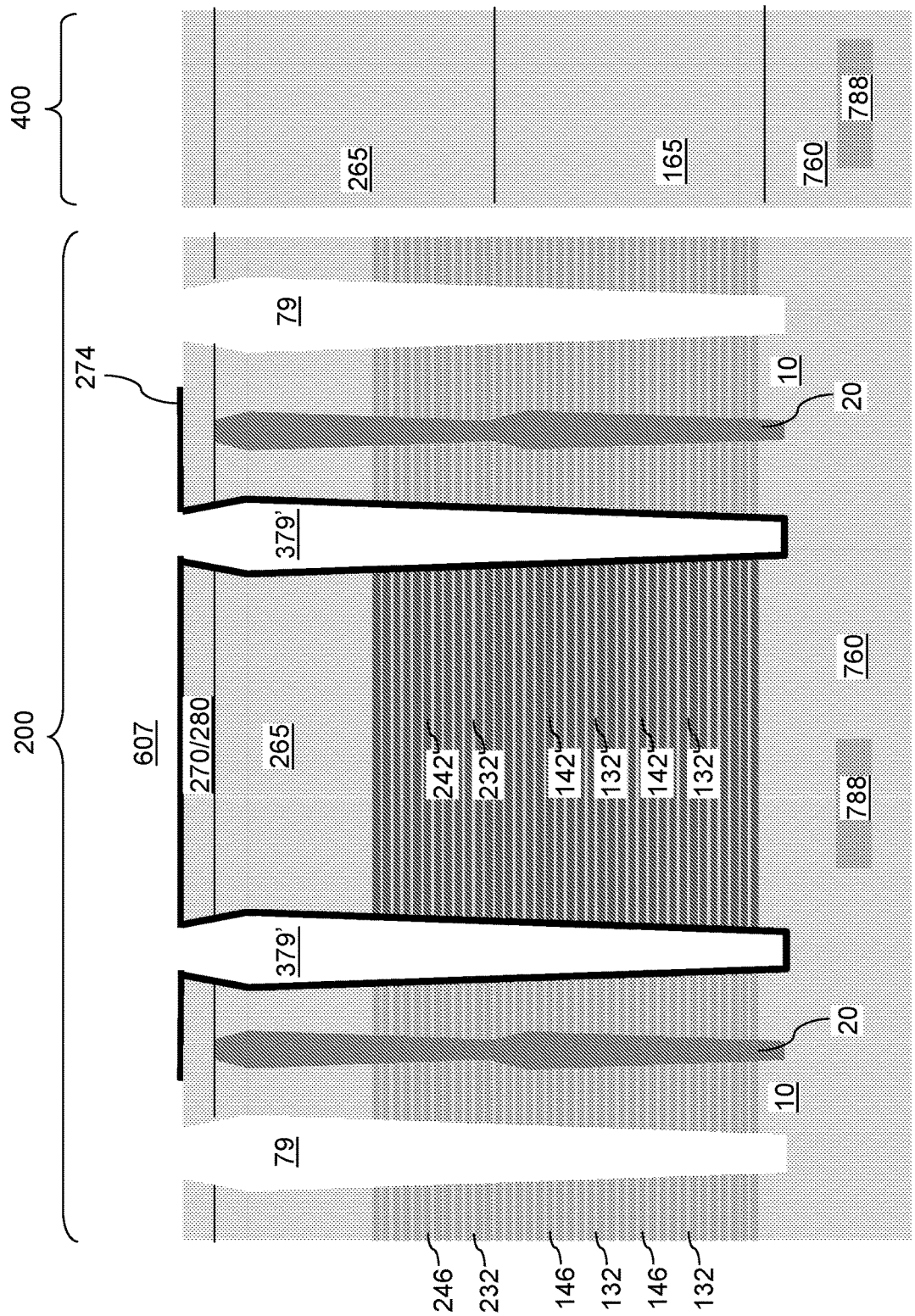

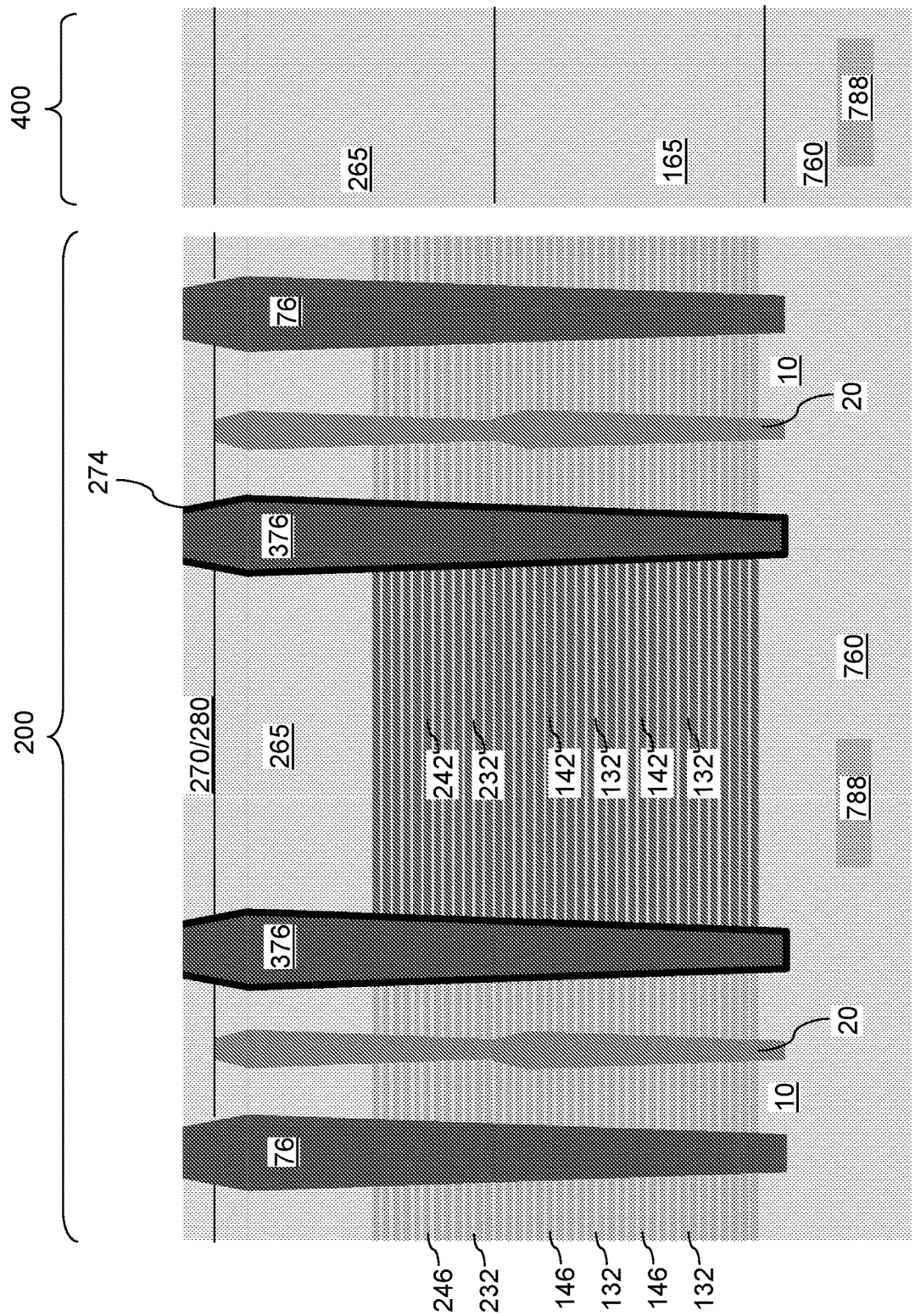

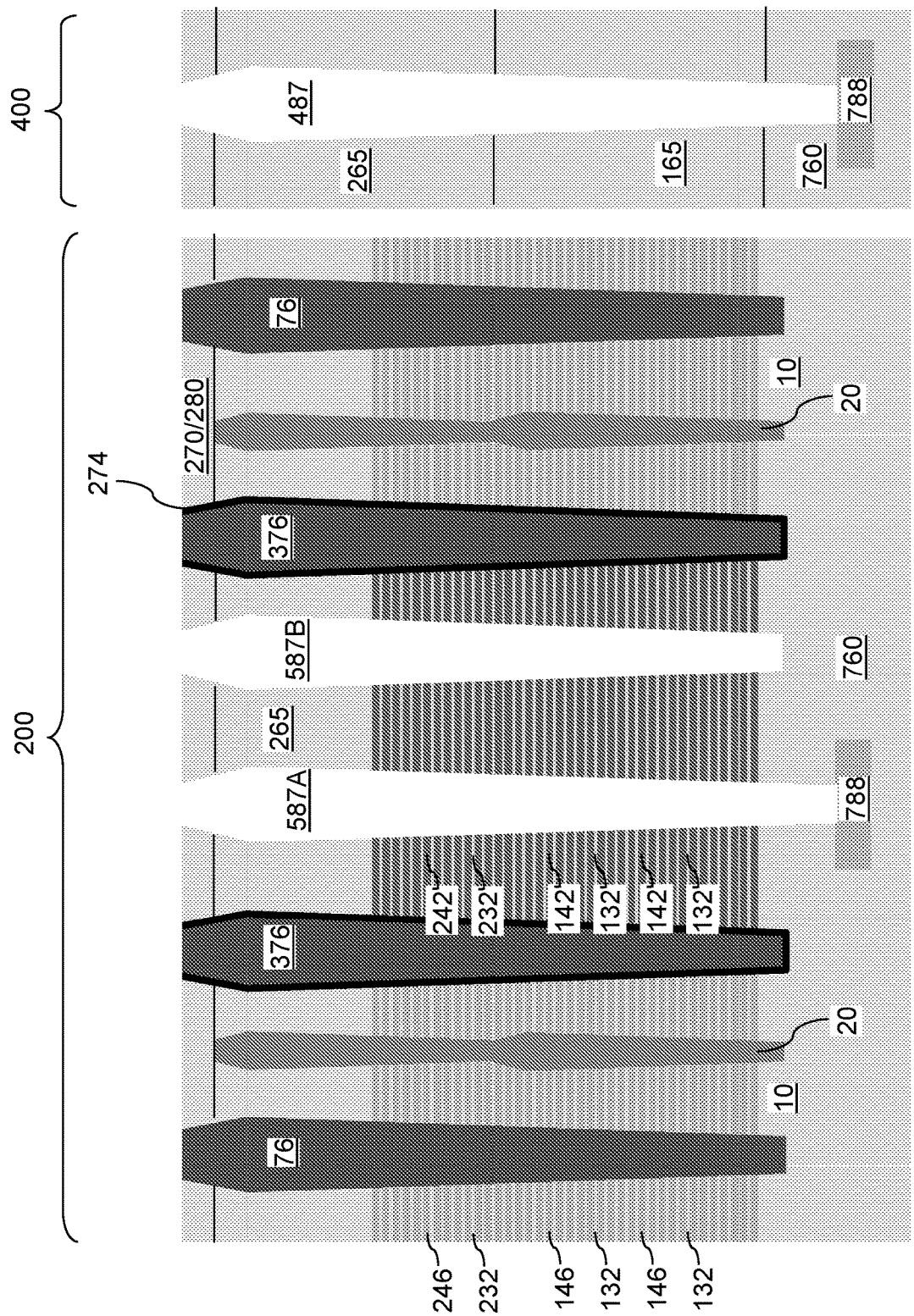

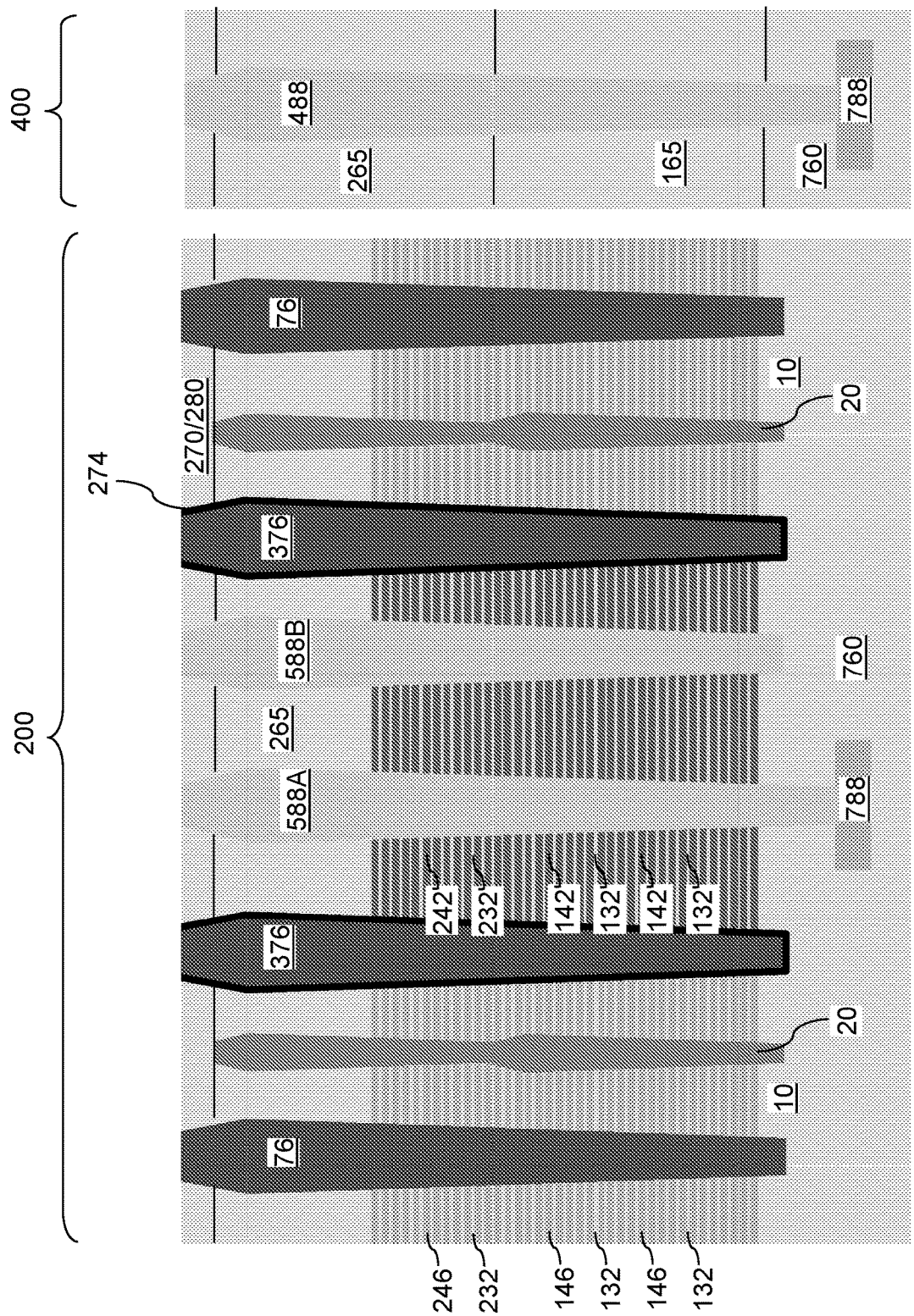

THREE-DIMENSIONAL MEMORY DEVICE CONTAINING THROUGH-ARRAY CONTACT VIA STRUCTURES BETWEEN DIELECTRIC BARRIER WALLS AND METHODS OF MAKING THE SAME

FIELD

The present disclosure relates generally to the field of semiconductor devices and specifically to a three-dimensional memory device containing through-array contact via structures between dielectric barrier walls and methods of making the same.

BACKGROUND

Recently, ultra-high-density storage devices using three-dimensional (3D) memory stack structures have been proposed. The memory stack structures overlie a substrate and extend through an alternating stack of insulating layers and electrically conductive layers. The memory stack structures include vertical stacks of memory elements provided at levels of the electrically conductive layers. Peripheral devices may be provided on the substrate underneath the alternating stack and the memory stack structures. A method is desired for providing interconnect via structures through the alternating stack without incurring high processing cost or long processing time.

SUMMARY

According to an embodiment of the present disclosure, a three-dimensional memory device is provided, which comprises: field effect transistors located over a semiconductor substrate; lower-level metal interconnect structures formed within lower-level dielectric material layers that overlie the field effect transistors; an alternating stack of insulating layers and composite layers located over the lower-level metal interconnect structures and between a pair of backside trenches that laterally extend along a first horizontal direction, wherein each of the composite layers comprises a respective electrically conductive layer and a respective dielectric spacer plate, and a vertically alternating sequence of the insulating plates and the dielectric spacer plates is provided within a region including the dielectric spacer plates; memory stack structures vertically extending through the alternating stack; a pair of dielectric wall structures vertically extending through each layer within the alternating stack and which do not contact other through another dielectric wall structure, wherein a vertically alternating sequence of the insulating plates and the dielectric spacer plates is located between the pair of dielectric wall structures; and at least one conductive via structure vertically extending through the vertically alternating sequence and contacting a top surface of a respective one of the lower-level metal interconnect structures.

According to another embodiment of the present disclosure, a method for forming a three-dimensional memory device is provided, which comprises: forming an alternating stack of insulating layers and sacrificial material layers over a semiconductor substrate, wherein the sacrificial material layers comprise a dielectric material; forming memory stack structures through the alternating stack; patterning the alternating stack by performing an anisotropic etch process using a patterned mask layer, wherein the alternating stack is divided into a plurality of alternating stacks of respective insulating layers and respective sacrificial material layers by backside trenches, and wherein a pair of unconnected barrier trenches is formed through each of the plurality of alternating stacks; forming backside recesses by isotropically etching portions of the sacrificial material layers of the plurality of alternating stacks selective to the insulating layers of the plurality of alternating stacks by introducing an isotropic etchant into the backside trenches while the barrier trenches are covered by a respective dielectric liner that blocks access of the isotropic etchant to adjacent portions of the sacrificial material layers, wherein remaining portions of the sacrificial material layers between each neighboring pair of barrier trenches constitute dielectric spacer plates, and a vertically alternating sequence of the insulating plates and the dielectric spacer plates is provided between the pair of barrier trenches; forming electrically conductive layers in the backside recesses; and forming at least one conductive via structure through the vertically alternating sequence.

According to yet another aspect of the present disclosure, a method for forming a three-dimensional memory device is provided, which comprises: forming an alternating stack of insulating layers and sacrificial material layers over a substrate, wherein the sacrificial material layers comprise a dielectric material; forming a dielectric material portion adjacent to the alternating stack and over the substrate; forming memory stack structures through the alternating stack; forming backside trenches and a moat trench through the alternating stack, wherein the moat trench has a continuous outer periphery and a continuous inner periphery, portions of the insulating layers surrounded by the moat trench constitute insulating plates, portions of the sacrificial material layers surrounded by the moat trench constitute dielectric spacer plates, and a vertically alternating sequence of the insulating plates and the dielectric spacer plates is provided surrounded by the moat trench; replacing portions of the sacrificial material layers outside the moat trench with electrically conductive layers without replacing the vertically alternating sequence of the insulating plates and the dielectric spacer plates; and simultaneously forming a first through-memory-level interconnection via structure extending through the vertically alternating sequence surrounded by the moat trench and a second through-memory-level interconnection via structure extending through the dielectric material portion.

BRIEF DESCRIPTION OF THE DRAWINGS

FIG. 1A is a vertical cross-sectional view of a first exemplary structure after formation of semiconductor devices, lower level dielectric layers, lower metal interconnect structures, and in-process source level material layers on a semiconductor substrate according to a first embodiment of the present disclosure.

FIG. 2 is a vertical cross-sectional view of the first exemplary structure after formation of a first-tier alternating stack of first insulating layers and first spacer material layers according to an embodiment of the present disclosure.

FIGS. 9A-9D illustrate sequential vertical cross-sectional views of a memory opening during formation of a memory opening fill structure according to an embodiment of the present disclosure.

FIG. 19B is a horizontal cross-sectional of the first exemplary structure along the horizontal plane B-B' of FIG. 19A. The hinged vertical plane A-A' corresponds to the plane of the vertical cross-sectional view of FIG. 19A.

FIG. 23B is a vertical cross-sectional view of a staircase region of a second configuration of the second exemplary structure after formation of backside trenches and moat trenches according to an embodiment of the present disclosure.

FIG. 23C is a vertical cross-sectional view of a peripheral region of the second exemplary structure of FIG. 23A and/or FIG. 23B.

FIG. 26B is a vertical cross-sectional view of the second configuration of the second exemplary structure after removal of unmasked portions of the dielectric liner according to an embodiment of the present disclosure.

FIG. 26C is a vertical cross-sectional view of the second exemplary structure in the peripheral region at the processing steps of FIGS. 26A and 26B.

FIG. 27B is a vertical cross-sectional view of the second configuration of the second exemplary structure after formation of source-level material layers and removal of the patterned photoresist layer according to an embodiment of the present disclosure.

FIG. 27C is a vertical cross-sectional view of the second exemplary structure in the peripheral region at the processing steps of FIGS. 27A and 27B.

FIG. 29B is a vertical cross-sectional view of the second configuration of the second exemplary structure after formation of electrically conductive layers according to an embodiment of the present disclosure.

FIG. 29C is a vertical cross-sectional view of the second exemplary structure in the peripheral region at the processing steps of FIGS. 29A and 29B.

FIG. 30B is a vertical cross-sectional view of the second configuration of the second exemplary structure after formation of dielectric backside trench fill structures and dielectric fill material portions according to an embodiment of the present disclosure.

FIG. 30C is a vertical cross-sectional view of the second exemplary structure in the peripheral region at the processing steps of FIGS. 30A and 30B.

FIG. 31B is a vertical cross-sectional view of the second configuration of the second exemplary structure after formation of device-region interconnection via cavities and source contact via cavities according to an embodiment of the present disclosure.

FIG. 31C is a vertical cross-sectional view of the second exemplary structure in the peripheral region after formation of peripheral-region interconnection via cavities, which is performed concurrently with formation of the device-region interconnection via cavities and the source contact via cavities at the processing steps of FIGS. 31A and 31B.

FIG. 32B is a vertical cross-sectional view of the second configuration of the second exemplary structure after formation of after formation of through-memory-level interconnection via structures according to an embodiment of the present disclosure.

FIG. 32C is a vertical cross-sectional view of the second exemplary structure in the peripheral region at the processing steps of FIGS. 32A and 32B.

DETAILED DESCRIPTION

Figure 1B:
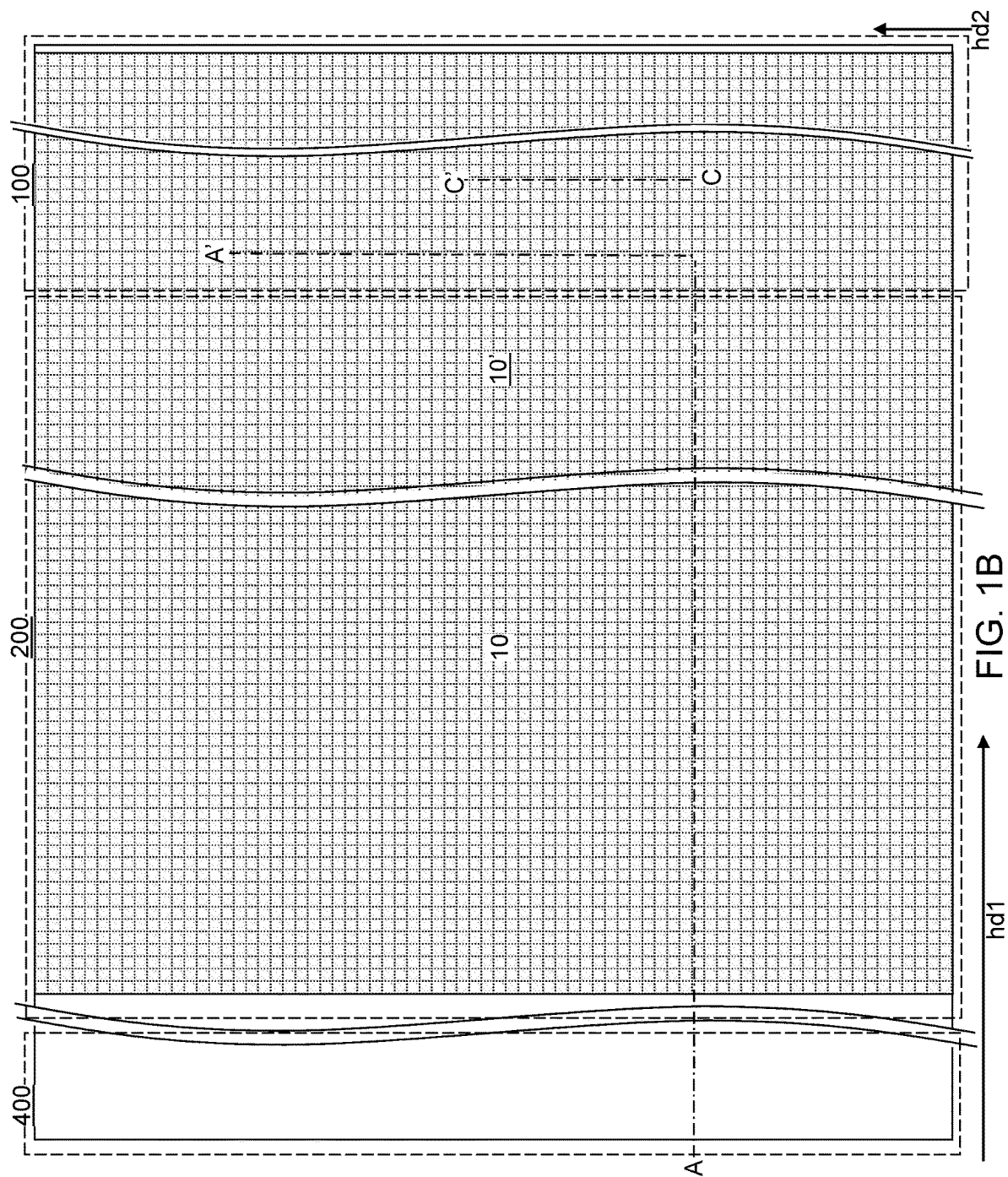
FIG. 1B is a top-down view of the first exemplary structure of FIG. 1A. The hinged vertical plane A-A' is the plane of the vertical cross-sectional view of FIG. 1A.

The embodiments of the present disclosure provide a three-dimensional memory device using liner-less through-array contact via structures and methods of making the same, the various embodiments of which are described herein in detail. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1C:
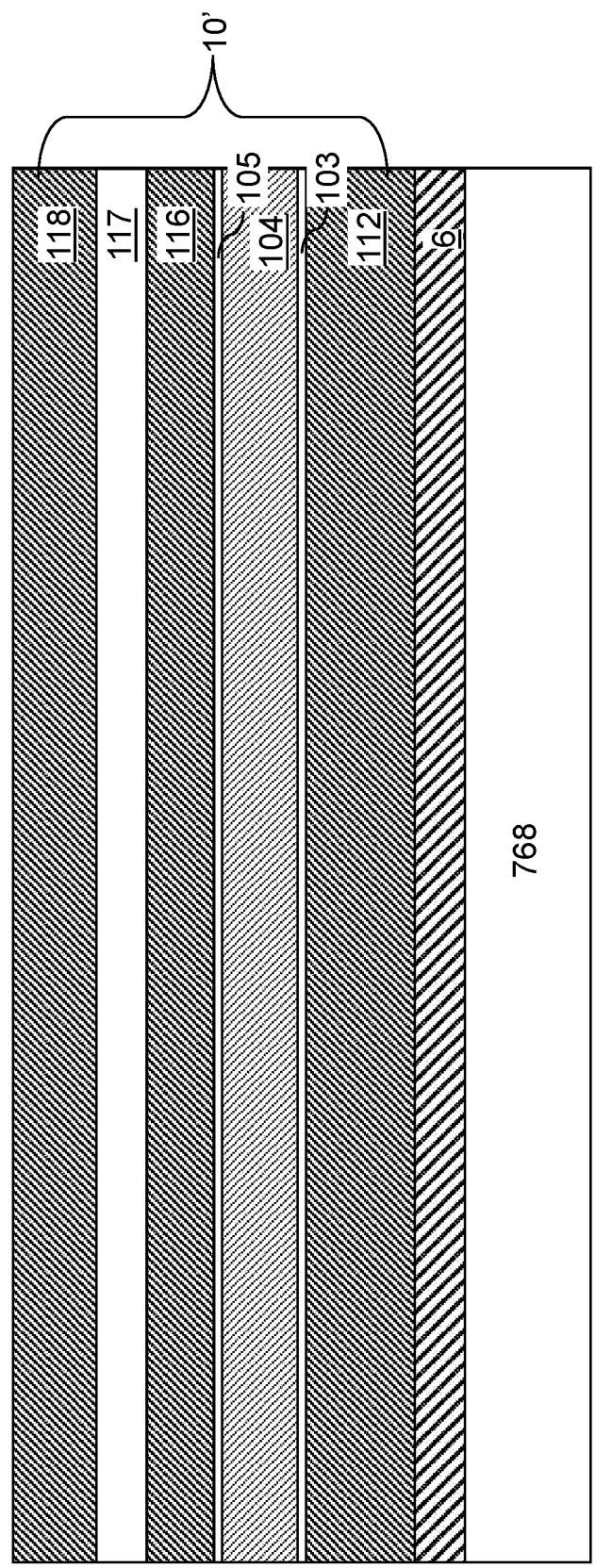
FIG. 1C is a magnified view of the in-process source level material layers along the vertical plane C-C' of FIG. 1B.

Referring to FIGS. 1A-1C, a first exemplary structure according to a first embodiment of the present disclosure is illustrated. FIG. 1C is a magnified view of an in-process source-level material layers 10' illustrated in FIGS. 1A and 1B. The first exemplary structure includes a semiconductor substrate 8 and semiconductor devices 710 formed thereupon. The semiconductor substrate 8 may include a substrate semiconductor layer 9 at least at an upper portion thereof. Shallow trench isolation structures 720 may be formed in an upper portion of the substrate semiconductor layer 9 to provide electrical isolation between the semiconductor devices 710. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers may be formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768. The dielectric layer stack including the lower-level dielectric material layers 760 may function as a matrix for lower-level metal interconnect structures 780 that provide electrical wiring to and from the various nodes of the semiconductor devices and landing pads for through-memory-level interconnection via structures to be subsequently formed. The lower-level metal interconnect structures 780 may be formed within the dielectric layer stack of the lower-level dielectric material layers 760 and overlies the field effect transistors. The lower-level metal interconnect structures 780 may comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level interconnection via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 10' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 10' may include, from bottom to top, a lower source-level material layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level material layer 112 and the upper source-level semiconductor layer 116 may include a doped semiconductor material such as doped polysilicon or doped amorphous silicon. The conductivity type of the lower source-level material layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level material layer 112 and the upper source-level semiconductor layer 116 have a doping of a second conductivity type that is the opposite of the first conductivity type. The thickness of each of the lower source-level material layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the semiconductor substrate 8.

The optional conductive plate layer 6 and the in-process source-level material layers 10' may be patterned to provide openings in areas in which through-memory-level interconnection via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed.

The optional conductive plate layer 6 and the in-process source-level material layers 10' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 10' may be formed within the area of a memory array region 100, in which a three-dimensional memory array including memory stack structures is to be subsequently formed. A peripheral device region 400 that may be subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 may be formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and may be located at the level of the lower-level dielectric material layers 760. Through-memory-level interconnection via structures may be subsequently formed directly on the lower-level metal interconnect structures 780 to provide electrical connection to memory devices that are also to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level interconnection via structures to be subsequently formed.

Referring to FIG. 2, an alternating stack of first material layers and second material layers may be formed. Each first material layer may include a first material, and each second material layer may include a second material that is different from the first material. In embodiments where at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
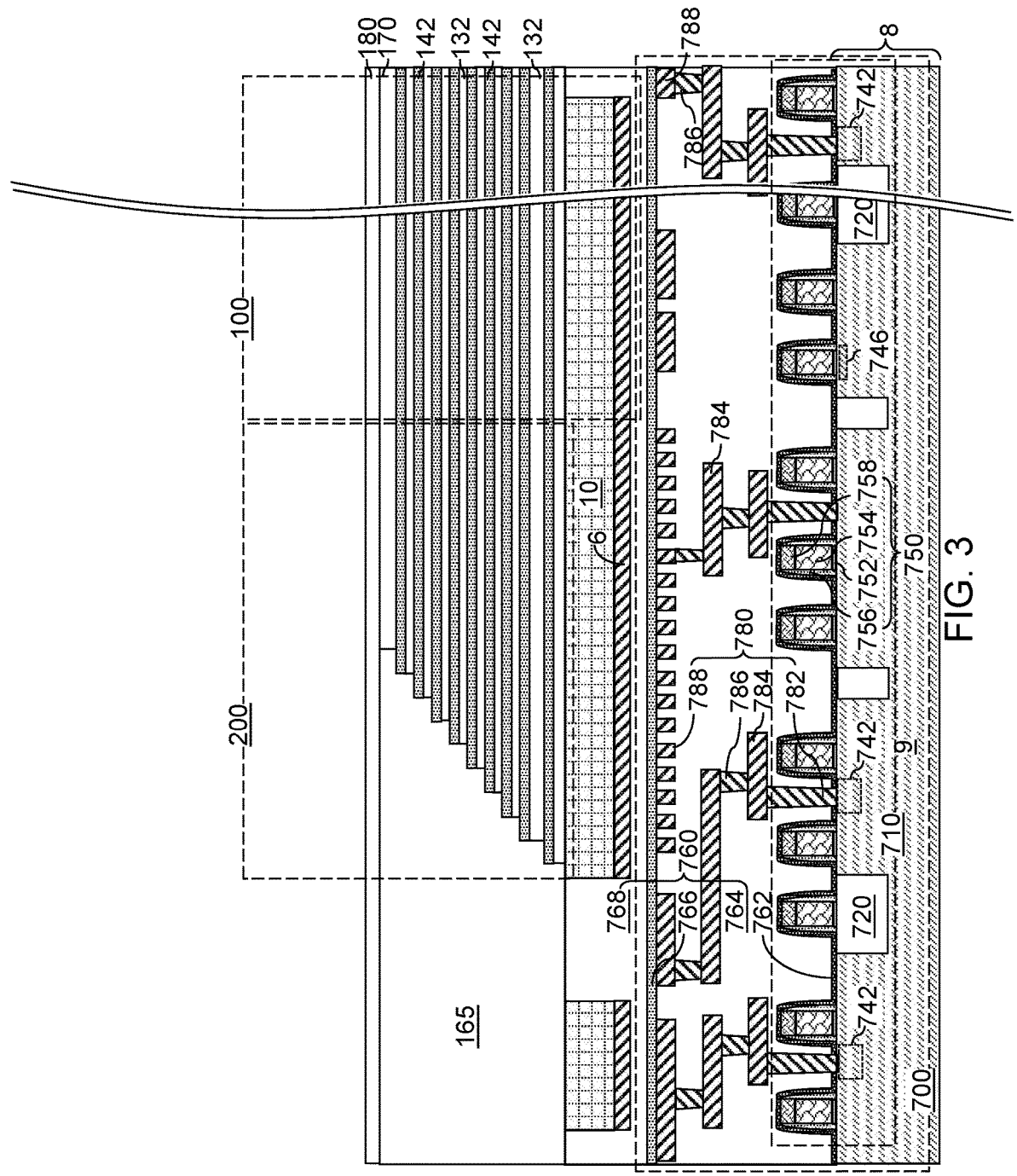
FIG. 3 is a vertical cross-sectional view of the first exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
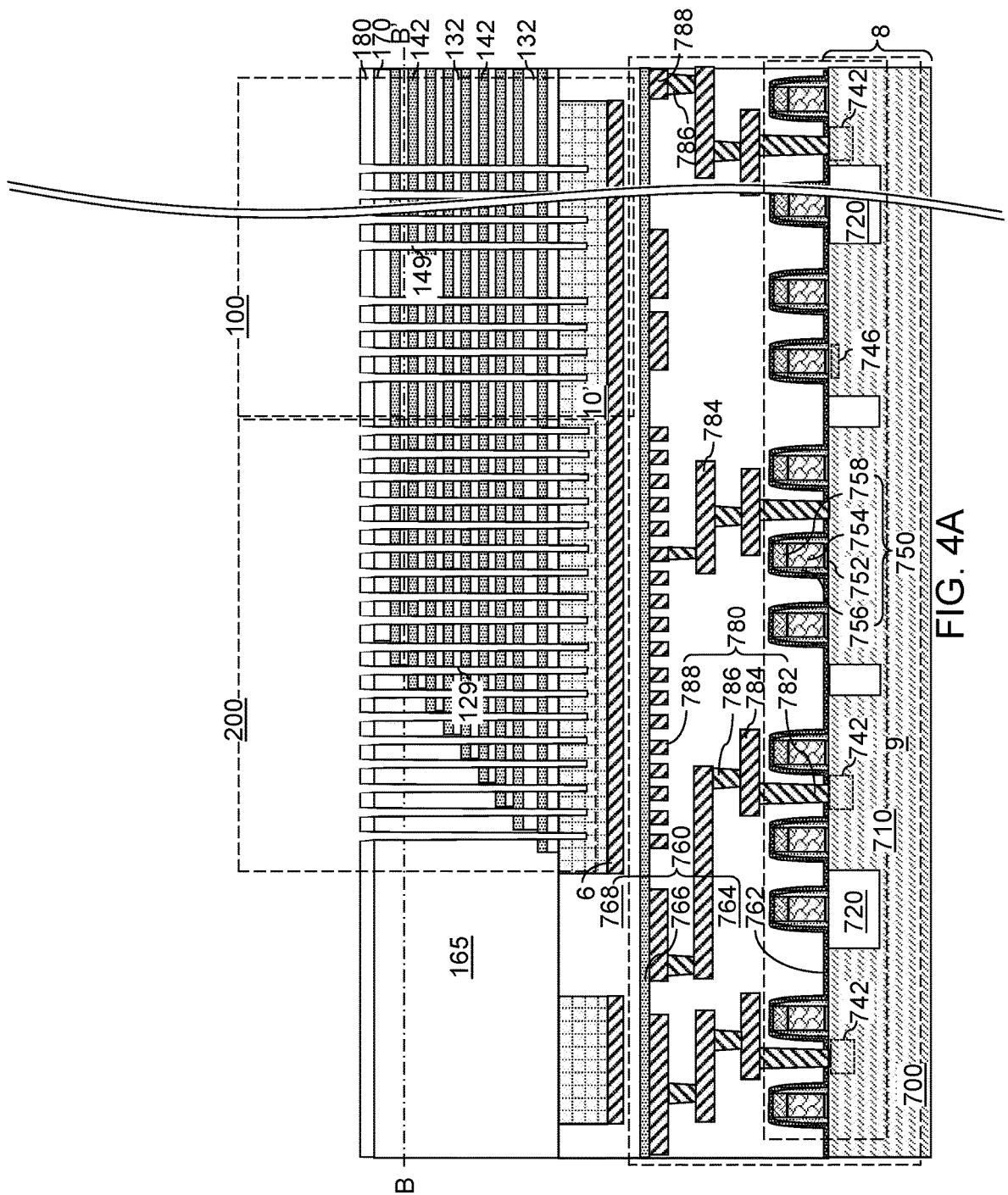
FIG. 4A is a vertical cross-sectional view of the first exemplary structure after formation of first-tier memory openings and first-tier support openings according to an embodiment of the present disclosure.
Figure 4B:
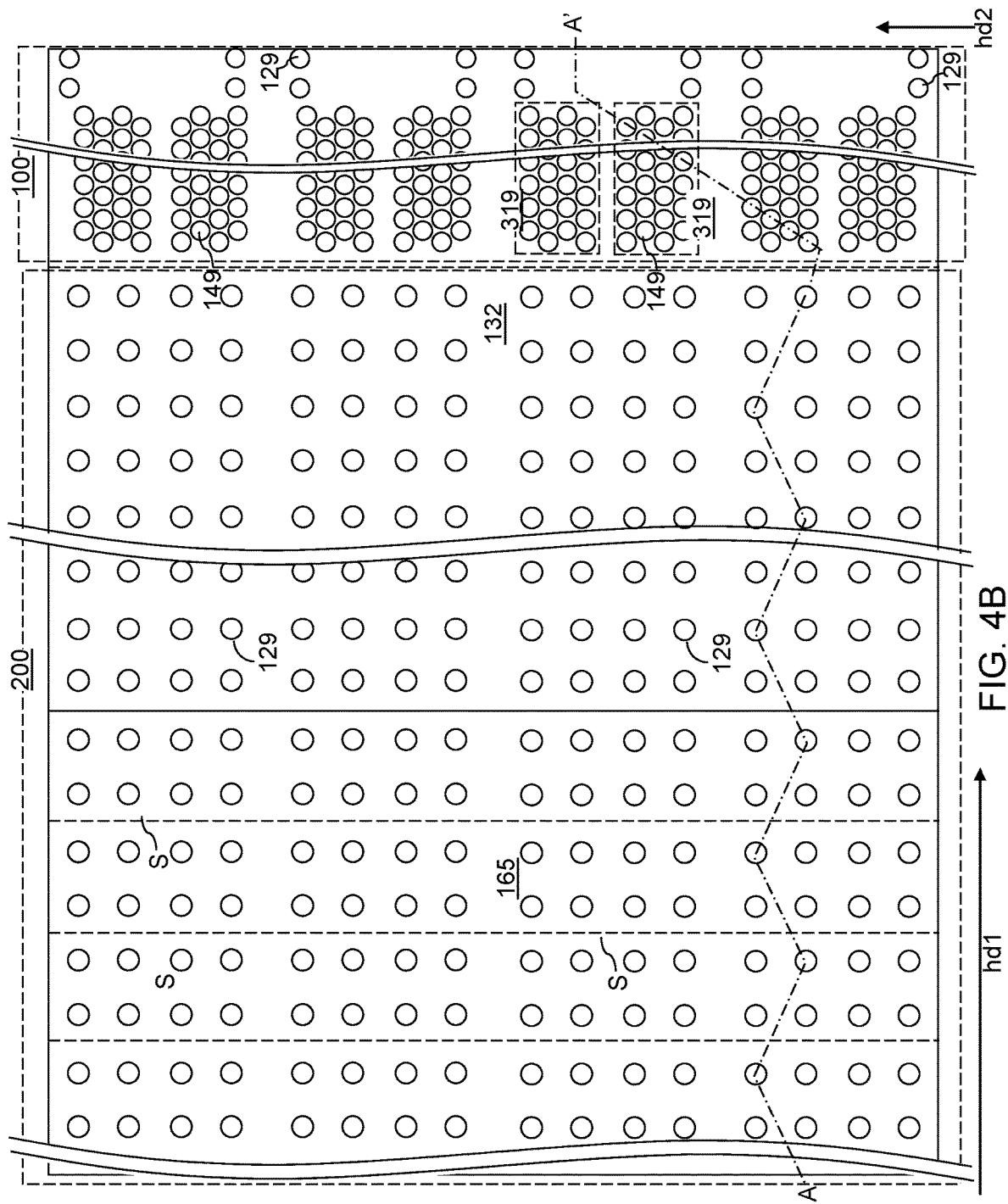
FIG. 4B is a horizontal cross-sectional view of the first exemplary structure of FIG. 4A. The hinged vertical plane A-A' corresponds to the plane of the vertical cross-sectional view of FIG. 4A.
Figure 4C:
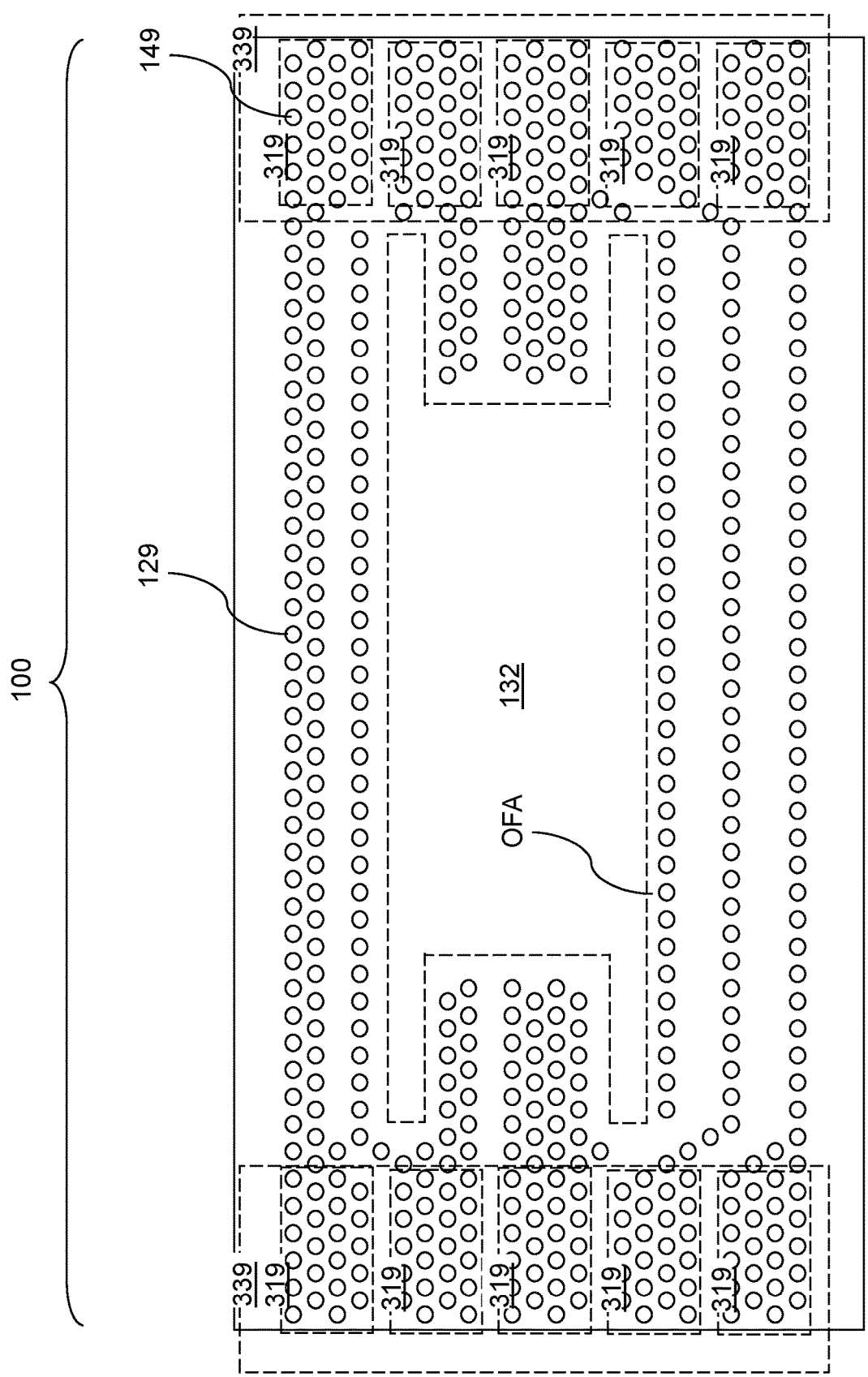
FIG. 4C is a horizontal cross-sectional view of an alternative configuration of the first exemplary structure along a horizontal plane that corresponds to the horizontal plane B-B' of FIG. 4A.

Referring to FIGS. 4A-4C, various first-tier openings (149, 129) may be formed through the inter-tier dielectric layer 180 and the first-tier structure (132, 142, 170, 165) and into the in-process source-level material layers 10'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 10' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first-tier alternating stack (132, 142) are illustrated as dotted lines in FIG. 4B.

The first-tier memory openings 149 may be openings that are formed in the memory array region 100 through each layer within the first-tier alternating stack (132, 142) and are subsequently used to form memory stack structures therein. The first-tier memory openings 149 may be formed in clusters 319 of first-tier memory openings 149 that are laterally spaced apart along the second horizontal direction hd2. Each cluster 319 of first-tier memory openings 149 may be formed as a two-dimensional array of first-tier memory openings 149.

A subset of the first-tier support openings 129 may be formed in sections of the memory array region 100 that are not filled with the first-tier memory openings 149. The sections of the memory array region 100 that are not filled with the first-tier memory openings 149 may be distributed over multiple areas within the memory array region 100. The first-tier support openings 129 may include a first subset of first-tier support openings 129 that are formed in the staircase region 200, and a second subset of first-tier support openings 129 that are formed between clusters of first-tier memory openings 149 which are laterally spaced apart along the first horizontal direction hd1 in the memory array region 100. A first subset of the first-tier support openings 129 that is formed through the first retro-stepped dielectric material portion 165 may be formed through a respective horizontal surface of the first stepped surfaces. Further, each of the first subset of the first-tier support openings 129 may be formed directly above (i.e., above, and with an areal overlap with) a respective one of the lower-level metal interconnect structure 780.

The second subset of the first-tier support openings 129 may be formed between a respective pair of clusters 319 of first-tier memory openings 149 that are laterally spaced apart along the first horizontal direction hd1. In one embodiment, some of the first-tier support openings 129 within the second subset of the first-tier support openings 129 may be arranged in rows that extend along the first direction hd1. Additional first-tier support openings may be provided outside the rows of the first-tier support openings 129. Generally, a unit pattern UP of a combination of first-tier memory openings 149 and first-tier support openings 129 may be repeated along the second horizontal direction hd2. Each unit pattern UP includes a plurality of clusters 419 of first-tier memory openings 149 that are laterally spaced apart along the second horizontal direction hd2 and/or laterally spaced apart along the first horizontal direction hd1.

Discrete areas free of first-tier memory openings 149 and first-tier support openings 129 may be provided in the memory array region 100. First-tier support openings 129 between two groups 339 of clusters 319 of first-tier support openings 129 may be arranged such that an opening-free area (OFA) that is free of first-tier memory openings 149 and free of first-tier support openings 129 may be provided within each unit pattern (UP). In one embodiment, the OFA includes a pair of rectangular areas that laterally extend along the first horizontal direction hd1 and a connecting rectangular area that connects the pair of rectangular areas and has a lesser lateral extent along the first horizontal direction hd1 than the pair of rectangular areas.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 10'. For example, the terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 10'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
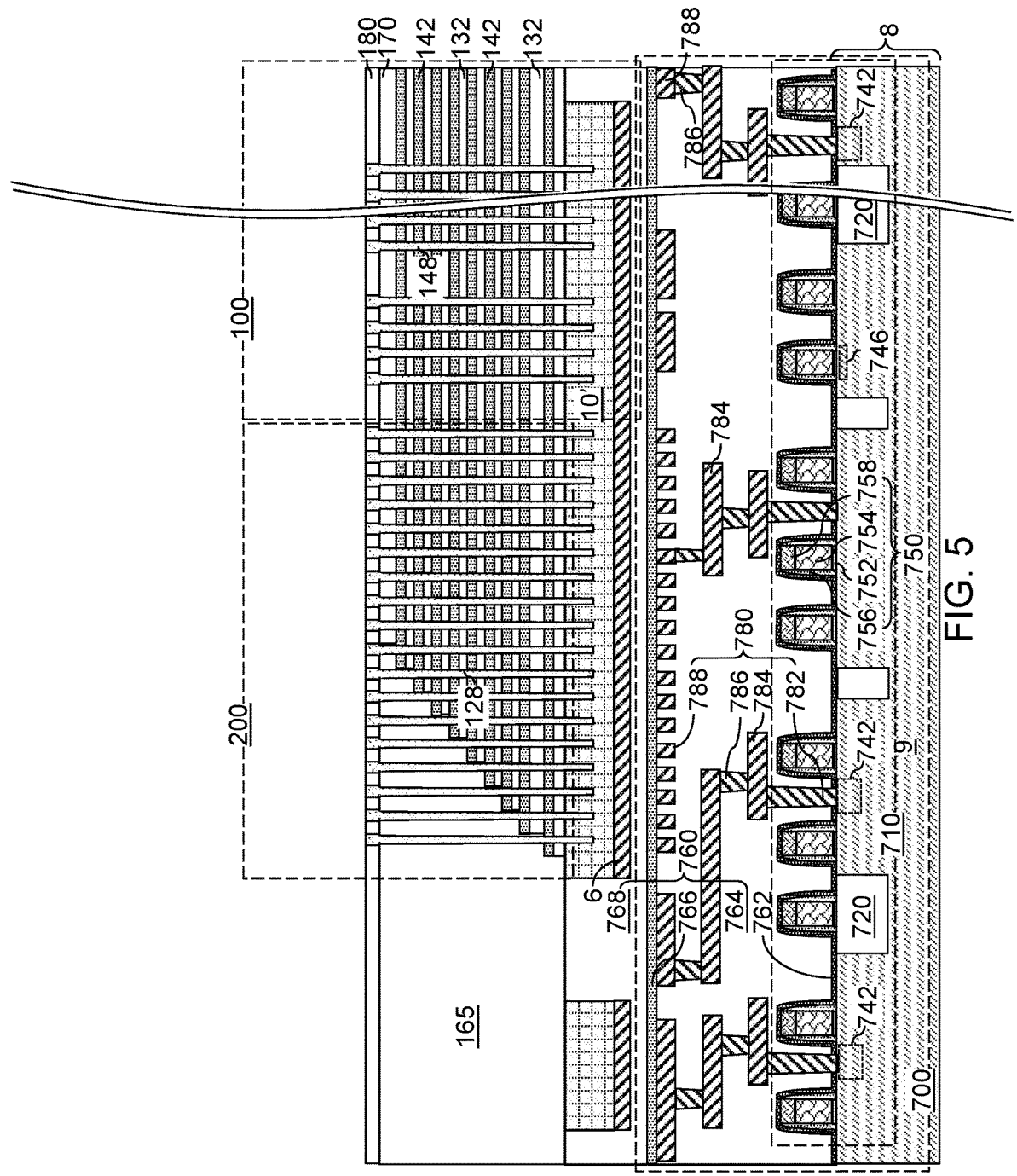
FIG. 5 is a vertical cross-sectional view of the first exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material may be deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6A:
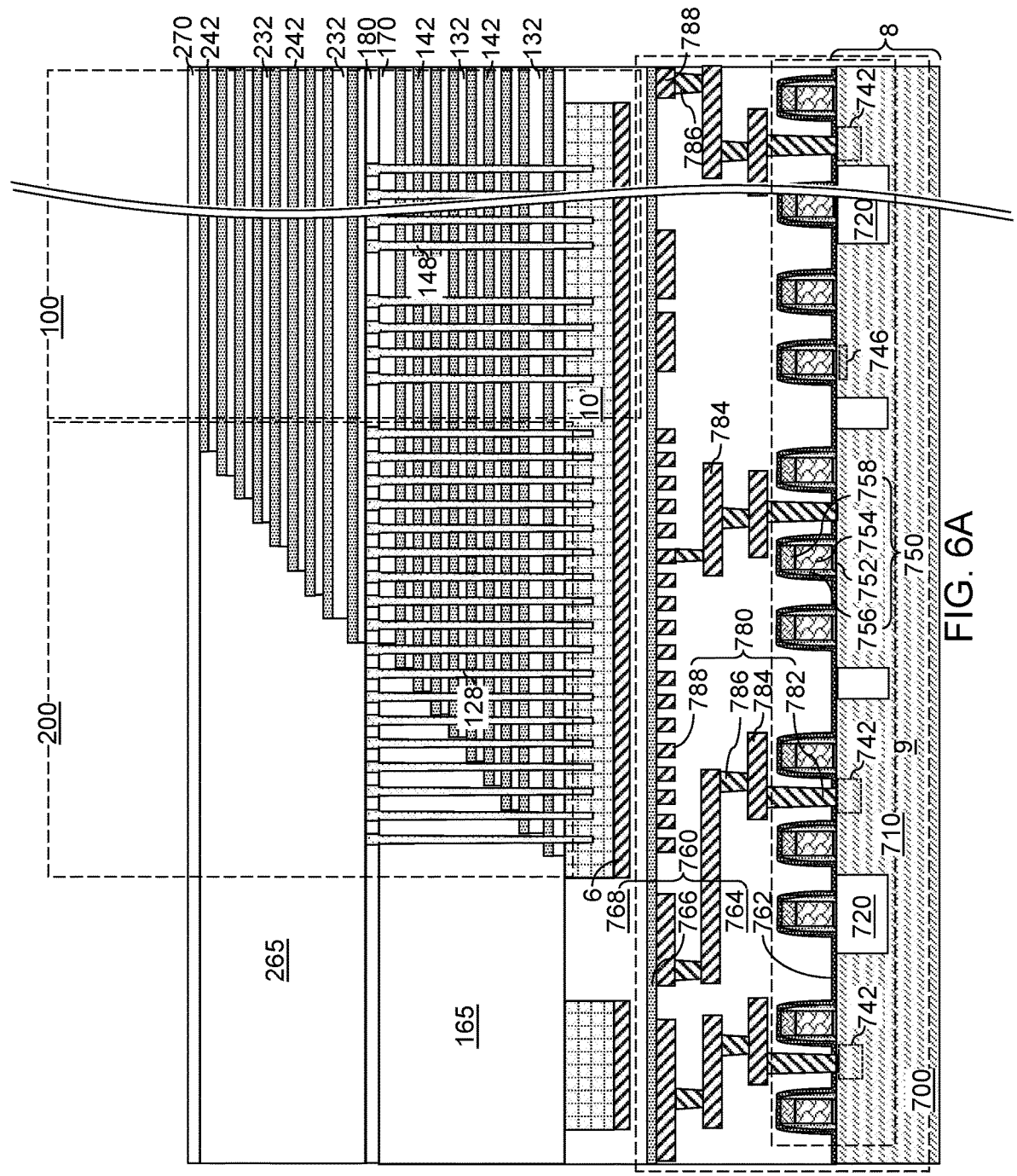
FIG. 6A is a vertical cross-sectional view of the first exemplary structure after formation of a second-tier alternating stack of second insulating layers and second spacer material layers, second stepped surfaces, and a second retro-stepped dielectric material portion according to an embodiment of the present disclosure.
Figure 6B:
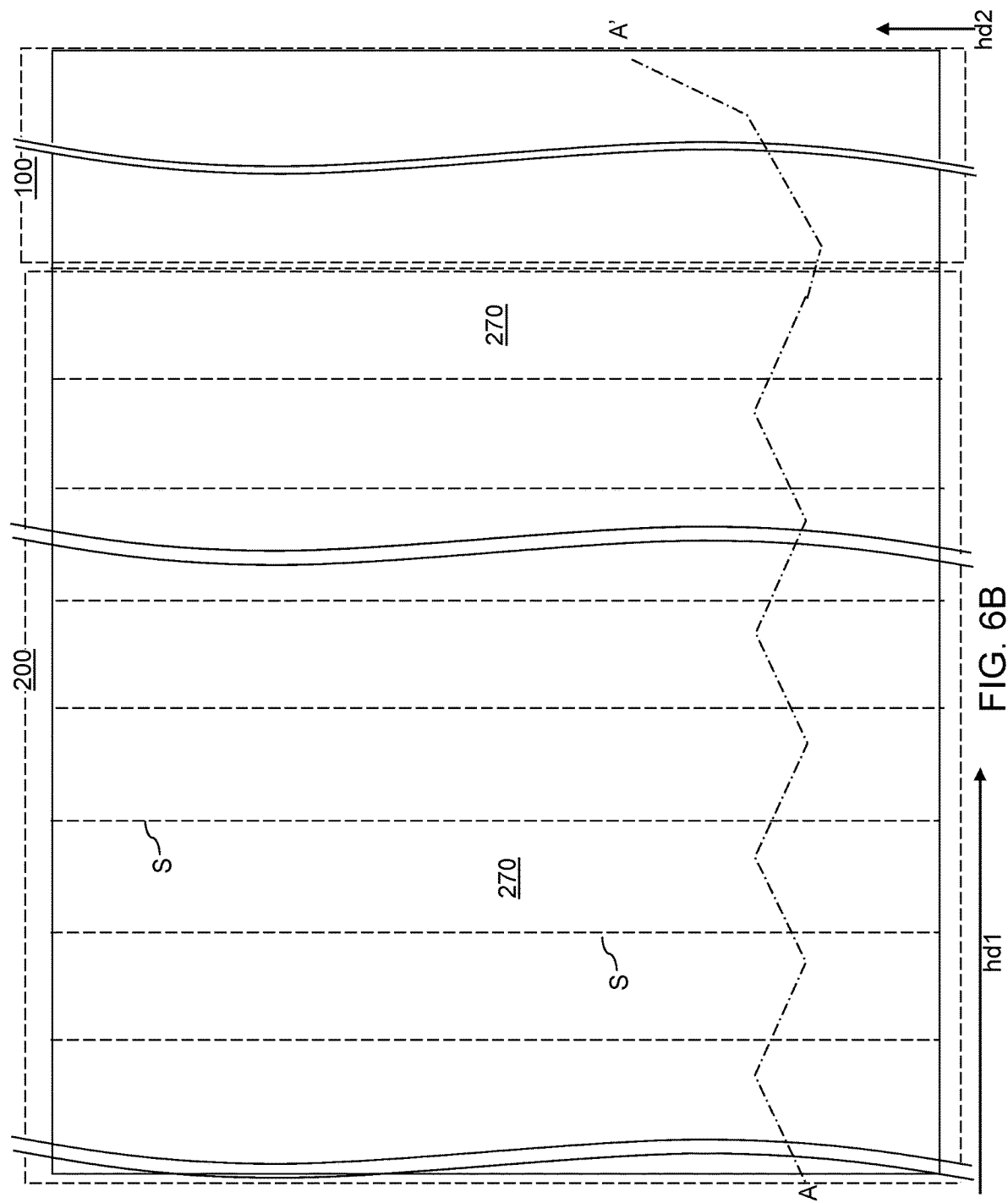
FIG. 6B is a top-down view of the first exemplary structure of FIG. 6A. The hinged vertical plane A-A' corresponds to the plane of the vertical cross-sectional view of FIG. 6A.

Referring to FIGS. 6A and 6B, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 10', and at least one retro-stepped dielectric material portion (165, 265) may be formed over the staircase regions on the at least one alternating stack (132, 142, 232, 242).

Figure 7A:
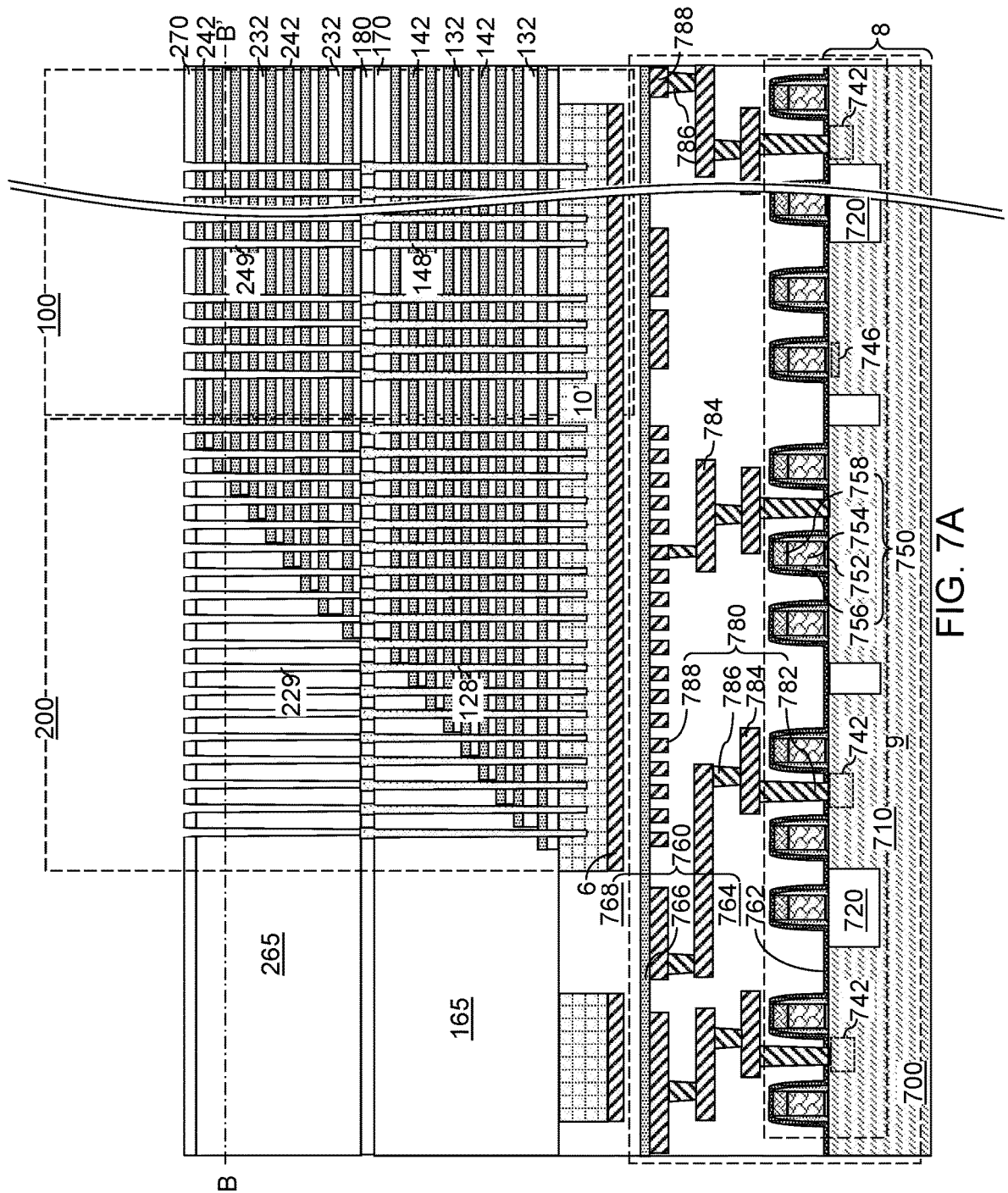
FIG. 7A is a vertical cross-sectional view of the first exemplary structure after formation of second-tier memory openings and second-tier support openings according to an embodiment of the present disclosure.
Figure 7B:
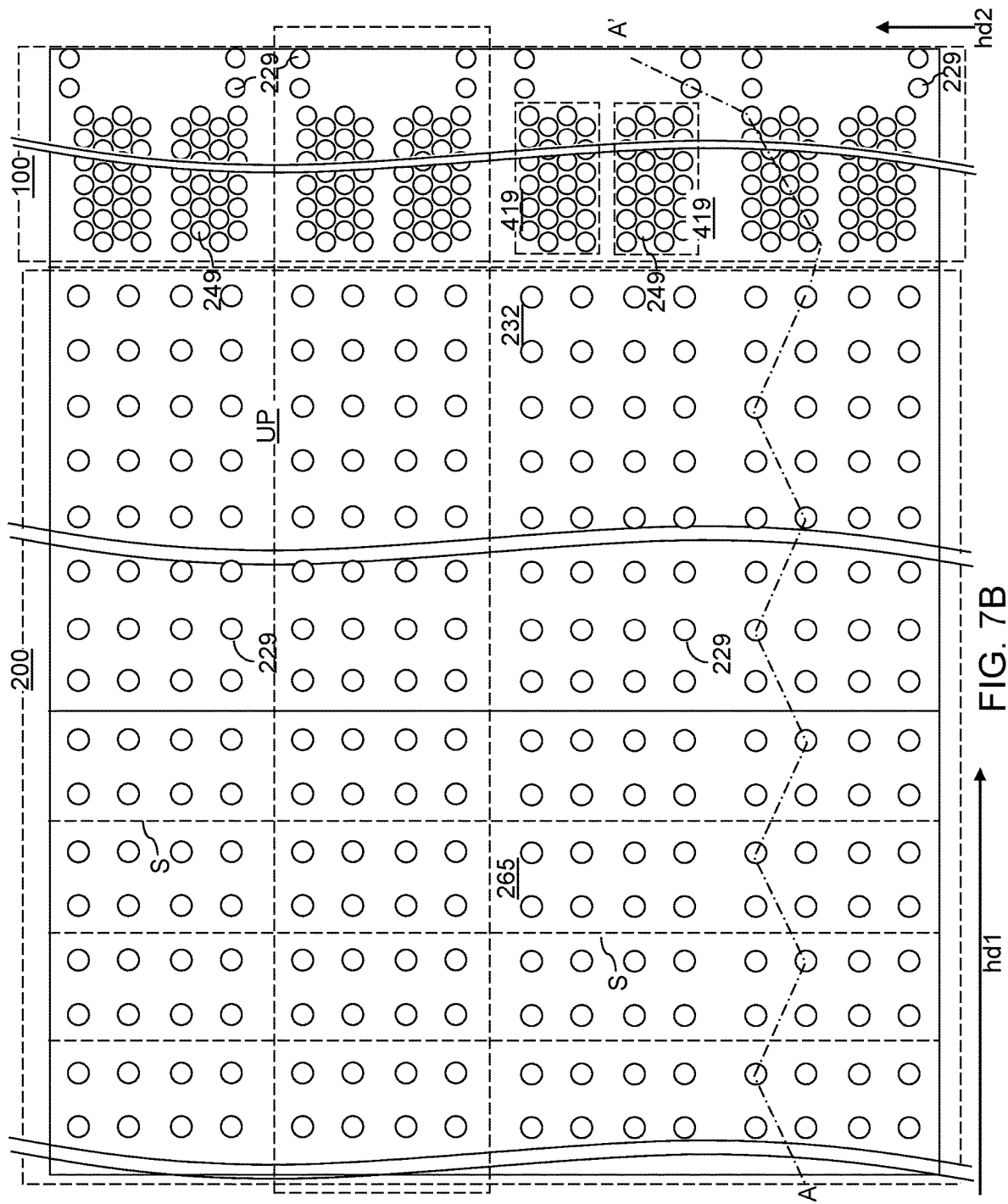
FIG. 7B is a horizontal cross-sectional of the first exemplary structure along the horizontal plane B-B' of FIG. 7A. The hinged vertical plane A-A' corresponds to the plane of the vertical cross-sectional view of FIG. 7A.
Figure 7C:
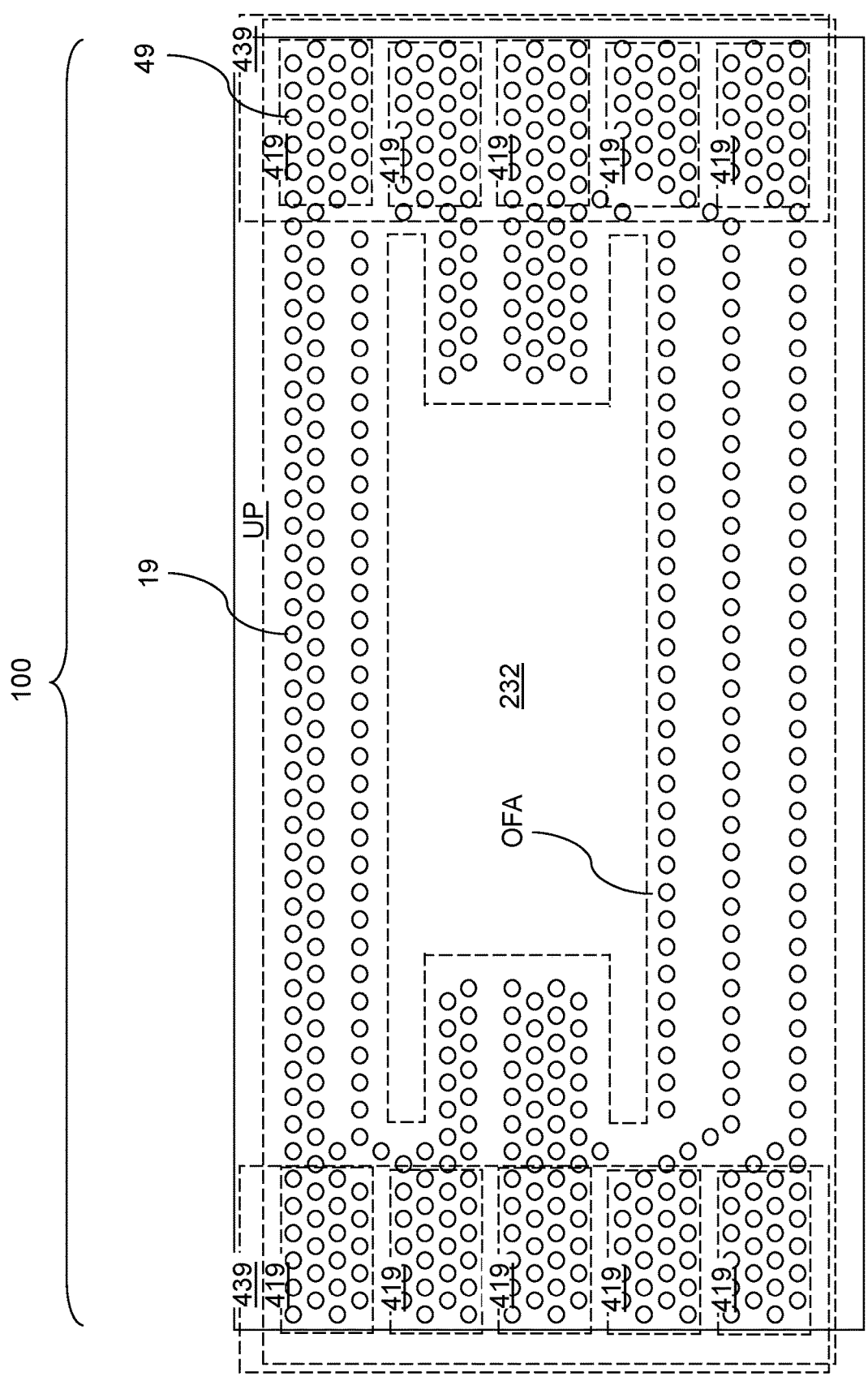
FIG. 7C is a horizontal cross-sectional view of an alternative configuration of the first exemplary structure along a horizontal plane that corresponds to the horizontal plane B-B' of FIG. 7A.

Referring to FIGS. 7A-7C, various second-tier openings (249, 229) may be formed through the second-tier structure (232, 242, 265, 270). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 may be formed directly on a top surface of a respective one of the sacrificial first-tier memory opening fill portions 148. The second-tier support openings 229 may be formed directly on a top surface of a respective one of the sacrificial first-tier support opening fill portions 128. Further, each second-tier support openings 229 may be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

A subset of the second-tier support openings 229 may be formed in sections of the memory array region 100 that are not filled with the second-tier memory openings 249. The sections of the memory array region 100 that are not filled with the second-tier memory openings 249 may be distributed over multiple areas within the memory array region 100. The second-tier support openings 229 may include a first subset of second-tier support openings 229 that are formed in the staircase region 200, and a second subset of second-tier support openings 229 that may be formed between clusters of second-tier memory openings 249 which are laterally spaced apart along the first horizontal direction hd1 in the memory array region 100. A first subset of the second-tier support openings 229 that is formed through the first retro-stepped dielectric material portion 165 may be formed through a respective horizontal surface of the first stepped surfaces. Further, each of the first subset of the second-tier support openings 229 may be formed directly above (i.e., above, and with an areal overlap with) a respective one of the lower-level metal interconnect structure 780.

The second subset of the second-tier support openings 229 may be formed between a respective pair of clusters 419 of second-tier memory openings 249 that are laterally spaced apart along the first horizontal direction hd1. In one embodiment, some of the second-tier support openings 229 within the second subset of the second-tier support openings 229 may be arranged in rows that extend along the first direction hd1. Additional first-tier support openings may be provided outside the rows of the second-tier support openings 229. Generally, a unit pattern UP of a combination of second-tier memory openings 249 and second-tier support openings 229 may be repeated along the second horizontal direction hd2. Each unit pattern UP includes a plurality of clusters 419 of second-tier memory openings 249 that are laterally spaced apart along the second horizontal direction hd2 and/or laterally spaced apart along the first horizontal direction hd1.

Discrete areas free of second-tier memory openings 249 and second-tier support openings 229 are provided in the memory array region 100. Second-tier support openings 229 between two groups 439 of clusters 419 of second-tier support openings 229 may be arranged such that an opening-free area (OFA) that is free of second-tier memory openings 249 and free of second-tier support openings 229 is provided within each unit pattern (UP). In one embodiment, the OFA includes a pair of rectangular areas that laterally extend along the first horizontal direction hd1 and a connecting rectangular area that connects the pair of rectangular areas and has a lesser lateral extent along the first horizontal direction hd1 than the pair of rectangular areas.

Figure 8:
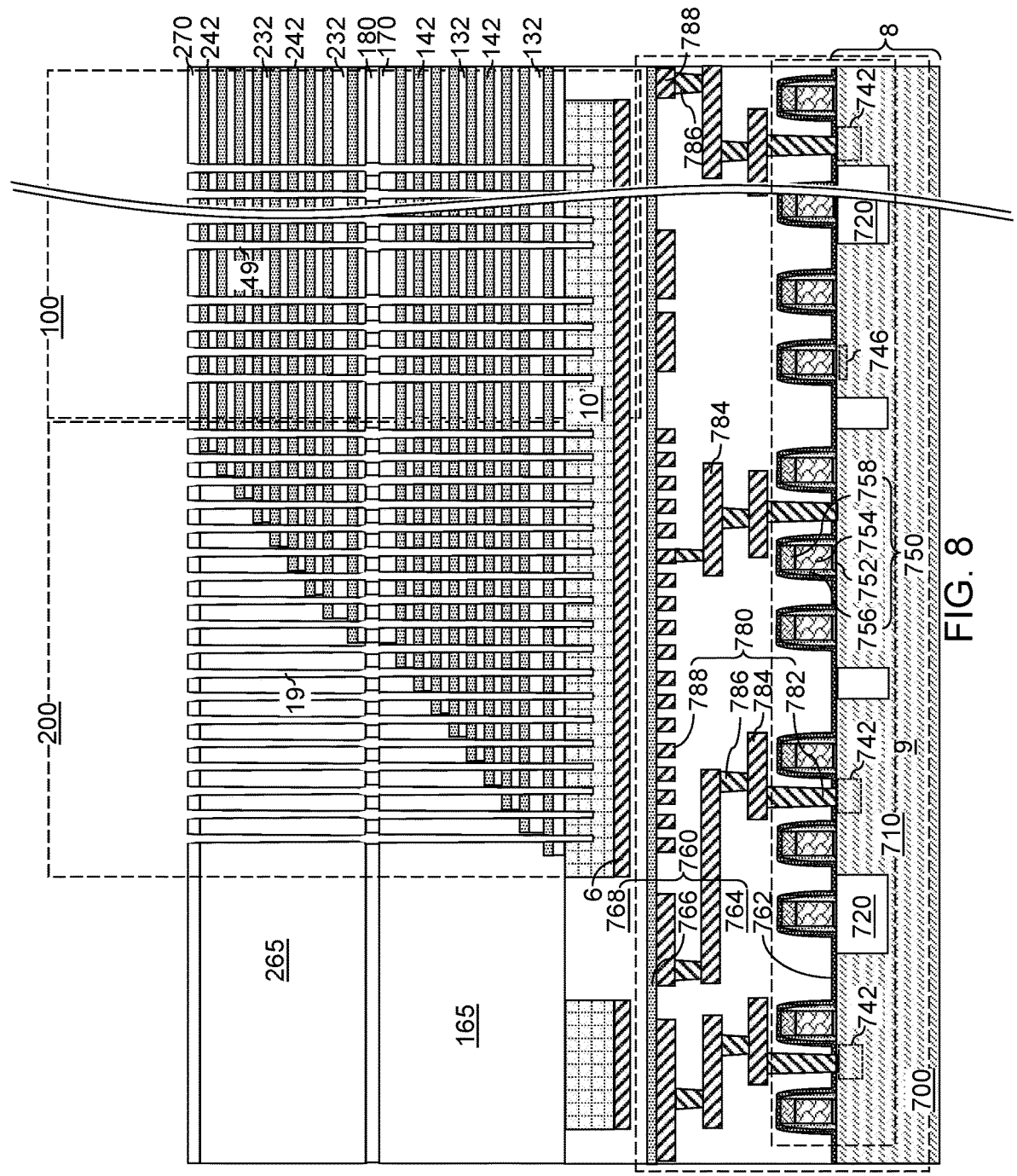
FIG. 8 is a vertical cross-sectional view of the first exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, may be formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Figures 9A, 9B:
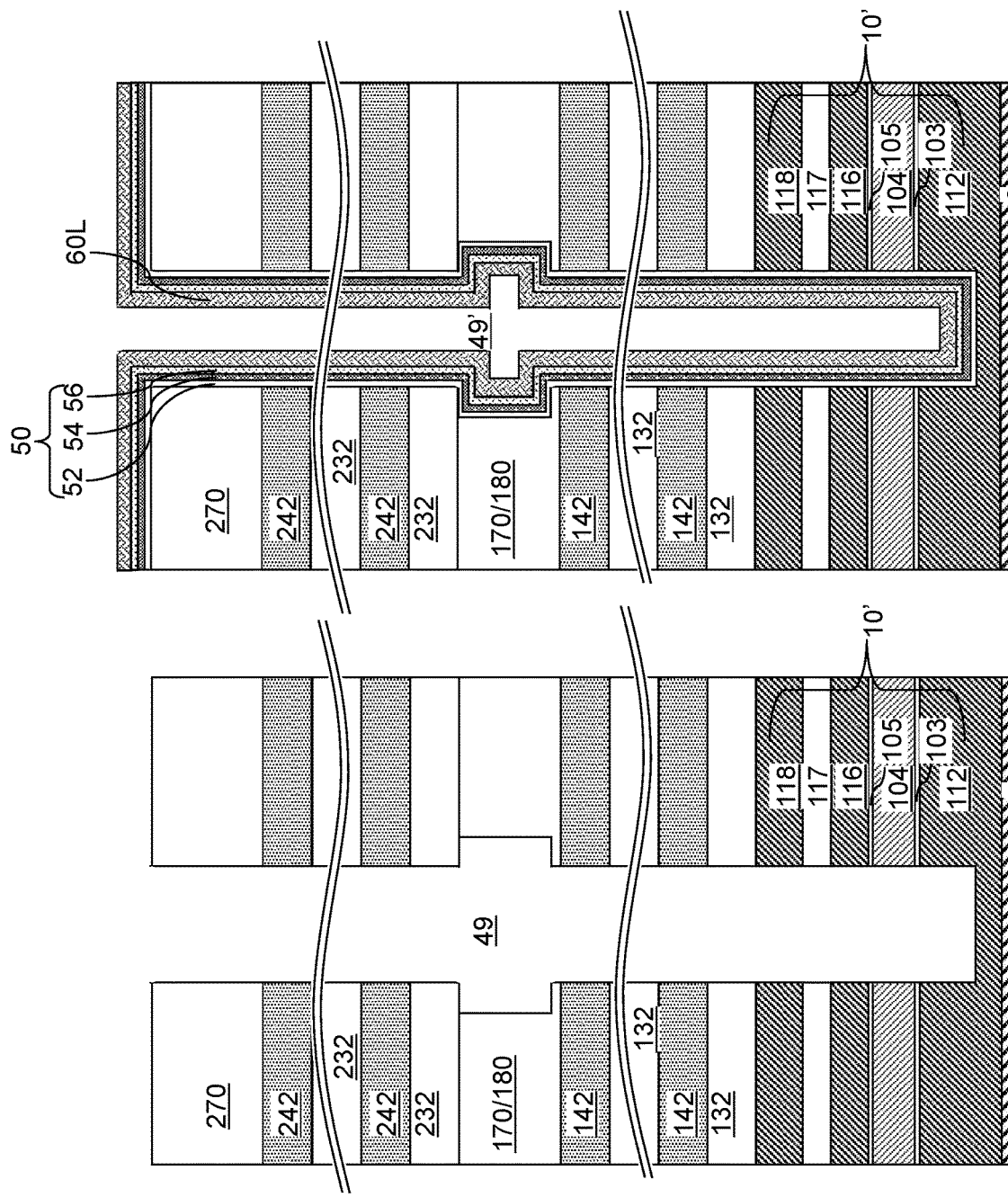

Referring to FIG. 9A, a memory opening 49 in the exemplary device structure of FIG. 8 is illustrated. The memory opening 49 may extend through the first-tier structure and the second-tier structure.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L may include a doped semiconductor material such as at least one elemental semiconductor material, at least one III-V compound semiconductor material, at least one II-VI compound semiconductor material, at least one organic semiconductor material, or other semiconductor materials known in the art. The conductivity type of dopants in the semiconductor channel material layer 60L is herein referred to as a first conductivity type, which may be p-type or n-type. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^2/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in embodiments in which the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. In one embodiment, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material—constitutes a drain region 63. The dopant concentration in the drain regions 63 may be in a range from $5.0 \times 10^{19}/cm^3$ to $2.0 \times 10^1/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 may be surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 may be a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. Each drain region 63 in a memory opening fill structure 58 is electrically connected to an upper end of a respective one of the vertical semiconductor channels 60. The in-process source-level material layers 10', the first-tier structure (132, 142, 170, 165), the second-tier structure (232, 242, 270, 265), the inter-tier dielectric layer 180, and the memory opening fill structures 58 collectively constitute a memory-level assembly.

Figure 10:
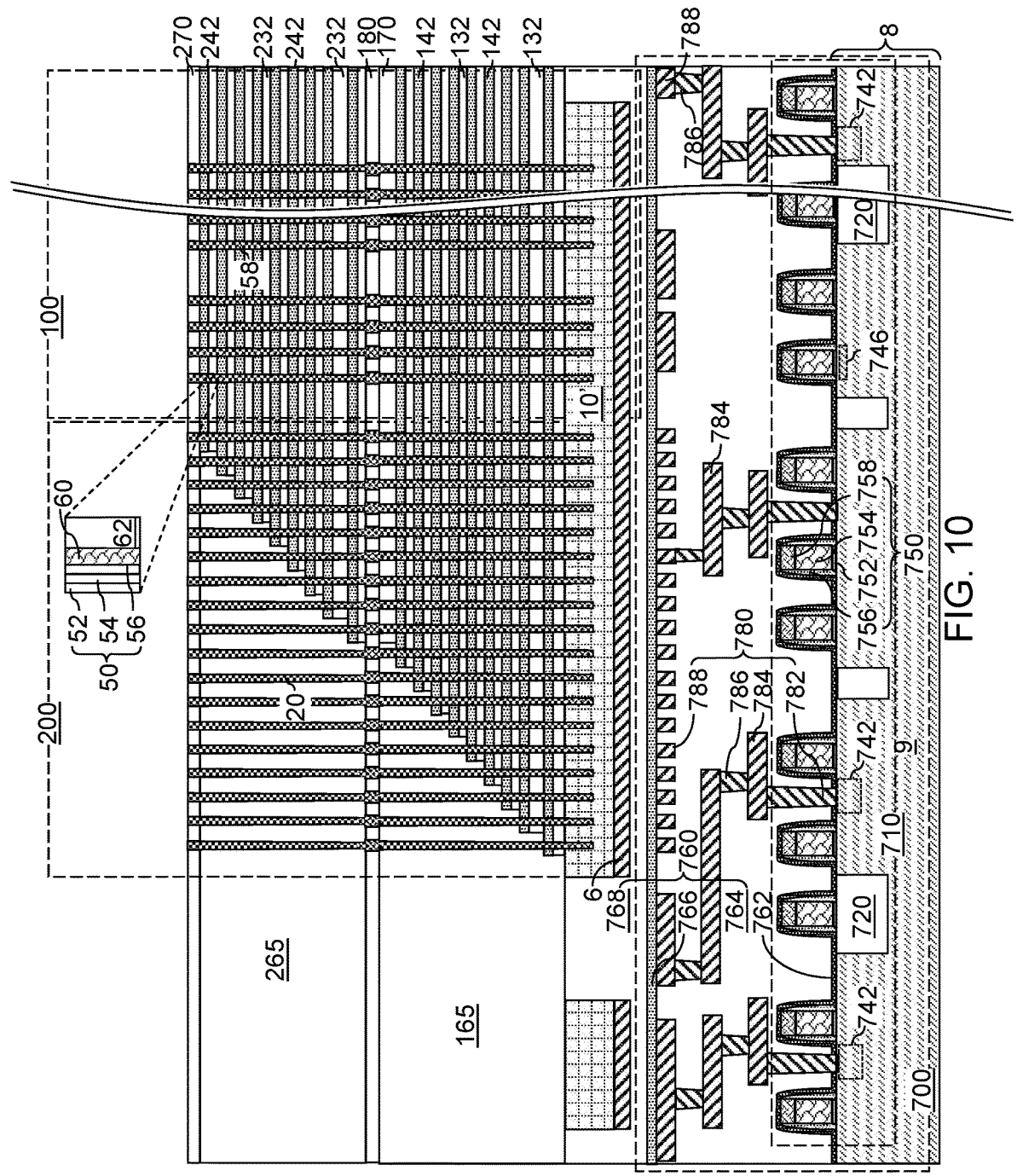
FIG. 10 is a vertical cross-sectional view of the first exemplary structure after formation of memory opening fill structures and support pillar structures according to an embodiment of the present disclosure.

Referring to FIG. 10, the first exemplary structure is illustrated after formation of the memory opening fill structures 58. Support pillar structures 20 may be formed in the support openings 19 concurrently with formation of the memory opening fill structures 58. Each support pillar structure 20 may have a same set of components as a memory opening fill structure 58. Each of the alternating stacks {(132, 142), (232, 242)} comprises a terrace region in which each sacrificial material layer (142, 242) other than a topmost sacrificial material layer (142, 242) within the alternating stack {(132, 142) and/or (232, 242)} laterally extends farther than any overlying sacrificial material layer (142, 242) within the alternating stack {(132, 142) and/or (232, 242)}. The terrace region includes stepped surfaces of the alternating stack that continuously extend from a bottommost layer within the alternating stack {(132, 142) or (232, 242)} to a topmost layer within the alternating stack {(132, 142) or (232, 242)}. Support pillar structures 20 extend through the stepped surfaces and through a retro-stepped dielectric material portion (165 or 265) that overlies the stepped surfaces.

Referring to FIGS. 11A-11F, a first contact level dielectric layer 280 may be formed over the second-tier structure (232, 242, 270, 265). The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

A photoresist layer (not shown) may be applied over the first contact level dielectric layer 280, and may be lithographically patterned to form various openings in the memory array region 100 and the staircase region 200. The openings in the photoresist layer include first elongated openings that laterally extend along the first horizontal direction hd1 through the entire lateral extent of the memory array region 100 and the staircase region 200 along the first horizontal direction hd1. The first elongated openings laterally extend between groups of memory opening fill structures 58 and support pillar structures 20. Further, the openings in the photoresist layer may include second elongated openings that extend along the first horizontal direction hd1 between clusters of memory opening fill structures 58 that are laterally spaced apart along the first horizontal direction hd1 and located between a neighboring pair of first elongated openings. Each second elongated opening has a lesser lateral extent that the lateral extent of the memory array region 100 along the first horizontal direction hd1. Optionally, the openings in the photoresist layer may include discrete openings located between end regions of a neighboring pair of second elongated openings.

An anisotropic etch may be performed to transfer the pattern in the photoresist layer through underlying material portions including the alternating stacks {(132, 142), (232, 242)} and an upper portion of the in-process source-level material layers 10'. Backside trenches 79 may be formed underneath the first elongated openings in the photoresist layer through the first contact level dielectric layer 280, the second-tier structure (232, 242, 270, 265), and the first-tier structure (132, 142, 170, 165), and into the in-process source-level material layers 10'. Portions of the first contact level dielectric layer 280, the second-tier structure (232, 242, 270, 265), the first-tier structure (132, 142, 170, 165), and the in-process source-level material layers 10' that underlie the first elongated openings in the photoresist layer may be removed to form the backside trenches 79. In one embodiment, the backside trenches 79 may be formed between groups of memory stack structures 55 that are laterally spaced apart along the second horizontal direction. A top surface of a source-level sacrificial layer 104 may be physically exposed at the bottom of each backside trench 79.

The anisotropic etch forms barrier trenches 179 which are not connected to each other concurrently with formation of the backside trenches 79. The barrier trenches 179 may be formed between neighboring pairs of backside trenches 79 within the memory array region 100 underneath the second elongated openings in the photoresist layer. The barrier trenches 179 may be formed through the first contact level dielectric layer 280, the second-tier structure (232, 242, 270, 265), the first-tier structure (132, 142, 170, 165), and into the in-process source-level material layers 10'. Each barrier trench 179 laterally extends along the first horizontal direction hd1. Each pair of barrier trenches 179 may be laterally spaced apart from each other by a uniform separation distance. Each barrier trench 179 may have a pair of vertical sidewalls that laterally extend along the first horizontal direction hd1.

In case the photoresist layer includes discrete openings between end regions of each neighboring pair of second elongated openings, the anisotropic etch process forms discrete via openings 279 concurrently with formation of the backside trenches 79 and the barrier trenches 179. The discrete via openings 279 may be formed between neighboring pairs of end regions of the barrier trenches 179 within the memory array region 100 underneath the discrete openings in the photoresist layer. The discrete via openings 279 may be formed through the first contact level dielectric layer 280, the second-tier structure (232, 242, 270, 265), the first-tier structure (132, 142, 170, 165), and into the in-process source-level material layers 10'.

Figure 11A:
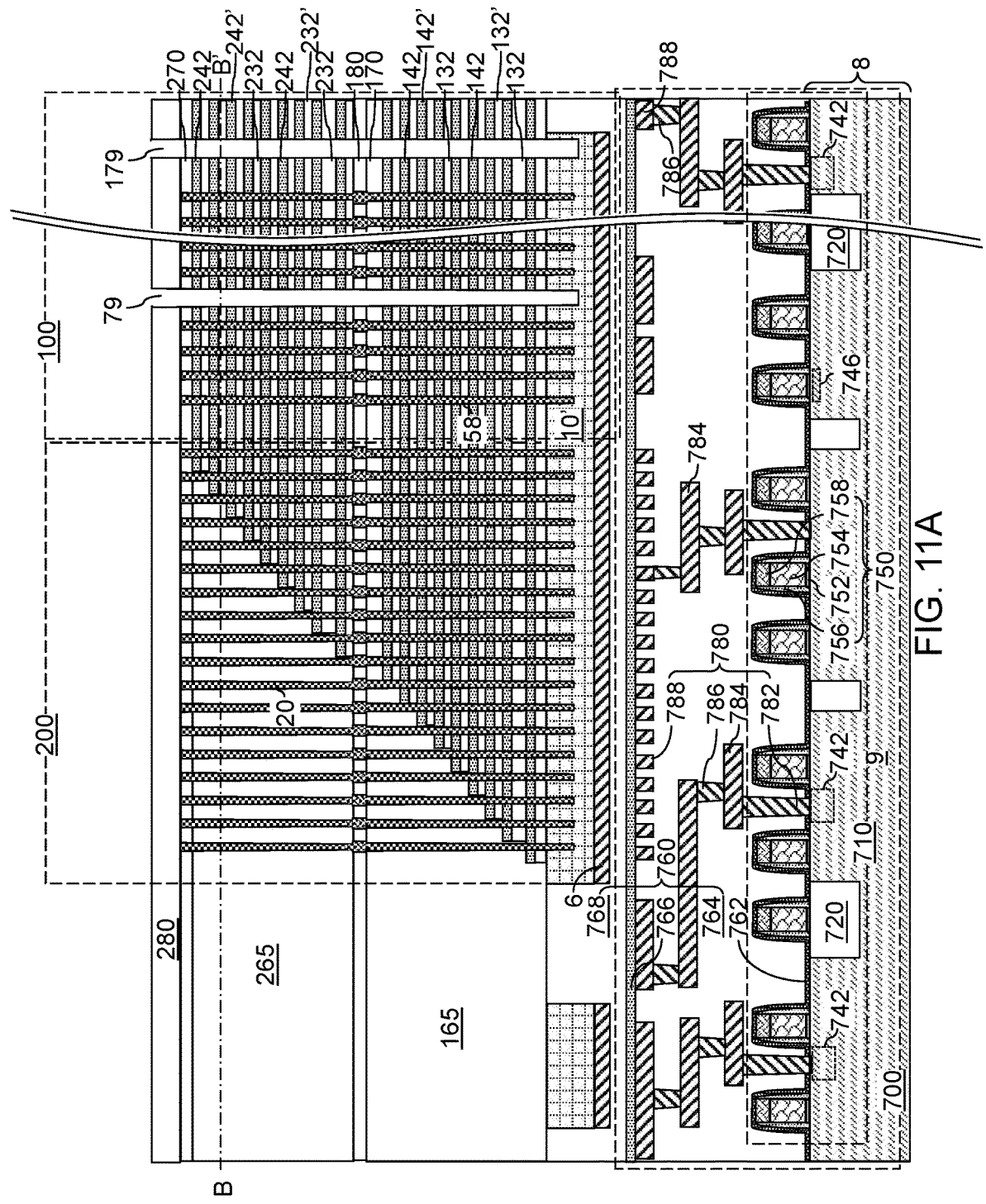
FIG. 11A is a vertical cross-sectional view of the first exemplary structure after formation of backside trenches, moat trenches, and contact openings according to an embodiment of the present disclosure.
Figure 11B:
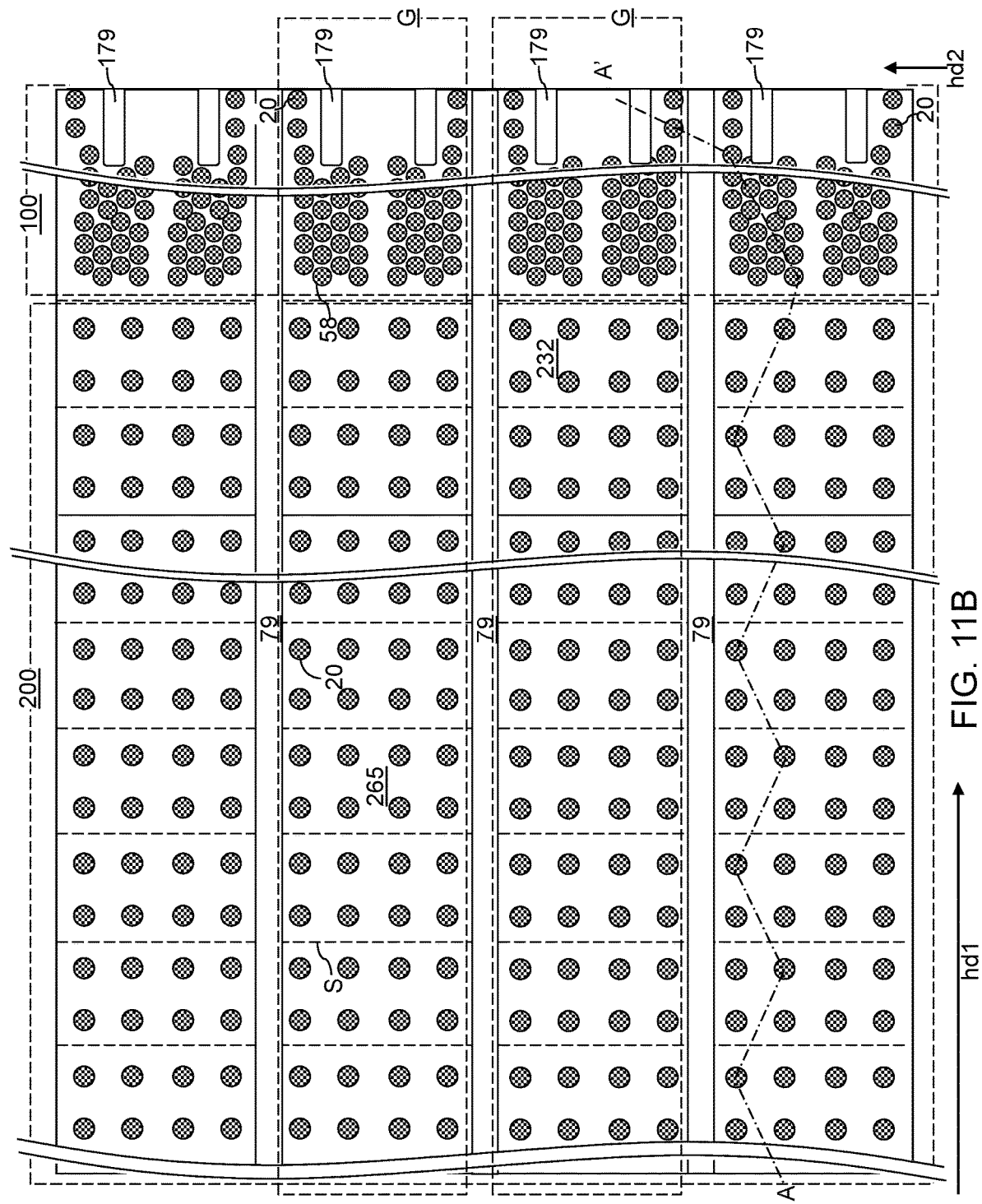
FIG. 11B is a horizontal cross-sectional of the first exemplary structure along the horizontal plane B-B' of FIG. 11A. The hinged vertical plane A-A' corresponds to the plane of the vertical cross-sectional view of FIG. 11A.
Figure 11C:
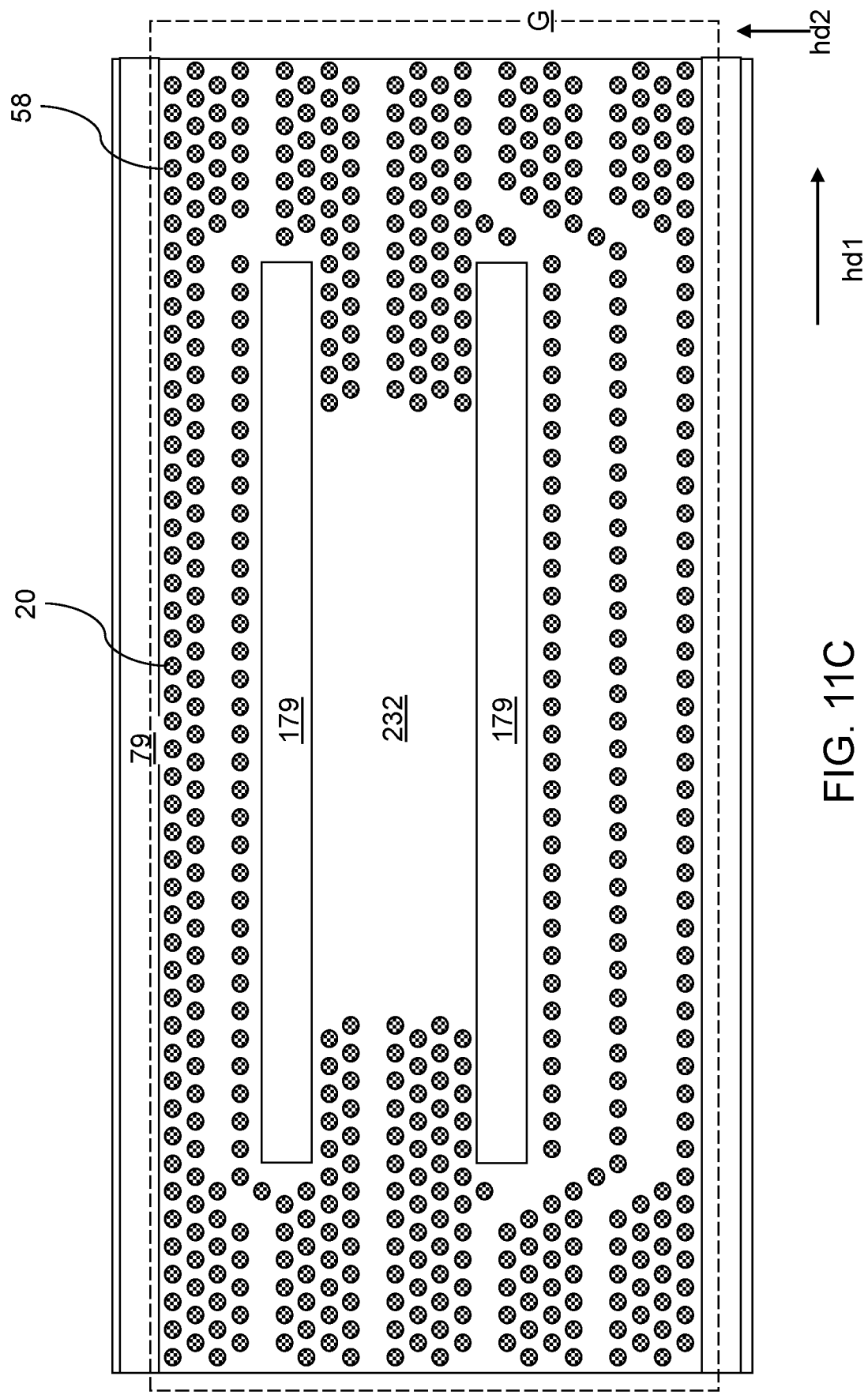
FIG. 11C is a horizontal cross-sectional view of a first alternative configuration of the first exemplary structure along a horizontal plane that corresponds to the horizontal plane B-B' of FIG. 11A.
Figure 11D:
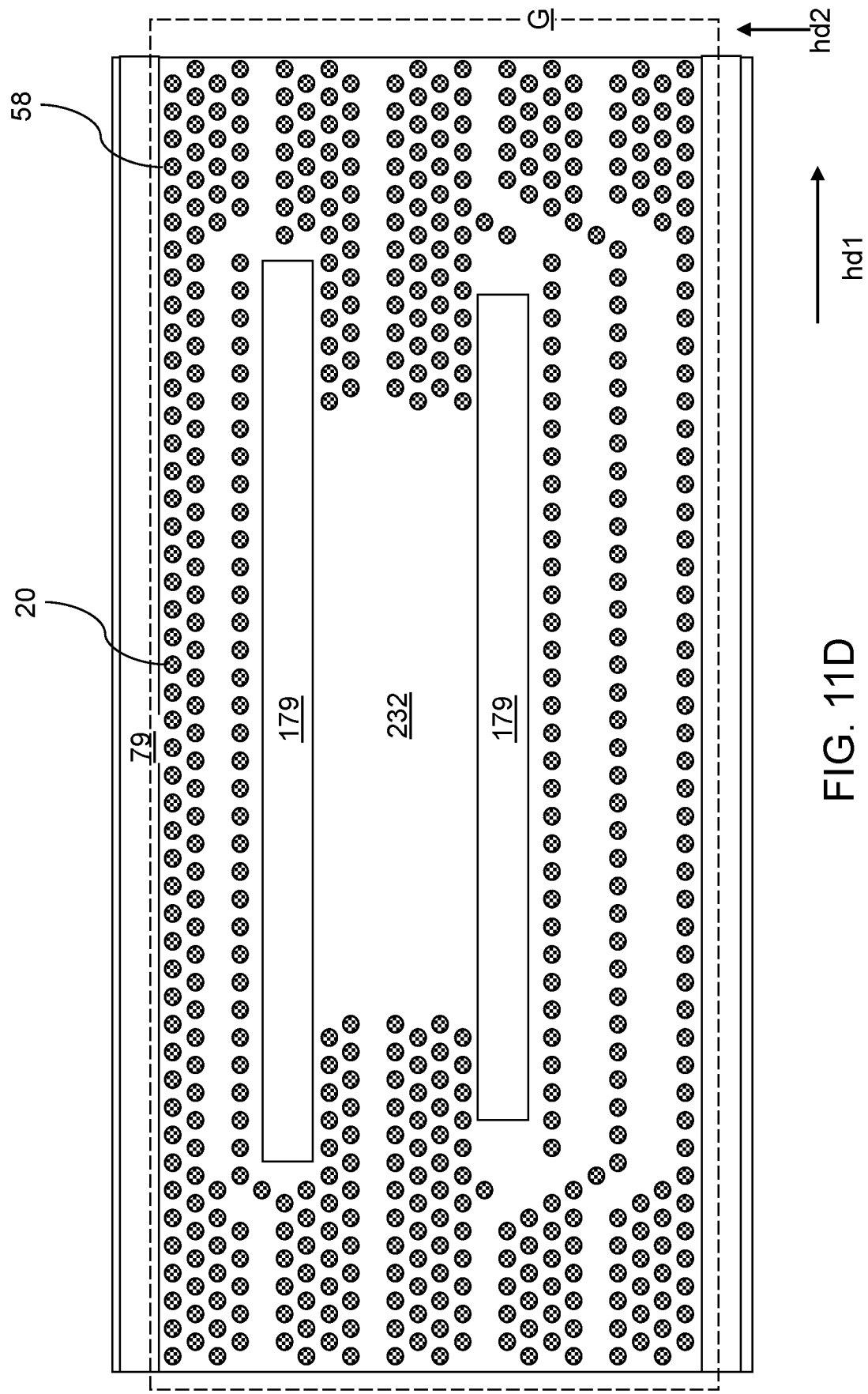
FIG. 11D is a horizontal cross-sectional view of a second alternative configuration of the first exemplary structure along a horizontal plane that corresponds to the horizontal plane B-B' of FIG. 11A.
Figure 11E:
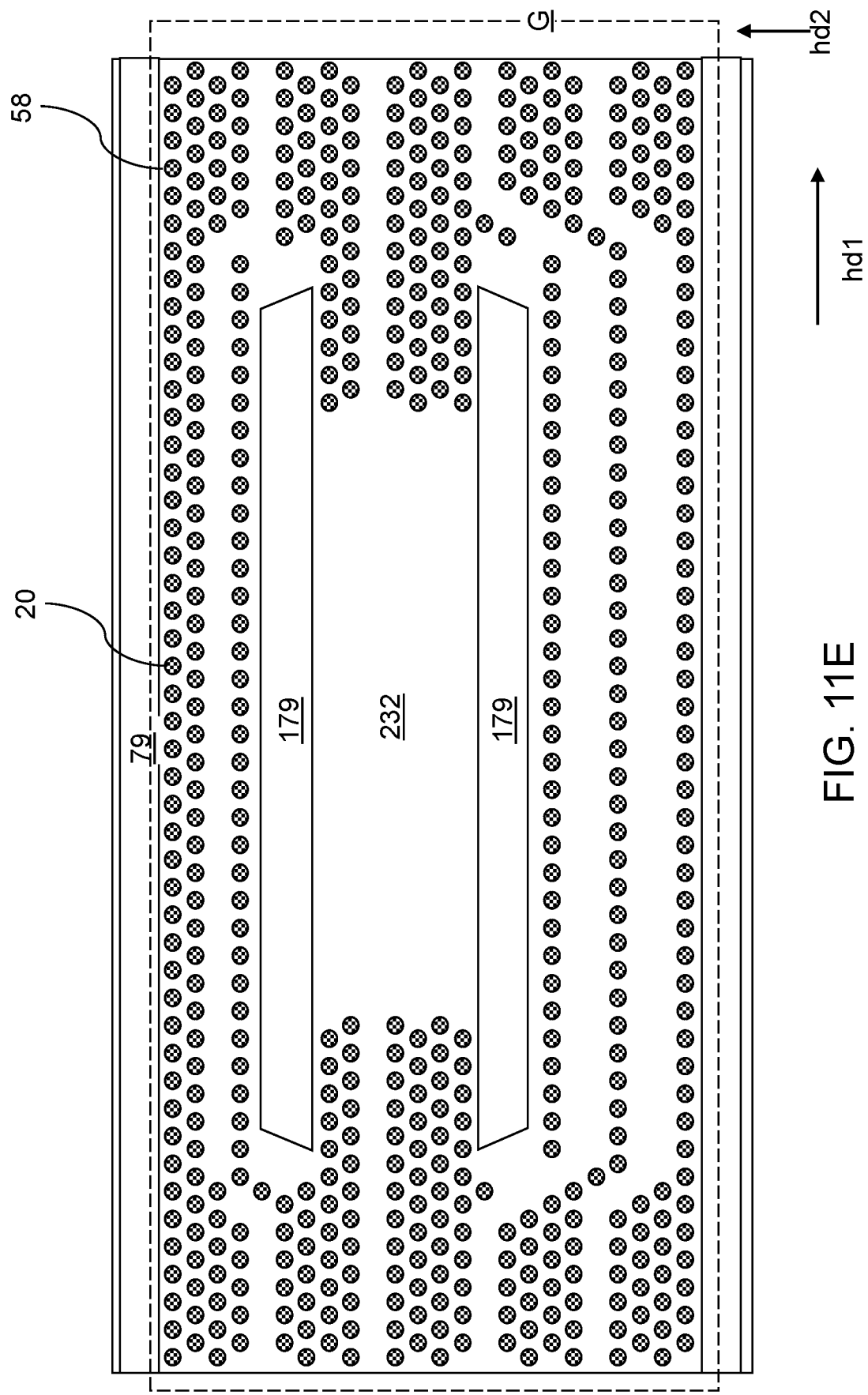
FIG. 11E is a horizontal cross-sectional view of a third alternative configuration of the first exemplary structure along a horizontal plane that corresponds to the horizontal plane B-B' of FIG. 11A.
Figure 11F:
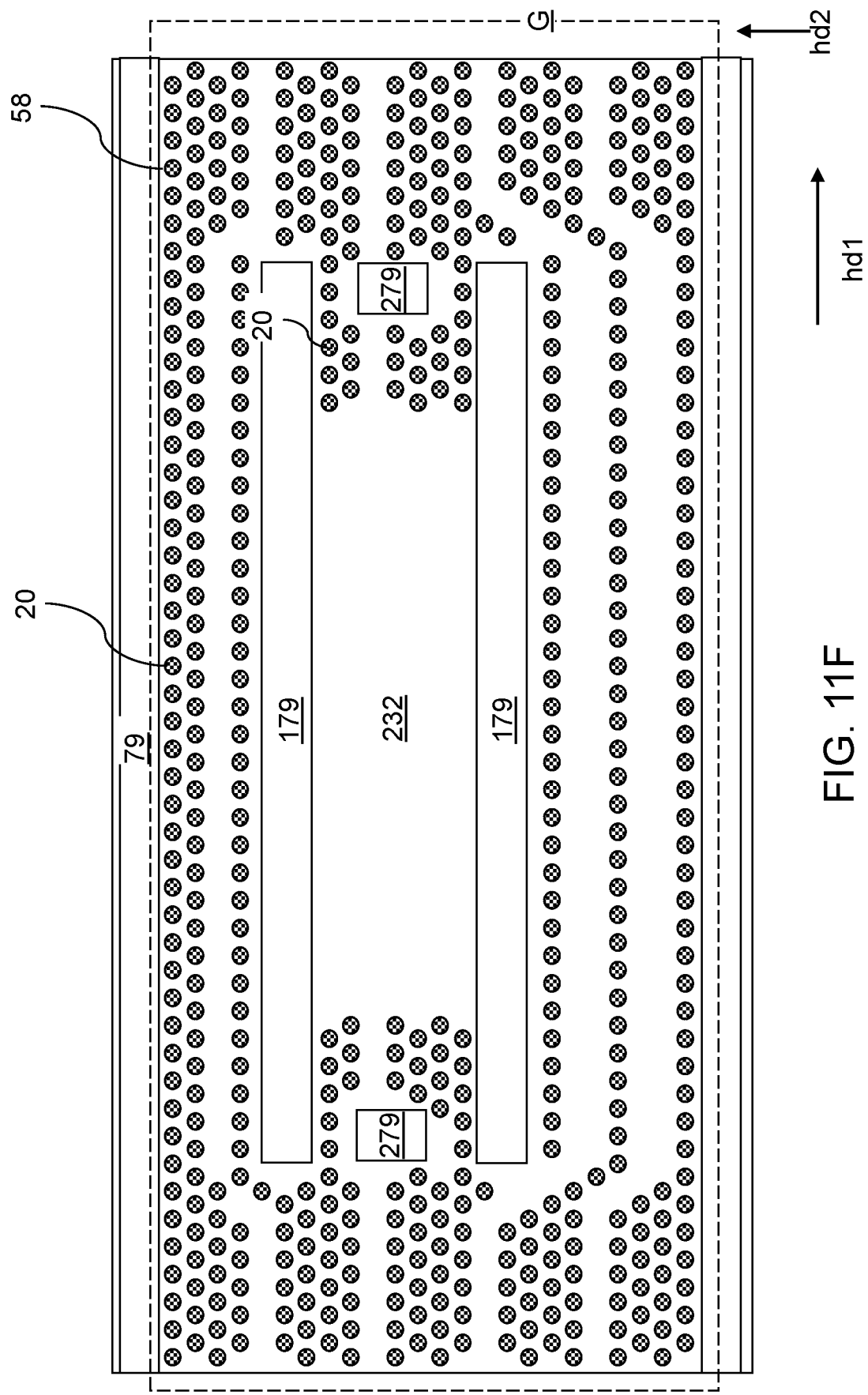
FIG. 11F is a horizontal cross-sectional view of a fourth alternative configuration of the first exemplary structure along a horizontal plane that corresponds to the horizontal plane B-B' of FIG. 11A.

Each of the barrier trenches 179 may include a respective pair of lengthwise sidewalls that extend along the first horizontal direction hd1. In one embodiment, the barrier trenches 179 may have rectangular horizontal cross-sectional shapes. In one embodiment, a pair of barrier trenches 179 may extend along the first horizontal direction hd1 by a same lateral extension distance, i.e., by the same length measured along the first horizontal direction hd1, as illustrated in FIG. 11C. In one embodiment, a pair of barrier trenches 179 may be spaced from a respective most proximal one of the backside trenches 79 by different trench-to-sidewall spacings, and may laterally extend along the first horizontal direction hd1 by different lateral extension distances as illustrated in FIG. 11D. In this case, the barrier trench 179 that is spaced from a most proximal one of the backside trenches 79 by a greater distance may have a lesser lateral extension distance. This configuration allows formation of etch fronts that are approximately parallel to the second horizontal direction hd2 during a subsequent isotropic etch process for etching the sacrificial material layers 42. In one embodiment, the barrier trenches 179 may have trapezoidal horizontal cross-sectional shapes as illustrated in FIG. 11E. Alternatively, the barrier trenches 179 may have at least one contoured sidewall having a curvature in a horizontal cross-sectional view that is adjoined to a pair of lengthwise sidewalls that extend along the first horizontal direction hd1, as will be described in more detail below and shown in FIG. 21G. In one embodiment, the discrete via openings 279 may be positioned between end regions of each pair of barrier trenches 179 as illustrated in FIG. 11F. The discrete via openings 279 may provide an etch front that is substantially parallel to the second horizontal direction hd2 in the area between a pair of barrier trenches 179 during a subsequent isotropic etch process that etches the sacrificial material layers 42.

Generally, an alternating stack {(132, 232), (142, 242)} of insulating layers 132 and sacrificial material layers (142, 242) may be formed over a semiconductor substrate 8 including the substrate semiconductor layer 9. The sacrificial material layers (142, 242) may comprise a dielectric material such as silicon nitride. The alternating stack {(132, 232), (142, 242)} may be etched by performing an anisotropic etch process using a patterned mask layer (such as a photoresist layer). The alternating stack {(132, 232), (142, 242)} may be divided into a plurality of alternating stacks {(132, 232), (142, 242)} of respective insulating layers (132, 232) and respective sacrificial material layers (142, 242) by backside trenches 79. A pair of barrier trenches 179 may be formed through each of the plurality of alternating stacks {(132, 232), (142, 242)}.

In one embodiment, each of the barrier trenches 179 may include a respective uniform-width region that laterally extends along the first horizontal direction hd1 with a respective uniform width along a second horizontal direction hd2 that is perpendicular to the first horizontal direction hd1. In one embodiment, the pair of backside trenches 179 may have a same lateral extent along the first horizontal direction hd1. In one embodiment, the pair of barrier trenches 179 may be laterally offset along the second horizontal direction hd2 from a respective proximal backside trench 79 selected from the pair of backside trenches 79 by unequal lateral trench-to-dielectric spacings; and a barrier trench 179 of the pair of barrier trenches 179 having a greater trench-to-sidewall spacing may have a lateral extent along the first horizontal direction hd1 that is less than a lateral extent along the first horizontal direction hd1 for a barrier trench 179 of the pair of barrier trenches 179 having a lesser trench-to-sidewall spacing.

In one embodiment, each of the pair of barrier trenches 179 may comprise angled sidewalls located within a respective vertical plane that is at an angle in a range from 15 degrees to 75 degrees with respect to a vertical plane including the first horizontal direction hd1. In one embodiment, each barrier trench 179 may be an elongated trench that vertically extends through each layer of an alternating stack {(132, 232), (142, 242)} and has a greater lateral dimension along the first horizontal direction hd1 than along the second horizontal direction hd2.

Figure 12A:
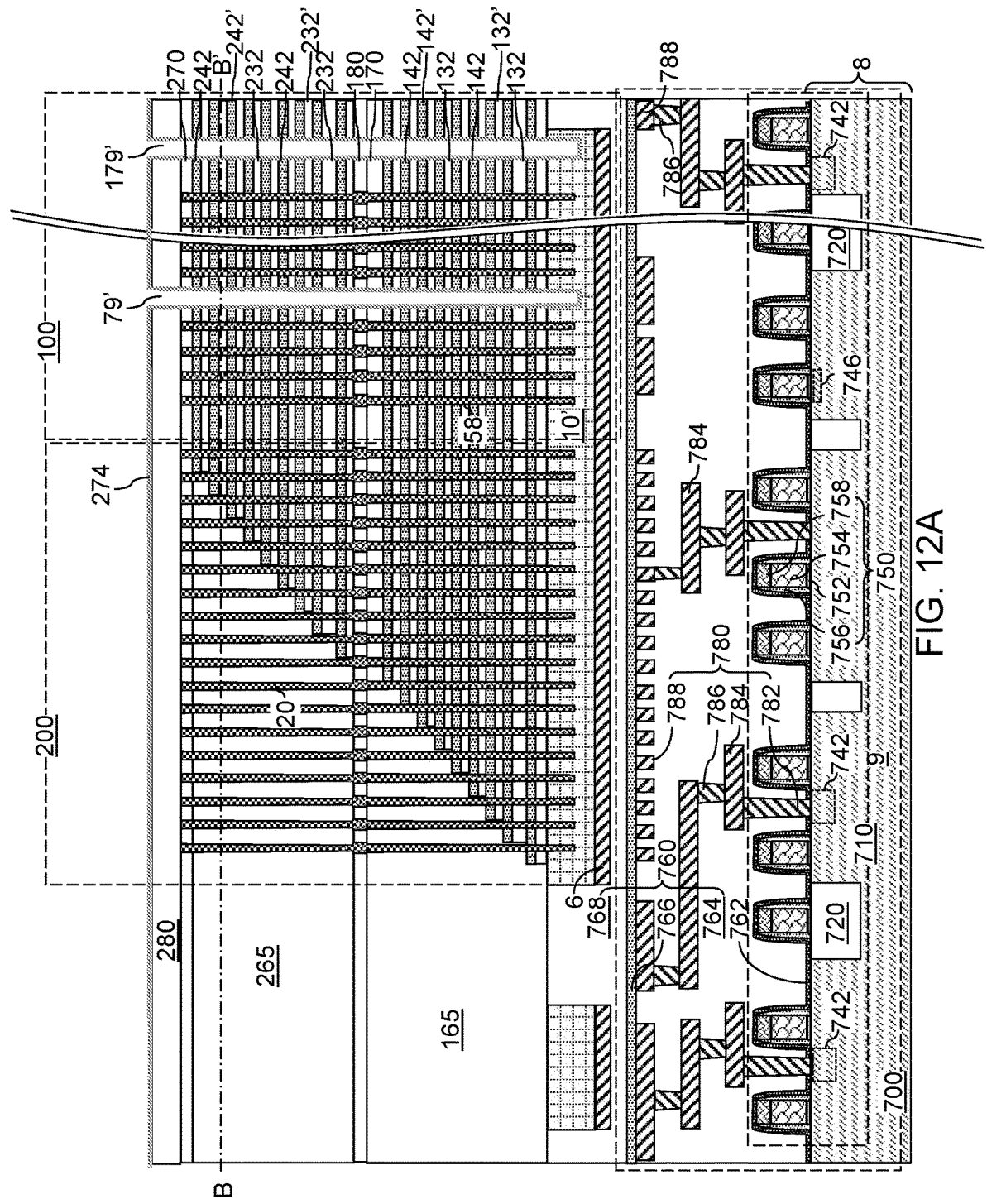
FIG. 12A is a vertical cross-sectional view of the first exemplary structure after formation of a dielectric liner according to an embodiment of the present disclosure.
Figure 12B:
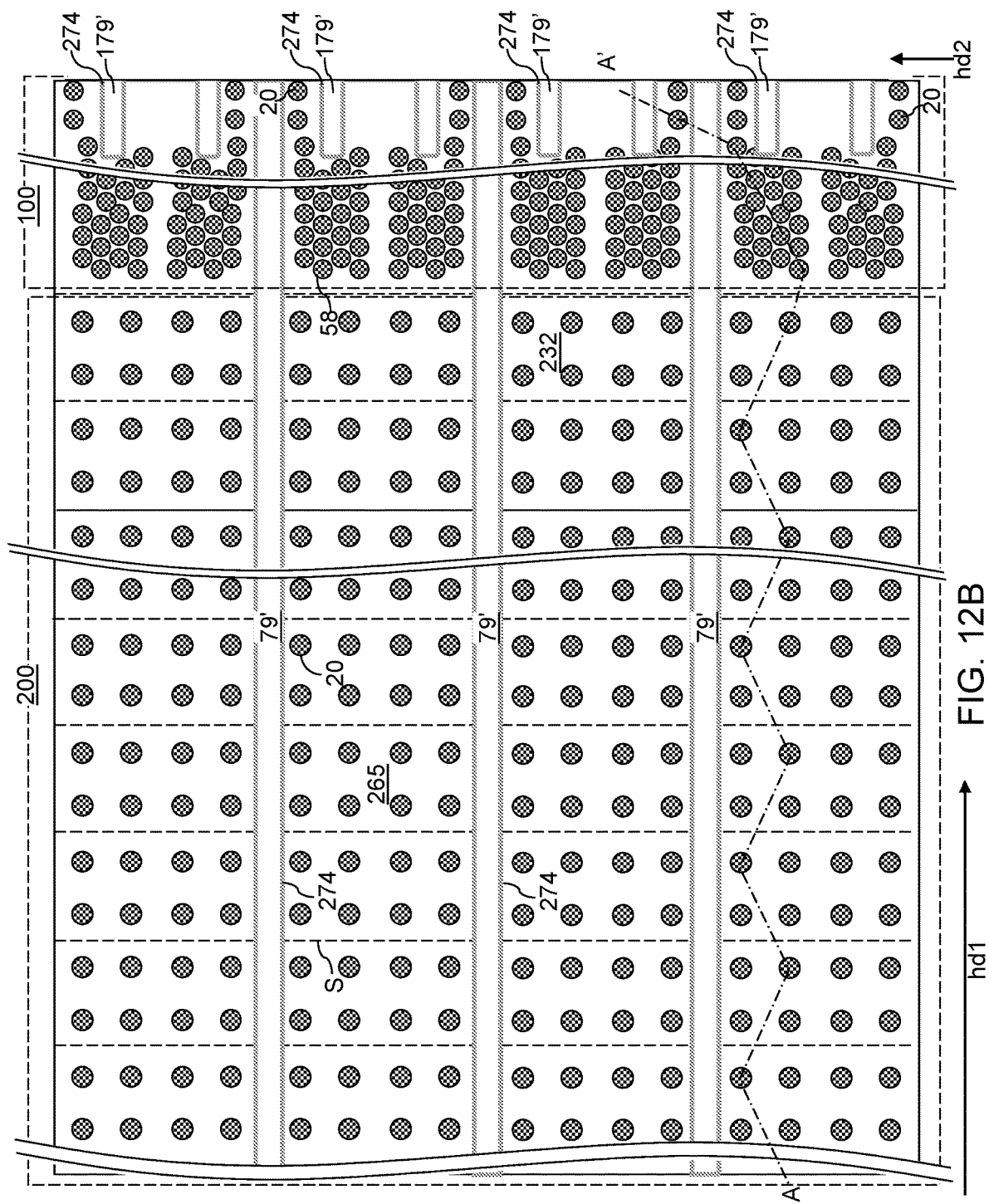
FIG. 12B is a horizontal cross-sectional of the first exemplary structure along the horizontal plane B-B' of FIG. 12A. The hinged vertical plane A-A' corresponds to the plane of the vertical cross-sectional view of FIG. 12A.
Figure 13A:
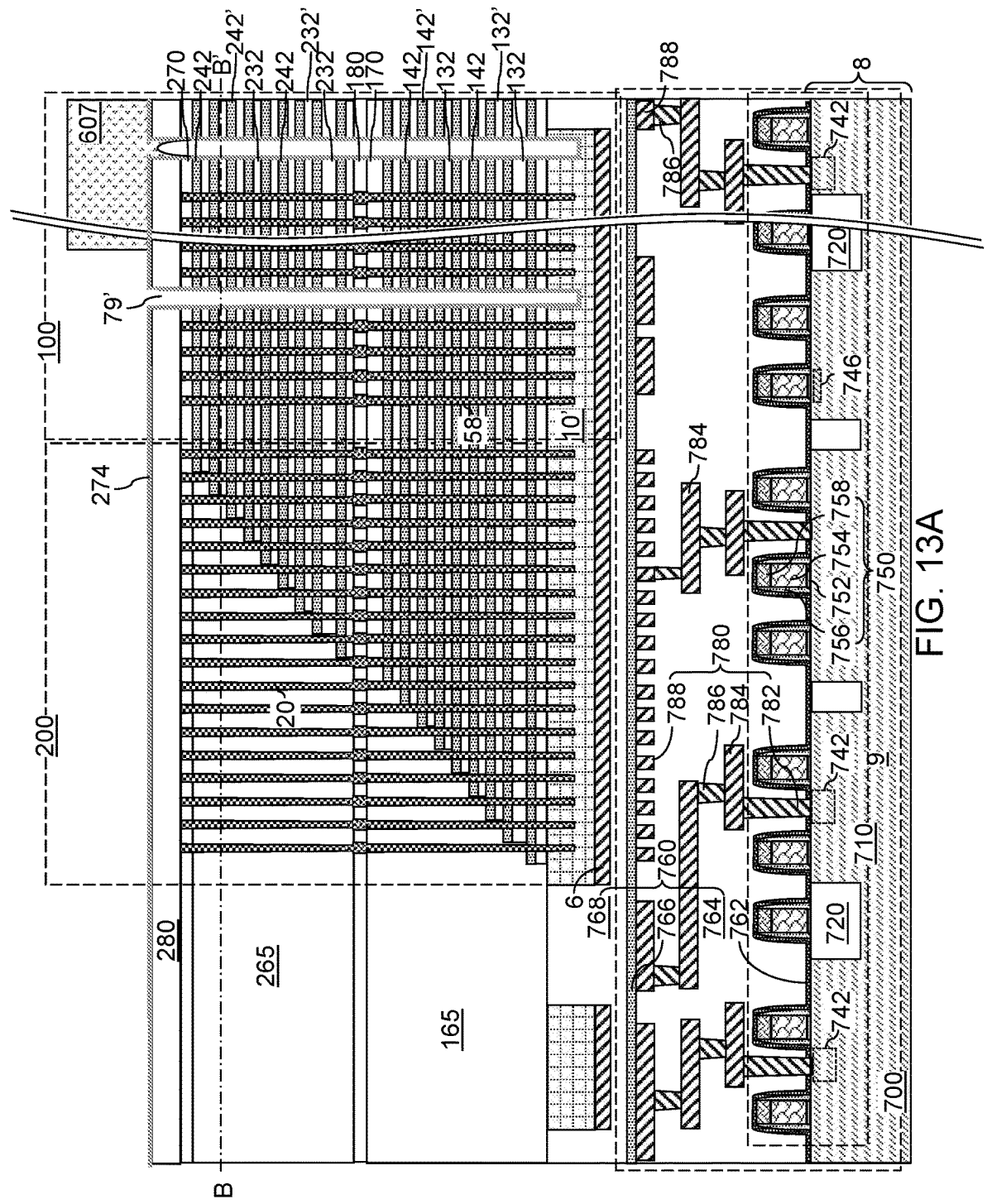
FIG. 13A is a vertical cross-sectional view of the first exemplary structure after application and patterning of a photoresist layer according to an embodiment of the present disclosure.
Figure 13B:
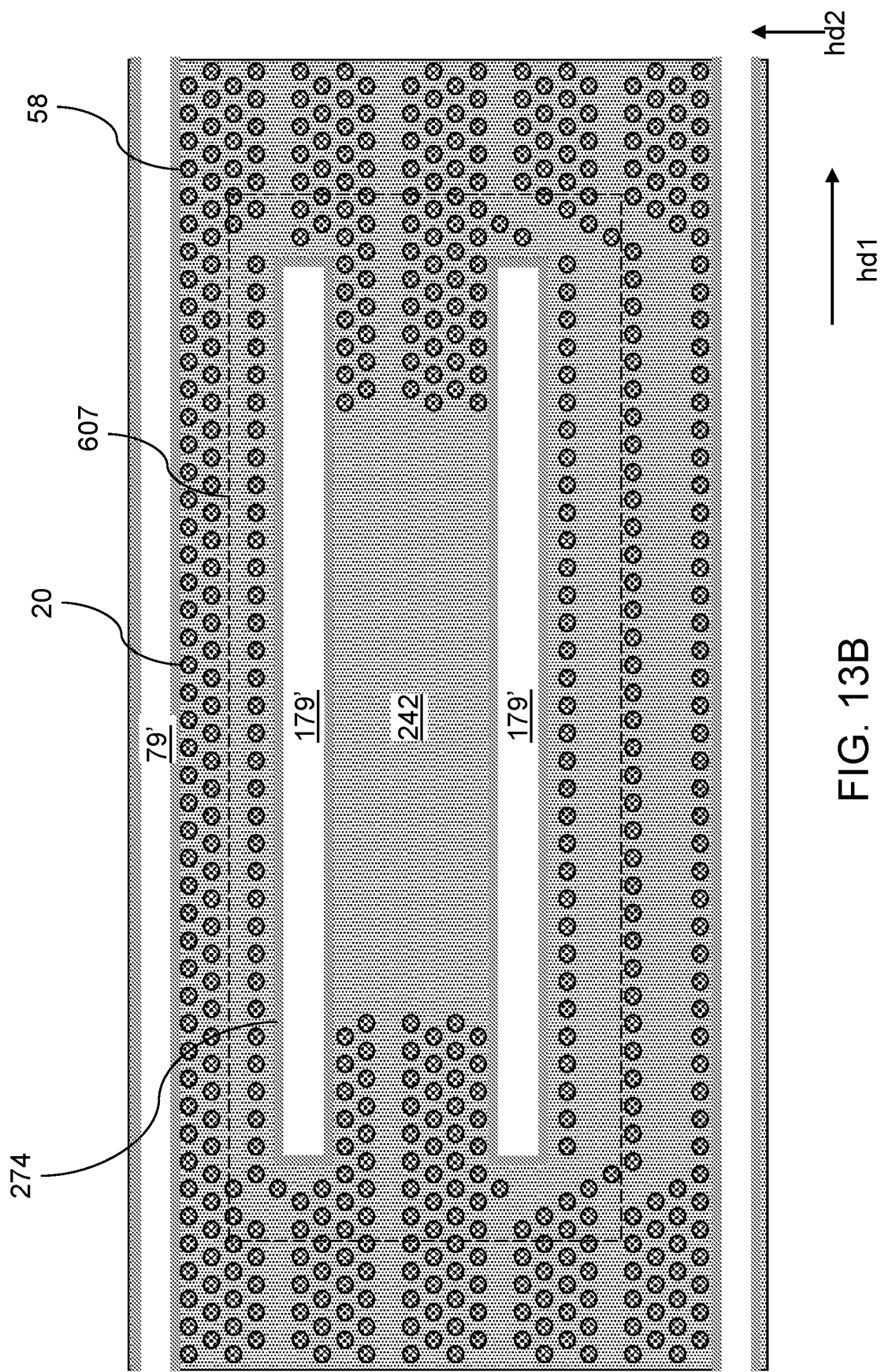
FIG. 13B is a horizontal cross-sectional view of a first alternative configuration of the first exemplary structure along a horizontal plane that corresponds to the horizontal plane B-B' of FIG. 13A.
Figure 13C:
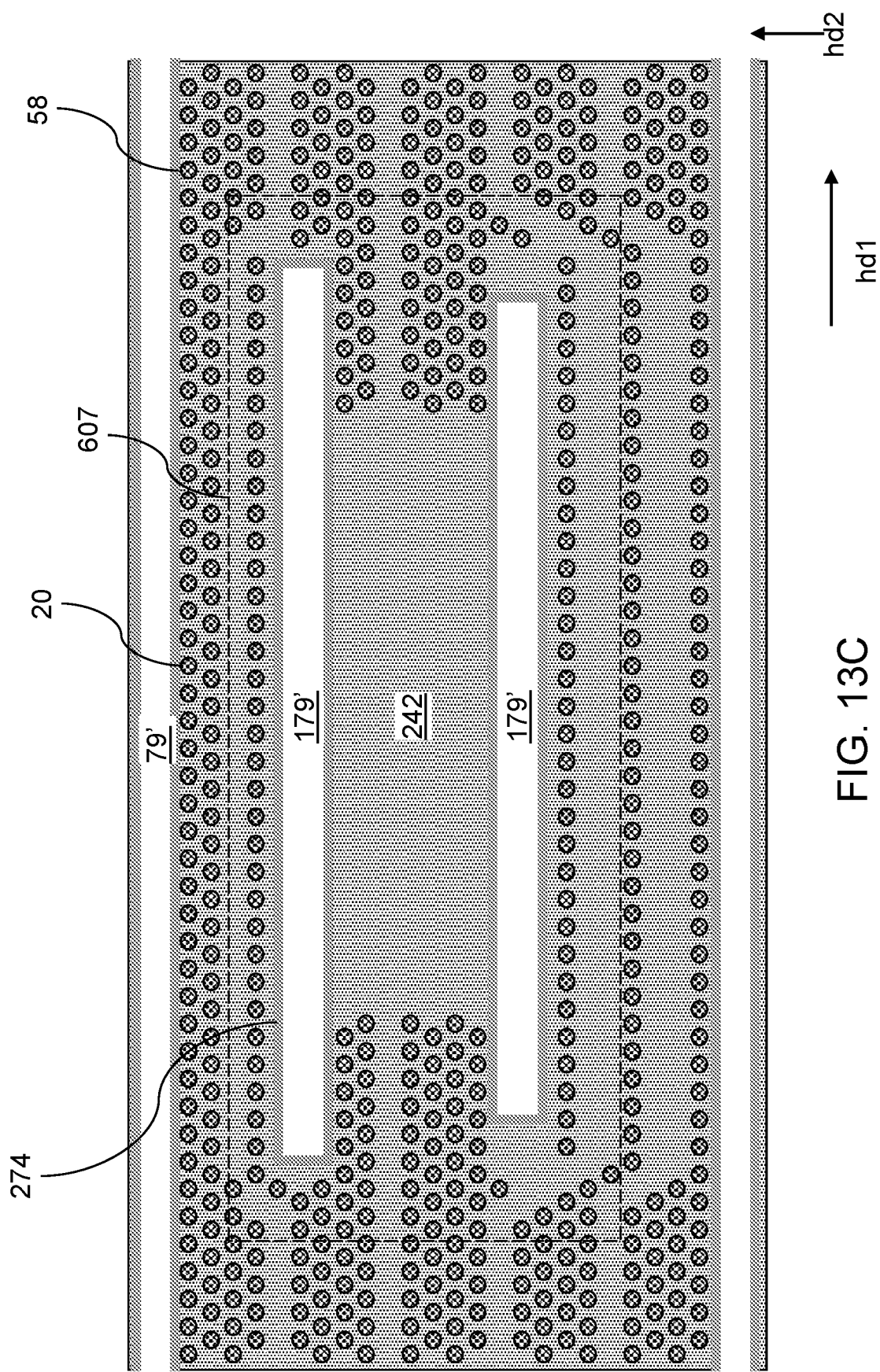
FIG. 13C is a horizontal cross-sectional view of a second alternative configuration of the first exemplary structure along a horizontal plane that corresponds to the horizontal plane B-B' of FIG. 13A.
Figure 13D:
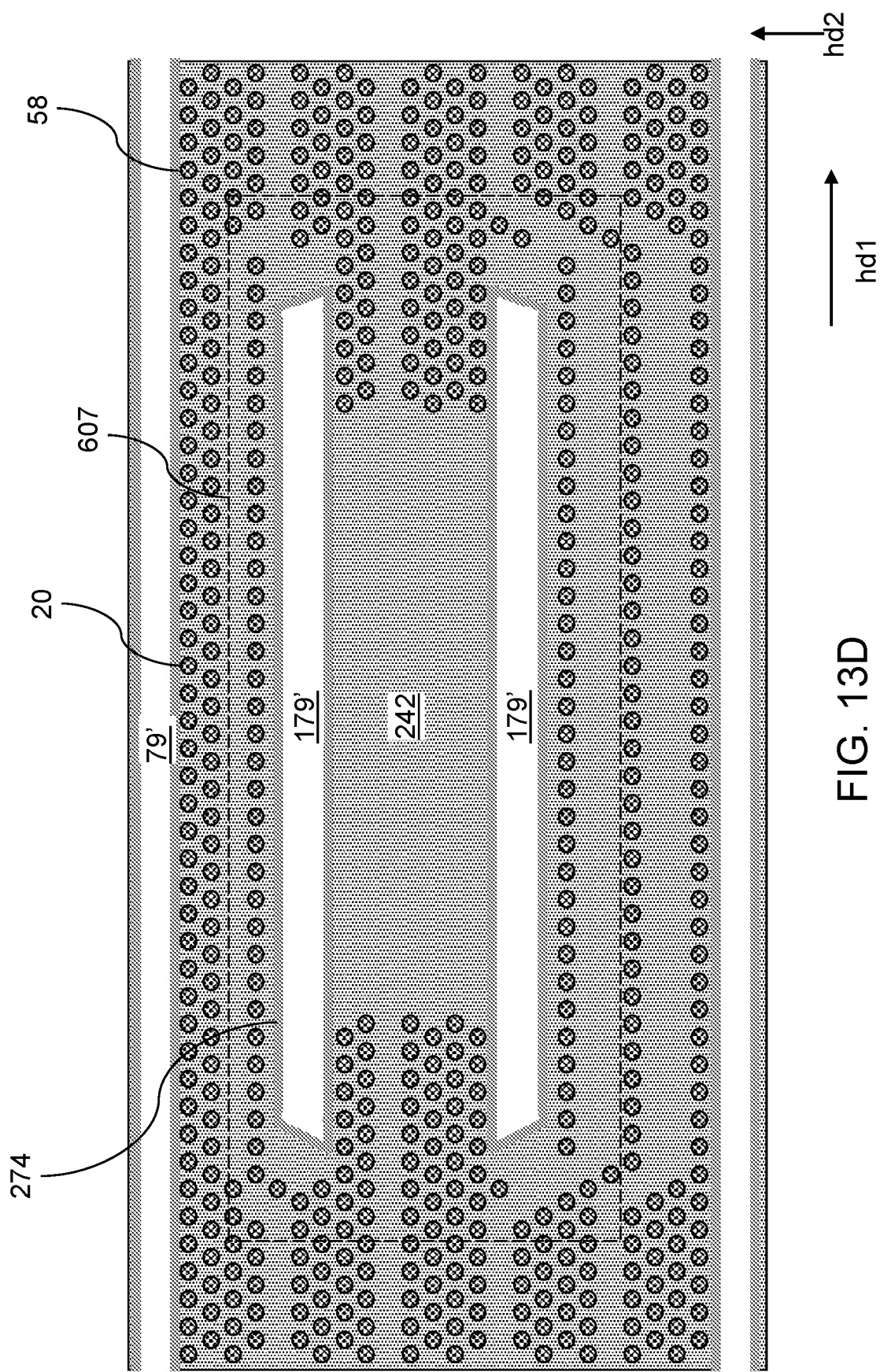
FIG. 13D is a horizontal cross-sectional view of a third alternative configuration of the first exemplary structure along a horizontal plane that corresponds to the horizontal plane B-B' of FIG. 13A.
Figure 13E:
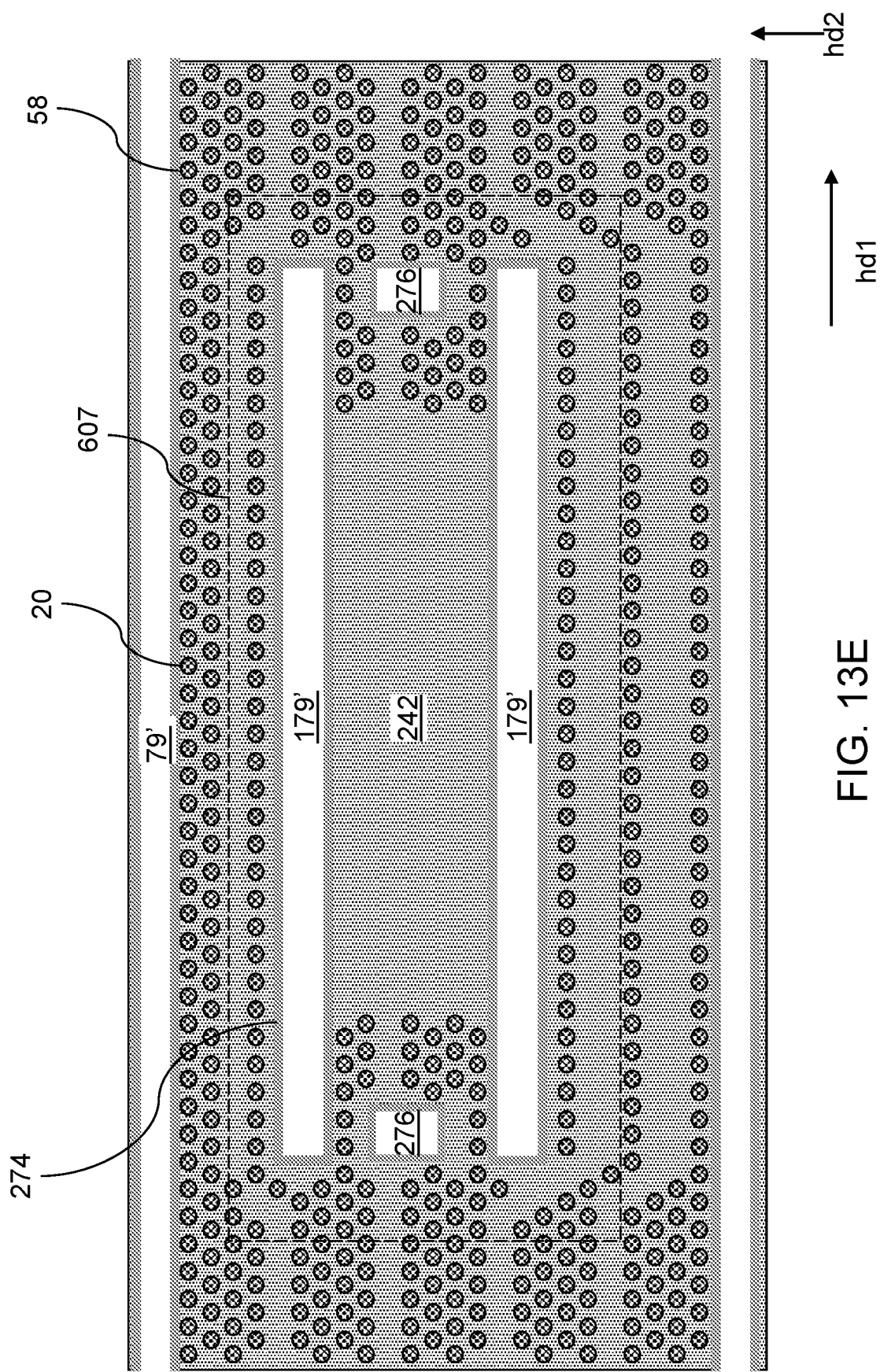
FIG. 13E is a horizontal cross-sectional view of a fourth alternative configuration of the first exemplary structure along a horizontal plane that corresponds to the horizontal plane B-B' of FIG. 13A.

Referring to FIGS. 12A and 12B, a dielectric liner 274 may be formed by a conformal deposition in the backside trenches 79, the barrier trenches 179, and the discrete via openings 279 and over the first contact level dielectric layer 280. The dielectric liner 274 may include a dielectric material that is different from the dielectric material of the sacrificial material layers (142, 242). For example, the dielectric liner 274 may include silicon oxide or a dielectric metal oxide (such as aluminum oxide). The thickness of the dielectric liner 274 may be in a range from 4 nm to 40 nm, although lesser and greater thicknesses may also be used.

Referring to FIGS. 13A-13E, a photoresist layer 607 may be applied over the first exemplary structure, and may be lithographically patterned to cover the barrier trenches 179 and the discrete via openings 279 (if present) without covering the backside trenches 79. A backside cavity 79' that is not filled within the photoresist layer 607 may be present within each backside trench 79.

Figure 14:
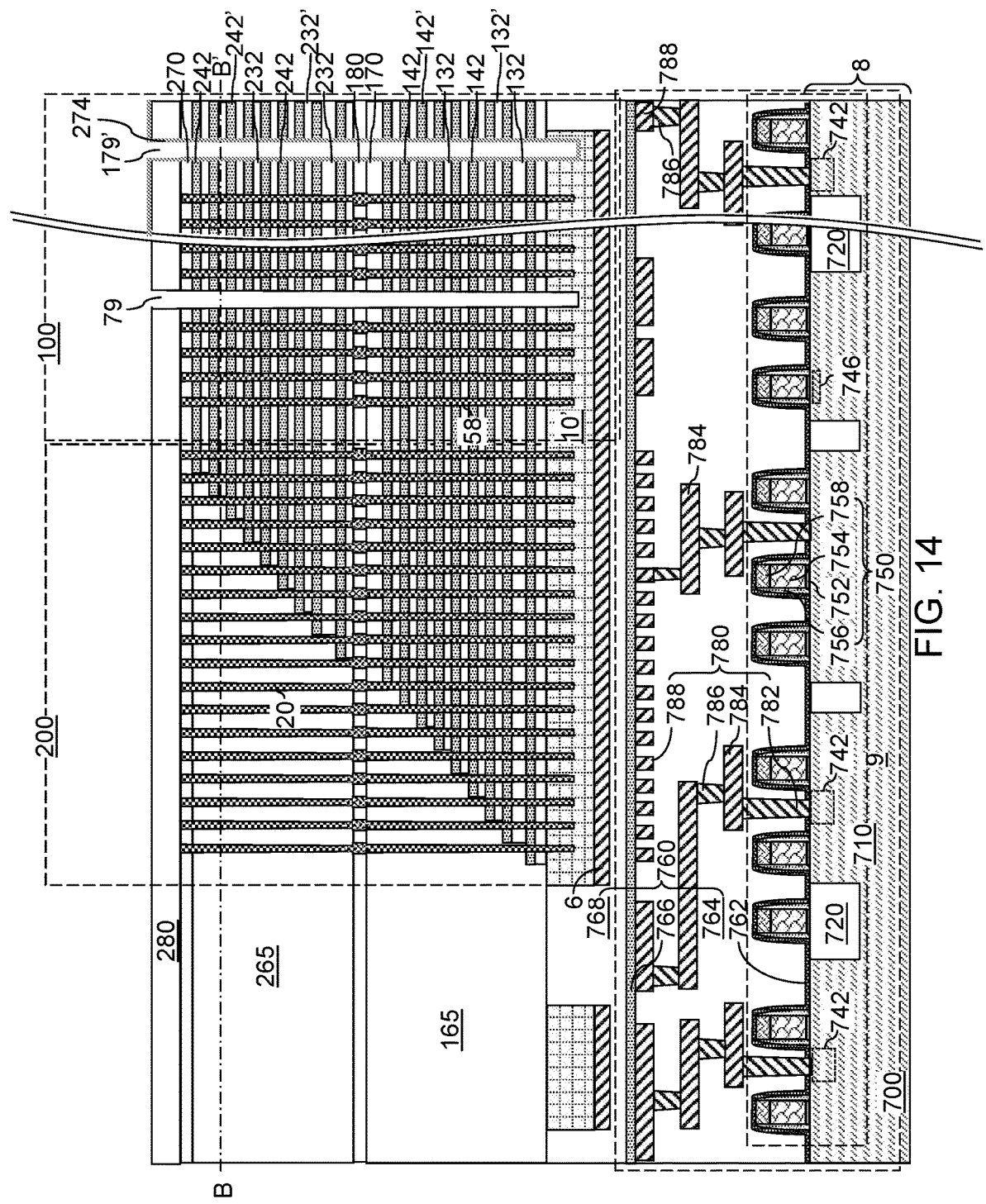
FIG. 14 is a vertical cross-sectional view of the first exemplary structure after patterning the dielectric liner and removal of the photoresist layer according to an embodiment of the present disclosure.
Figure 15A:
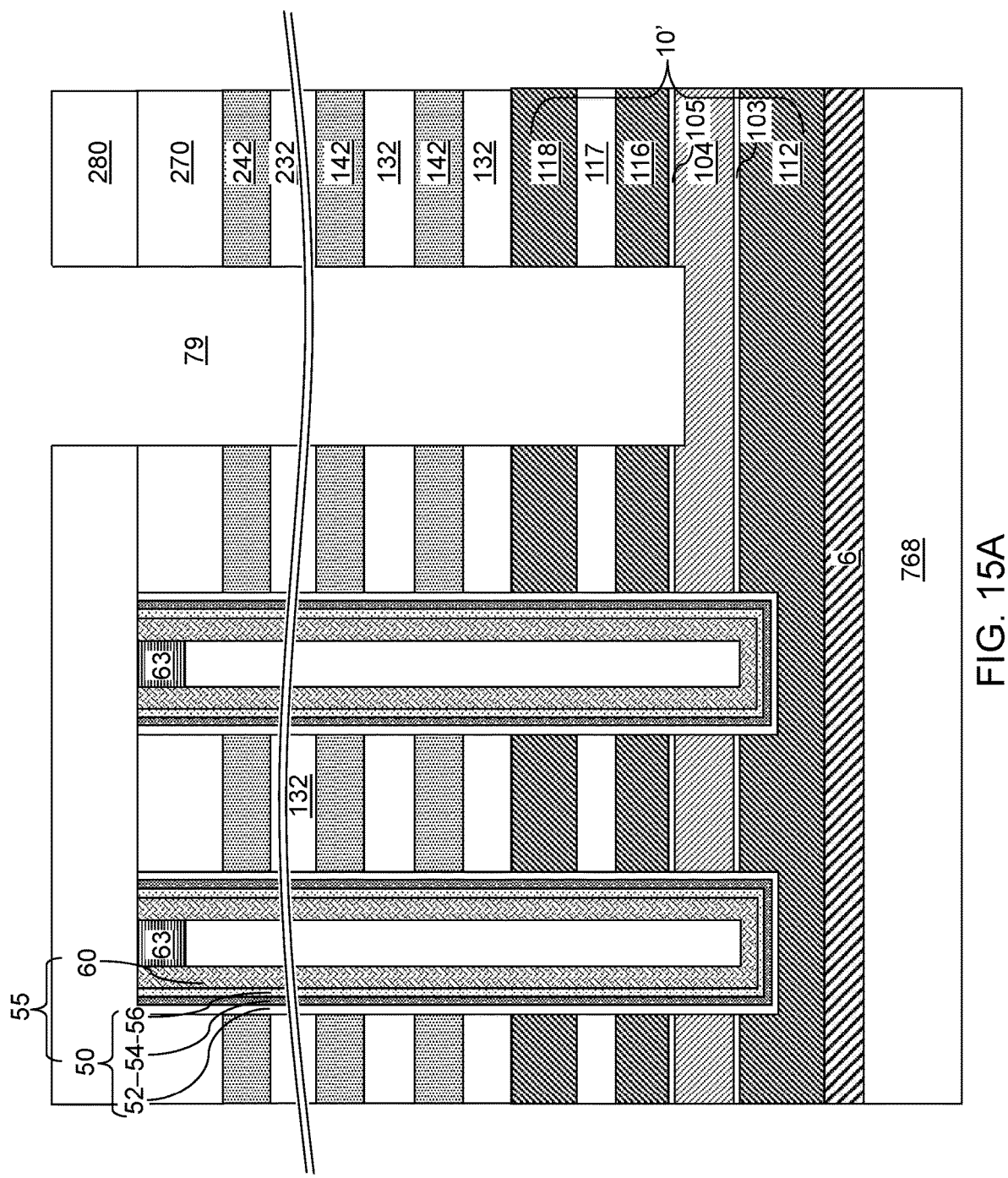
FIGS. 15A-15E illustrate sequential vertical cross-sectional views of memory opening fill structures and a backside trench during formation of source-level material layers according to an embodiment of the present disclosure.

Referring to FIGS. 14 and 15A, an isotropic etch process may be performed to remove portions of the dielectric liner 274 that are not masked by the photoresist layer 607. The dielectric liner 274 may be divided into multiple dielectric liners 274 located between a respective neighboring pair of backside trenches 79 and covering a subset of the barrier trenches 179 and the discrete via openings 279 between the respective neighboring pair of backside trenches 79. The photoresist layer 607 may be removed, for example, by ashing. A top surface of the source-level sacrificial layer 104 may be physically exposed at the bottom of each backside trench 79. Further, sidewalls of insulating layers (132, 232) and sacrificial material layers (142, 242) may be physically exposed around each backside trench 79.

Figure 15B:
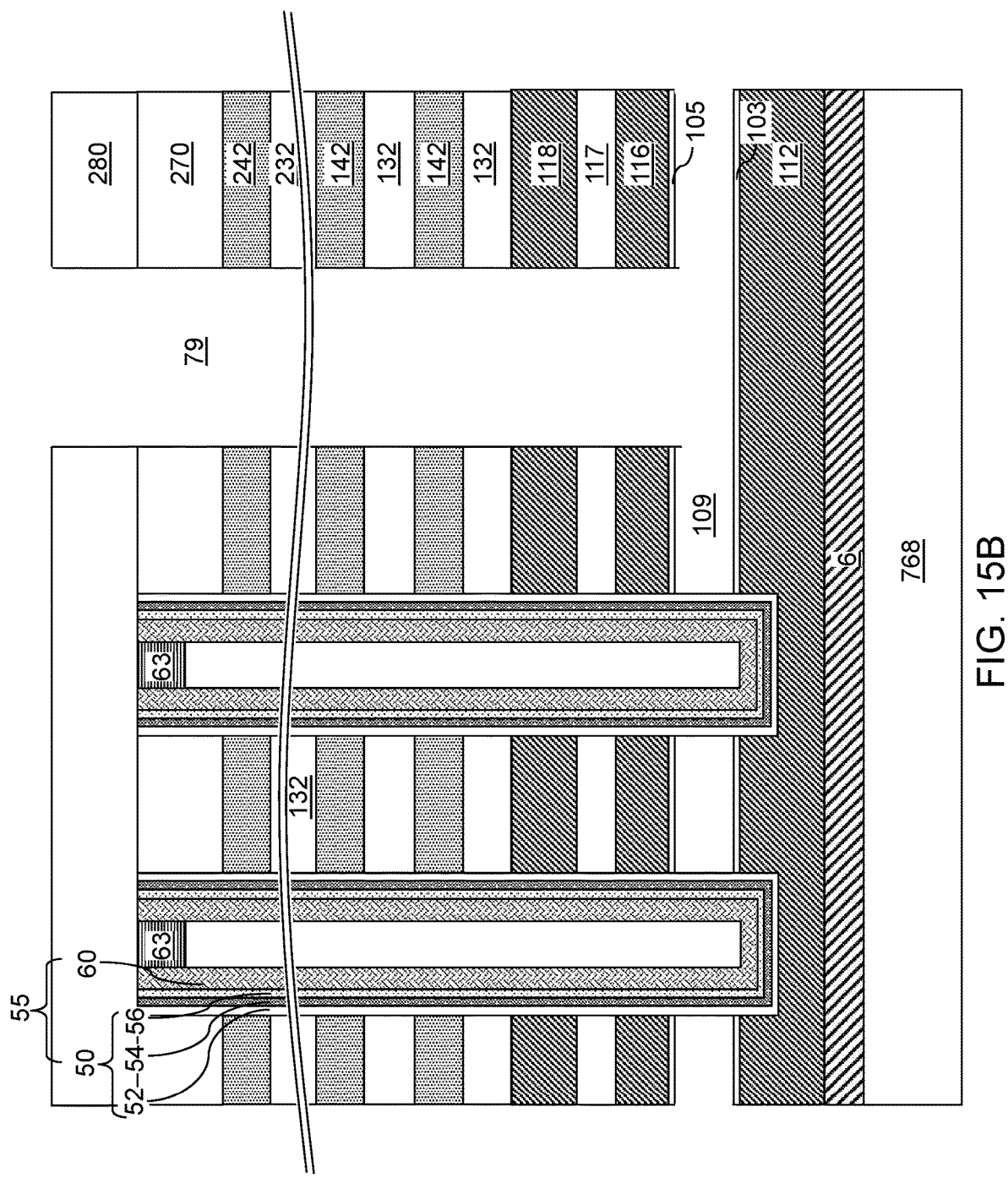

Referring to FIG. 15B, an etchant that etches the material of the source-level sacrificial layer 104 selective to the materials of the first-tier alternating stack (132, 142), the second-tier alternating stack (232, 242), the first and second insulating cap layers (170, 270), the first contact level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy and if the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the upper and lower sacrificial liners (105, 103).

A source cavity 109 may be formed in the volume from which the source-level sacrificial layer 104 is removed.

Wet etch chemicals such as hot TMY and TMAH are selective to the doped semiconductor materials of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, in embodiments in which sidewalls of the upper source-level semiconductor layer 116 are physically exposed or in other embodiments in which a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 may be physically exposed to the source cavity 109. Specifically, each of the memory opening fill structures 58 may include a sidewall and a bottom surface that are physically exposed to the source cavity 109.

Figure 15C:
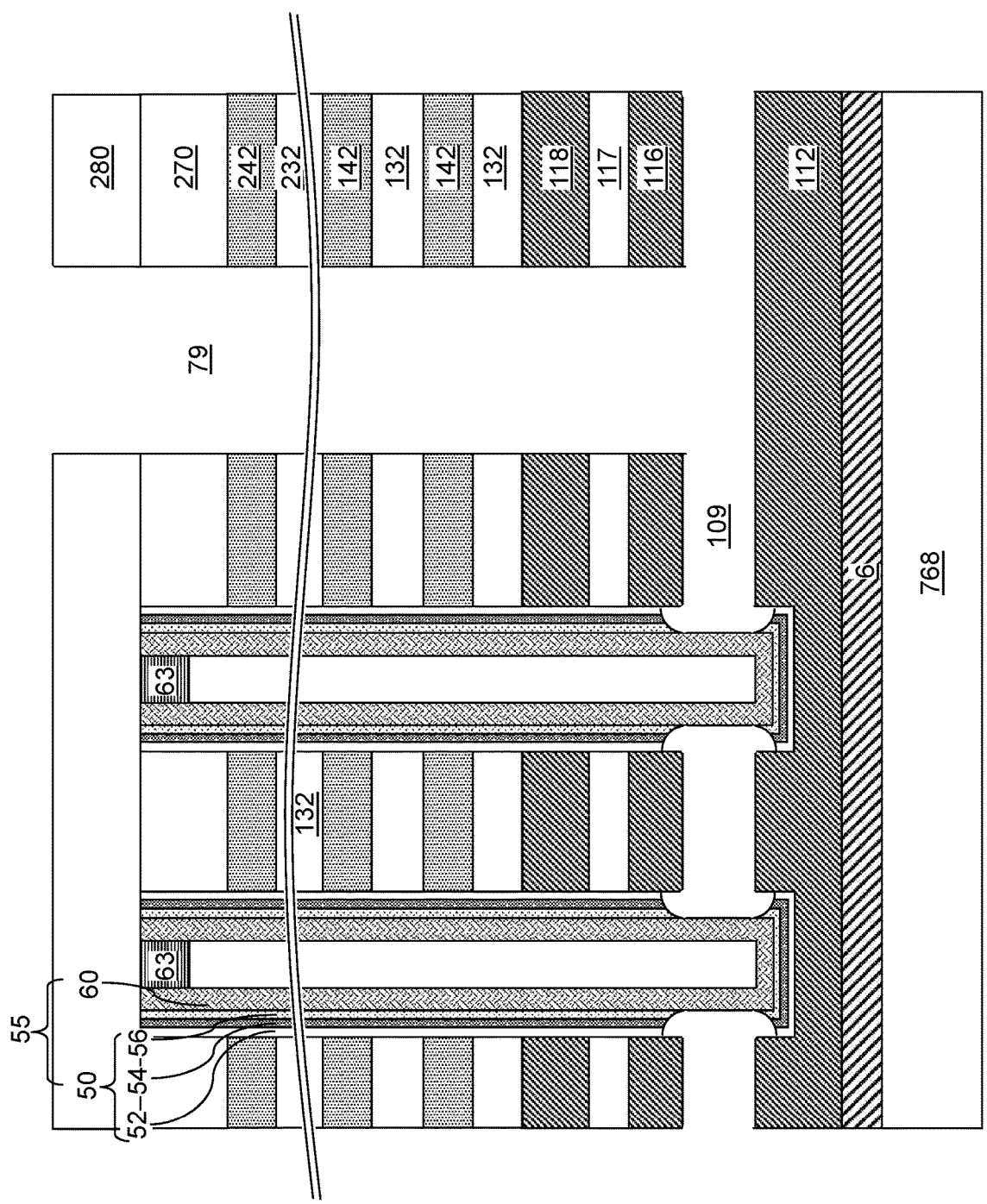

Referring to FIG. 15C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 may be formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 15D:
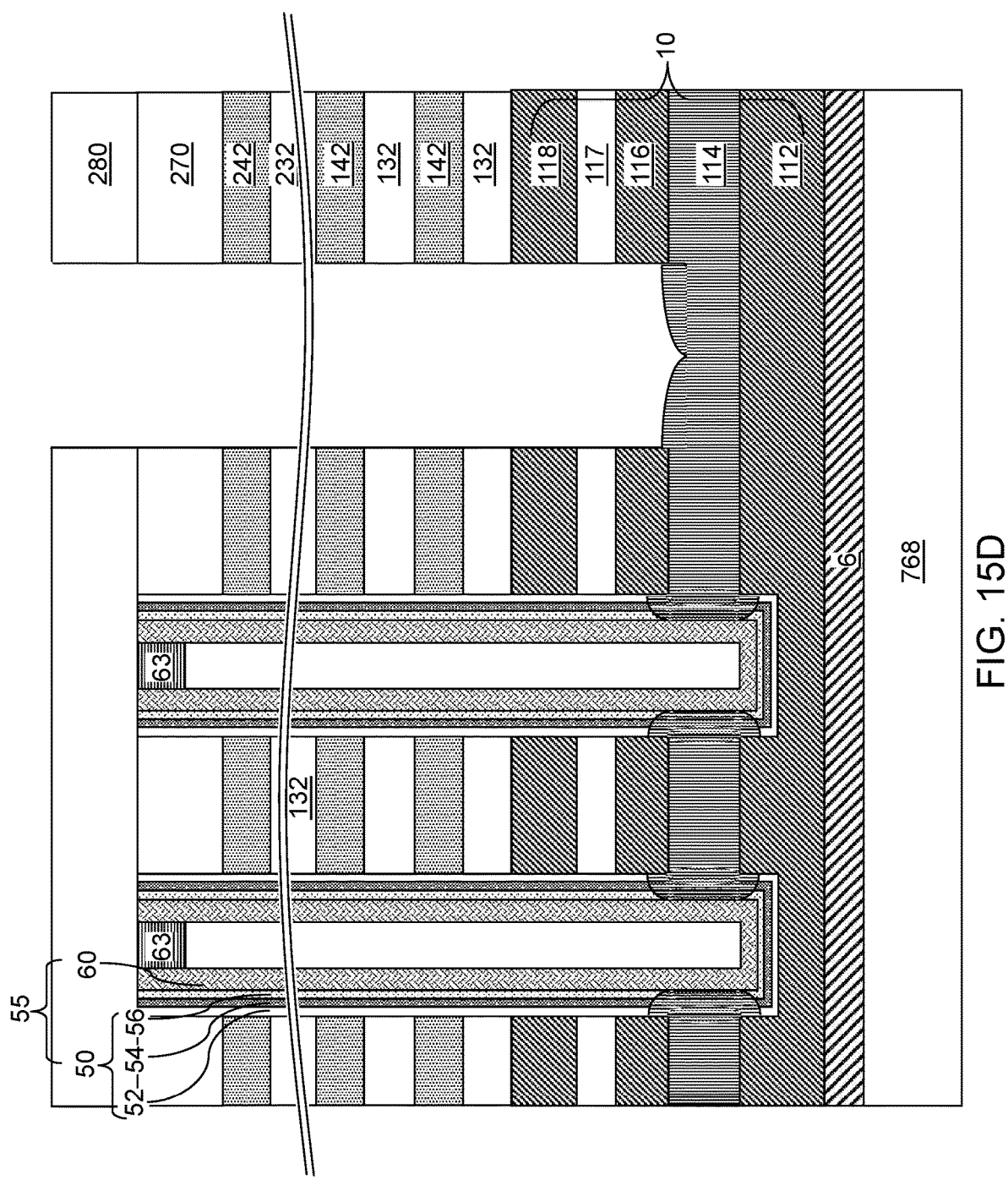

Referring to FIG. 15D, a doped semiconductor material having a doping of the second conductivity type may be deposited on the physically exposed semiconductor surfaces around the source cavity 109. The second conductivity type is the opposite of the first conductivity type, which is the conductivity type of the doping of the vertical semiconductor channels 60. The physically exposed semiconductor surfaces include bottom portions of outer sidewalls of the vertical semiconductor channels 60 and horizontal surfaces of the at least one source-level semiconductor layer (112, 116). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and an n-type dopant precursor gas may flow concurrently into a process chamber including the first exemplary structure during the selective semiconductor deposition process. For example, the semiconductor precursor gas may include silane, disilane, or dichlorosilane, the etchant gas may include gaseous hydrogen chloride, and the n-type dopant precursor gas such as phosphine, arsine, or stibine. In this case, the selective semiconductor deposition process grows an in-situ doped semiconductor material from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and the dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a source region (112, 114, 116). The source region (112, 114, 116) is electrically connected to a first end (such as a bottom end) of each of the vertical semiconductor channels 60. The set of layers including the source region (112, 114, 116), the source-level insulating layer 117, and the source-select-level conductive layer 118 constitutes source-level material layers 10, which replaces the in-process source-level material layers 10'.

Figure 15E:
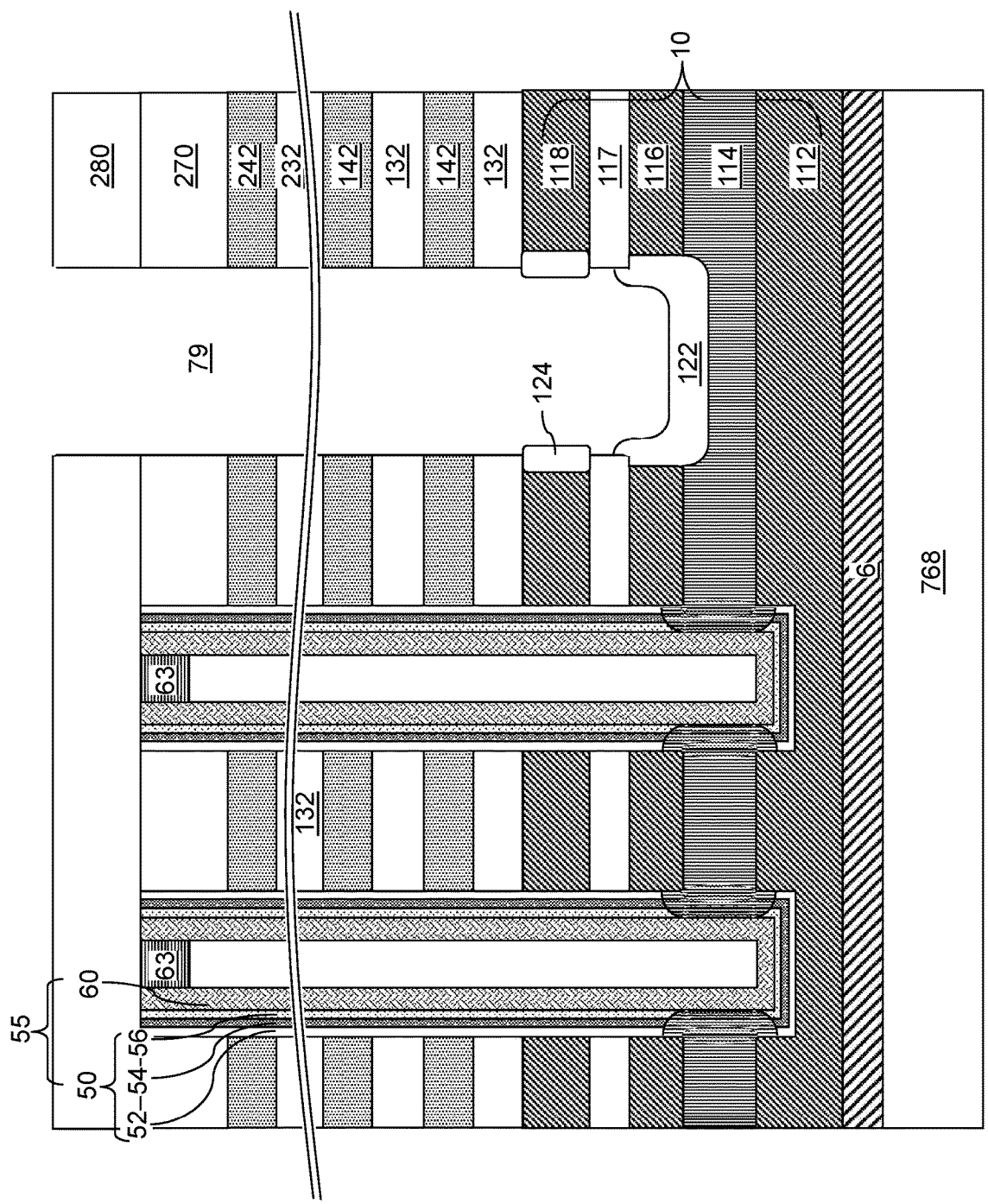
Figure 16:
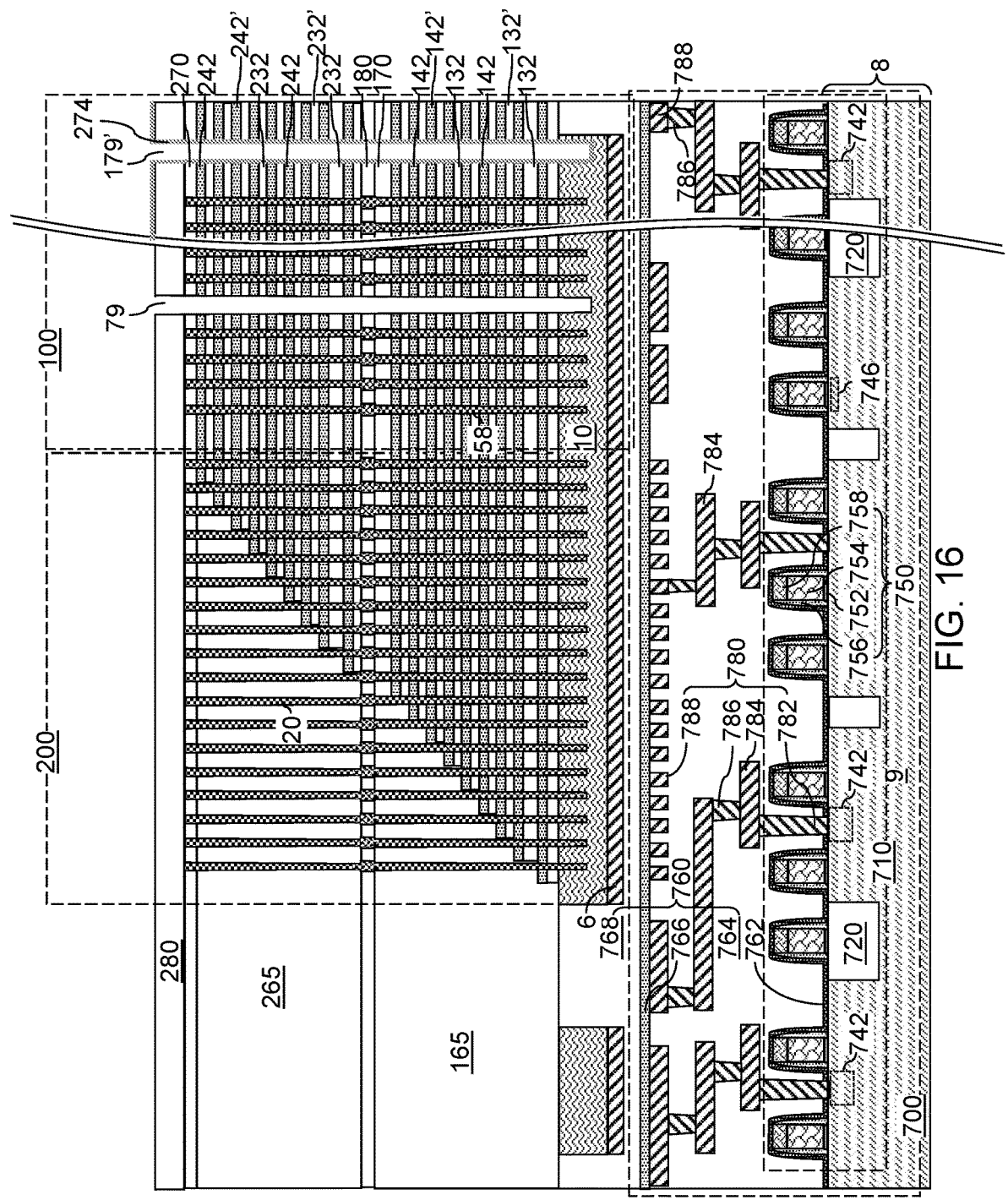
FIG. 16 is a vertical cross-sectional view of the first exemplary structure after formation of source-level material layers according to an embodiment of the present disclosure.
Figure 17A:
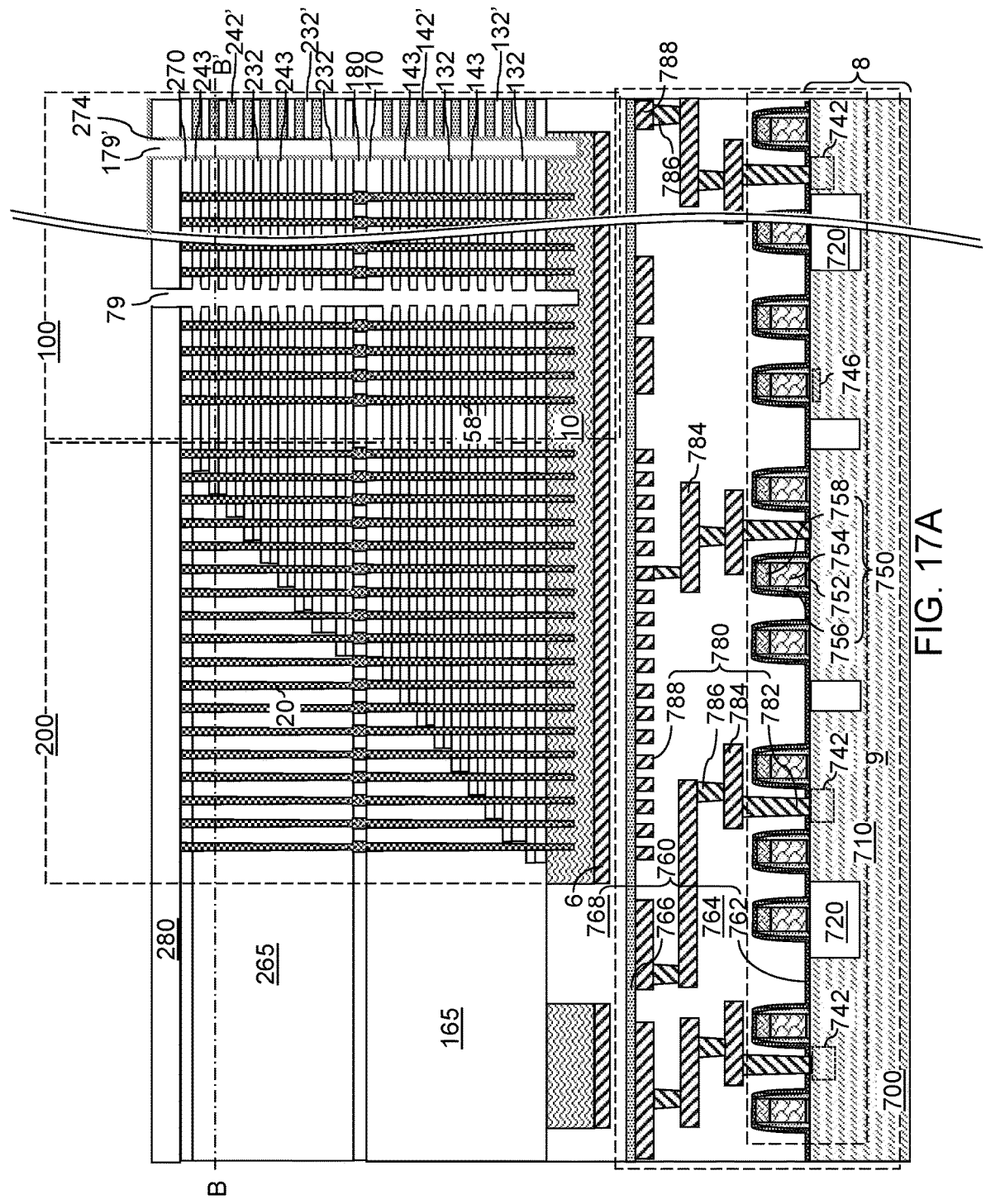
FIG. 17A is a vertical cross-sectional view of the first exemplary structure after formation of backside recesses according to an embodiment of the present disclosure.
Figure 17B:
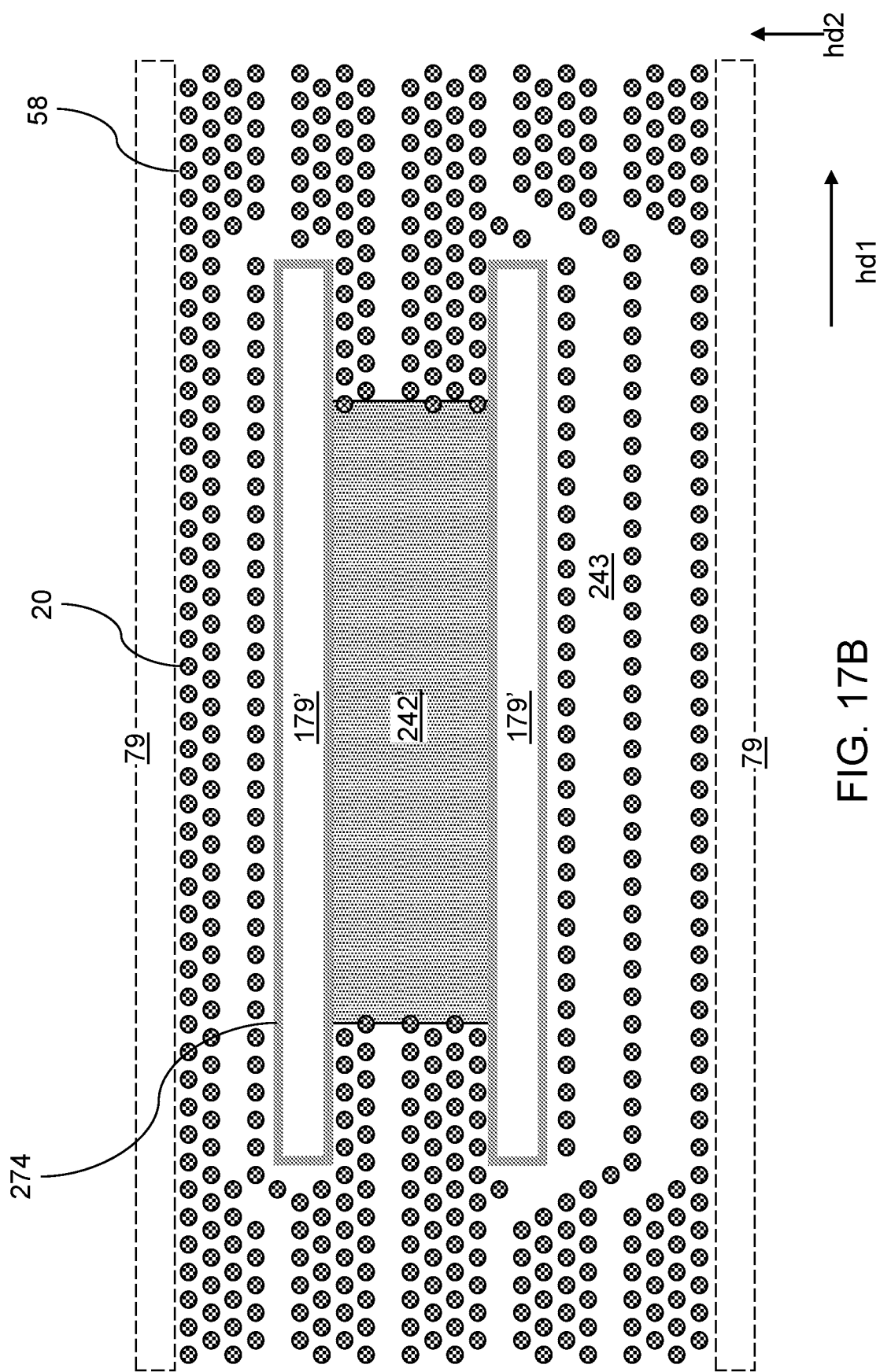
FIG. 17B is a horizontal cross-sectional view of a first alternative configuration of the first exemplary structure along a horizontal plane that corresponds to the horizontal plane B-B' of FIG. 17A.
Figure 17C:
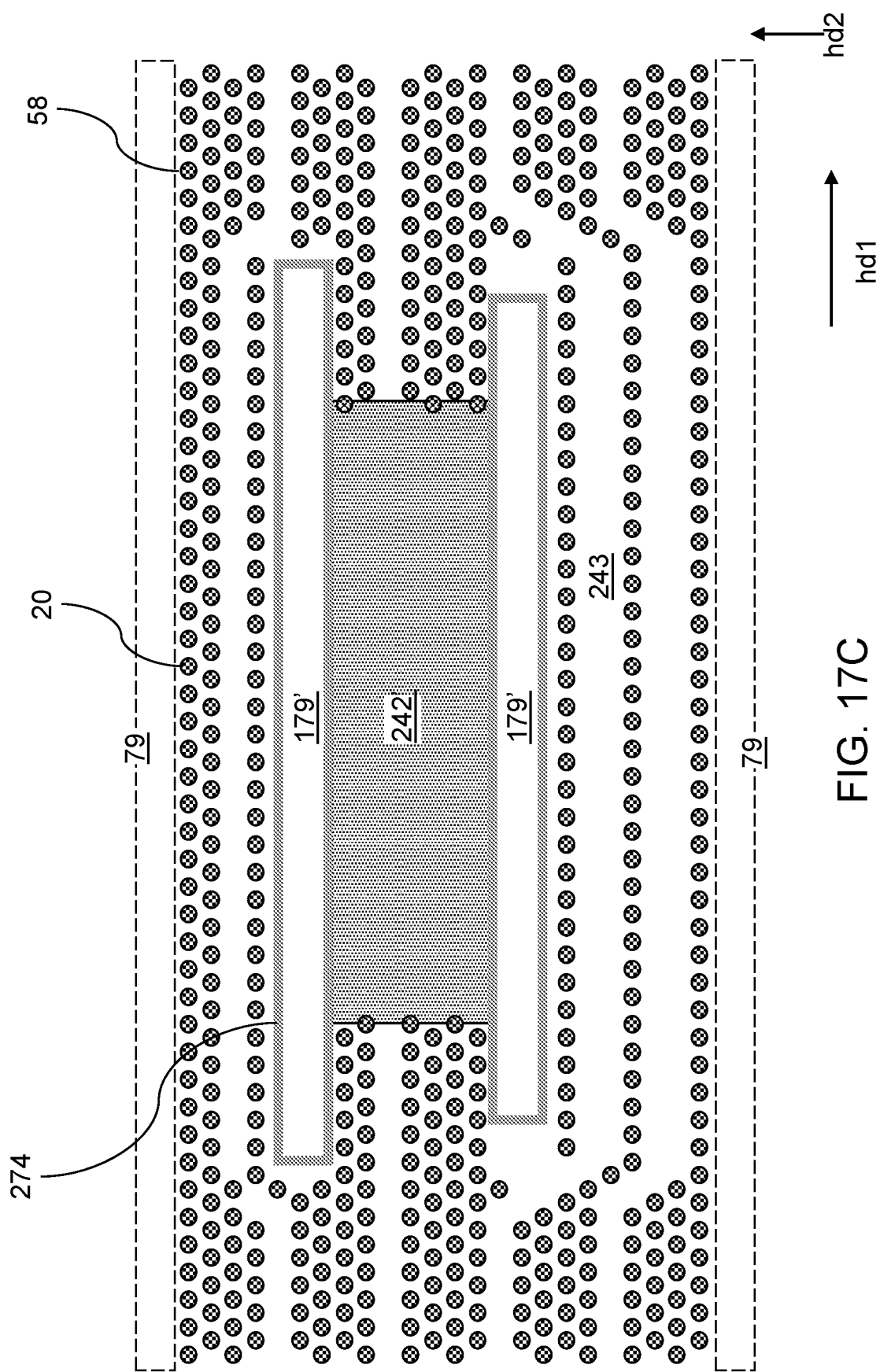
FIG. 17C is a horizontal cross-sectional view of a second alternative configuration of the first exemplary structure along a horizontal plane that corresponds to the horizontal plane B-B' of FIG. 17A.
Figure 17D:
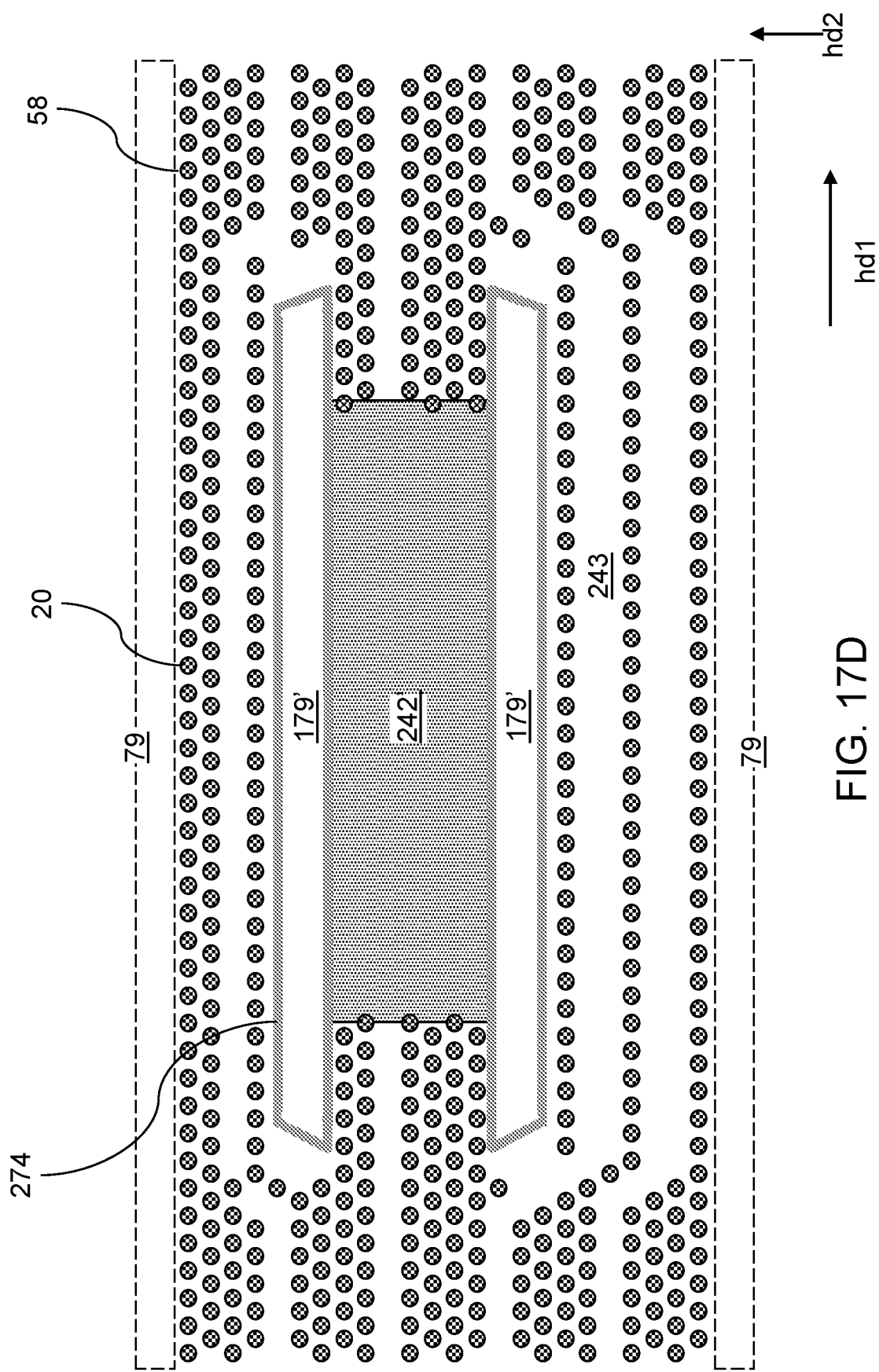
FIG. 17D is a horizontal cross-sectional view of a third alternative configuration of the first exemplary structure along a horizontal plane that corresponds to the horizontal plane B-B' of FIG. 17A.
Figure 17E:
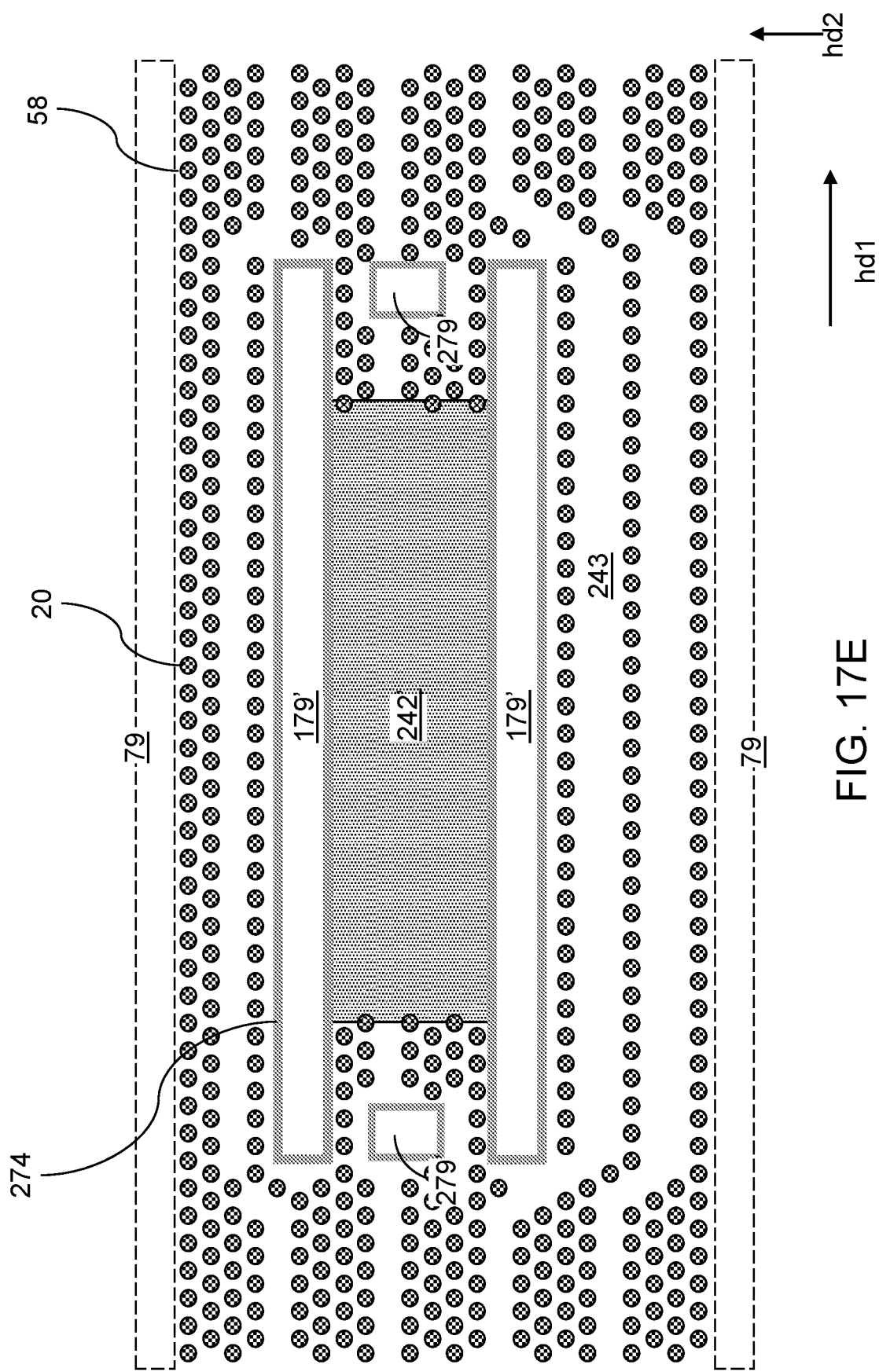
FIG. 17E is a horizontal cross-sectional view of a fourth alternative configuration of the first exemplary structure along a horizontal plane that corresponds to the horizontal plane B-B' of FIG. 17A.

Referring to FIGS. 15E and 16, an oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124. A dielectric liner 274 and a barrier cavity 179' may be present within each barrier trench 179. A dielectric liner 274 and a discrete via cavity may be present within each discrete via opening 279.

Referring to FIGS. 17A-17E, portions of the sacrificial material layers (142, 242) that are proximal to the backside trenches 79 are may be removed selective to the insulating layers (132, 232), the first and second insulating cap layers (170, 270), the first contact level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art. The duration of the isotropic etch process may be selected such that portions of the sacrificial material layers 42 outside areas between neighboring pairs of backside trenches 179 are removed. Further, portions of the sacrificial material layers 42 located near end regions of the backside trenches 179 may be removed.

Backside recesses (143, 243) may be formed in volumes from which the sacrificial material layers (142, 242) are removed. The backside recesses (143, 243) include first backside recesses 143 that may be formed in volumes from which the first sacrificial material layers 142 are removed and second backside recesses 243 that may be formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

The barrier trenches 179 may be covered by a respective dielectric liner 274 that blocks access of the isotropic etchant to adjacent portions of the sacrificial material layers 142, 242 during the isotropic etch process. Remaining portions of the sacrificial material layers 142, 242 between each neighboring pair of barrier trenches 179 constitute dielectric spacer plates (142', 242'). Portions of the insulating layers (132, 232) located within the areas of the dielectric spacer plates (142', 242') constitute insulating plates (132', 232'). The dielectric spacer plates (142', 232') may include first dielectric spacer plates 142' adjoining a respective one of the first backside recesses 143, and second dielectric spacer plates 242' adjoining a respective one of the second backside recesses 243. The insulating plates (132', 232') may include first insulating plates 132' that are portions of the first insulating layers 132 and second insulating plates 232' that are portions of the second insulating layers 232. Thus, the first insulating layers 132 and the second insulating layers 232 within each alternating stack {(132, 232), (142, 242)} continuously extend between vertically neighboring pairs of dielectric spacer plates (142', 242'). A vertically alternating sequence of the insulating plates (132', 232') and the dielectric spacer plates (142', 242') is provided between each neighboring pair of barrier trenches 179. A dielectric liner 274 and a barrier cavity 179' is present within each barrier trench 179. A dielectric liner 274 and a discrete via cavity 279' is present within each discrete via opening 279.

Figure 18:
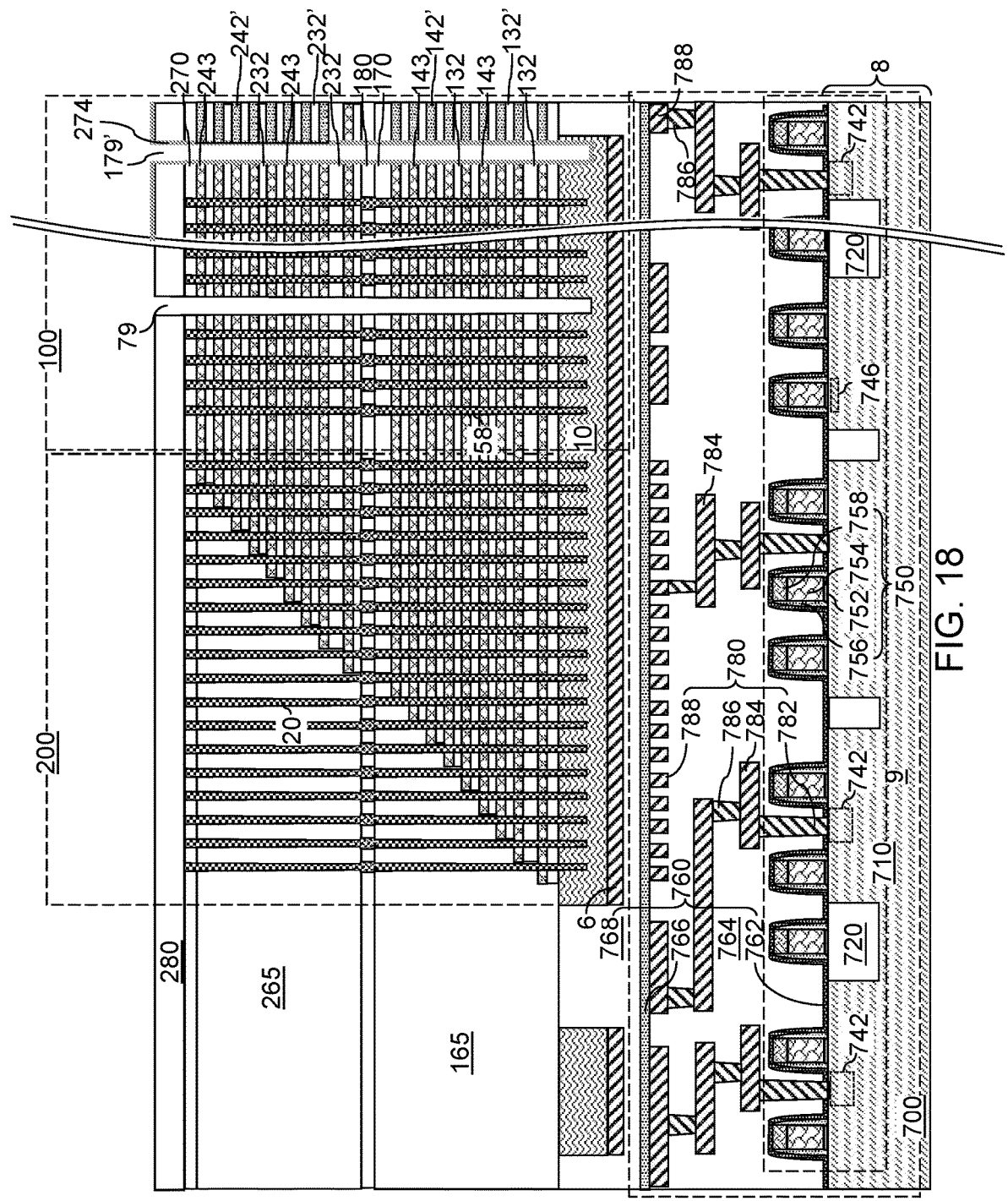
FIG. 18 is a vertical cross-sectional view of the first exemplary structure after formation of electrically conductive layers according to an embodiment of the present disclosure.

Referring to FIG. 18, a backside blocking dielectric layer (not shown) may be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79.

Each combination of an electrically conductive layer (146, 246) and a dielectric space plate (142', 242') located at the same level constitutes a composite layer {(146, 142'), (246, 242'). Each of the composite layers {(146, 142'), (246, 242') comprises a respective electrically conductive layer (146 or 246) and a respective dielectric spacer plate (142', 242'). A vertically alternating sequence of the insulating plates (132', 232') and the dielectric spacer plates (142', 242') is provided within a region including the dielectric spacer plates (142', 242').

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIGS. 19A-19G, a photoresist layer may be applied over the first exemplary structure and lithographically patterned to form narrow openings that extend from one side ("Side 1") of each vertically alternating sequence of insulating layers (132, 232) and the dielectric spacer plates (142', 242') to another side ("Side 2") of each vertically alternating sequence. The pattern in the photoresist layer may be transferred through a subset of the electrically conductive layers (146, 246) that are located at the drain select levels to form drain-select-level trenches. Each second electrically conductive layer 246 located at the drain select levels are divided into multiple strips by the drain-select-level trenches. The photoresist layer may be removed, for example, by ashing.

A dielectric fill material may be conformally deposited in the backside trenches 79, the barrier cavities 179', the discrete via cavities 279', and the drain-select-level trenches. The dielectric fill material may include a conformal dielectric material and/or a reflowable dielectric material. For example, the dielectric fill material may include silicon oxide. Excess portions of the dielectric fill material overlying the first contact level dielectric layer 280 may be removed by a planarization process, which may include chemical mechanical planarization (CMP) and/or a recess etch.

Each remaining portion of the dielectric fill material that fills a backside trench 79 constitutes a dielectric backside trench fill structure 76, which laterally extends extending along the first horizontal direction hd1 and vertically extends through each layer within a neighboring pair of alternating stacks {(132, 146), (232, 246)} of insulating layers (132, 232) and electrically conductive layers (146, 246). Each remaining portion of the dielectric fill material that fills a barrier trench 179 constitutes a dielectric fill material portion 176, which laterally extends extending along the first horizontal direction hd1 and vertically extends through each layer within an alternating stack {(132, 146), (232, 246)} of insulating layers (132, 232) and electrically conductive layers (146, 246). Each set of a dielectric fill material portion 176 and a dielectric liner that fills a barrier trench constitutes a dielectric wall structure (274, 176). Each pair of dielectric wall structures (274, 176) has a greater lateral extent a pair of lengthwise sidewalls of dielectric spacer plates (142', 242') within an adjoining vertically alternating sequence of insulating layers (132, 232) and the dielectric spacer plates (142', 242').

Each remaining portion of the dielectric fill material that fills a discrete via cavity 279' constitutes a dielectric pillar structure 276, which vertically extends through each layer within an alternating stack {(132, 146), (232, 246)} of insulating layers (132, 232) and electrically conductive layers (146, 246). Each remaining portion of the dielectric fill material that fills the drain-select-level trenches constitutes a drain-select-level isolation structure 72. The drain-select-level isolation structures 72 vertically extend through a subset of layers within the alternating stack of insulating layers (132, 232) and composite layers (146, 142', 246, 242'). The subset of layers that the drain-select-level isolation structures 72 extend through includes a topmost one of the composite layers (146, 142', 246, 242').

The drain-select-level isolation structures 72 divide each second electrically conductive layer 246 at the drain select levels into multiple electrically conductive strips that are electrically isolated from one another. Thus, the drain-select-level isolation structures 72 divide an electrically conductive layer 246 within the topmost one of the composite layers (146, 142', 246, 242') into multiple electrically conductive strips that are electrically isolated from one another. In one embodiment, each of the multiple electrically conductive strips of the second electrically conductive layer(s) 246 at the drain select level(s) laterally extends continuously from a first side ("Side 1") of the vertically alternating sequence of insulating layers (132, 232) and dielectric spacer plates (142', 242'), between a respective backside trench 179 and a respective one of the dielectric wall structures (274, 176), and to a second side ("Side 2") of the vertically alternating sequence that is laterally spaced from the first side along the first horizontal direction hd1. The drain-select-level trenches generally extend along the first horizontal direction hd1 with a contour or lateral shift around the dielectric wall structures (274, 176) and the vertically alternating sequence of insulating layers (132, 232) and the dielectric spacer plates (142', 242').

Figure 19A:
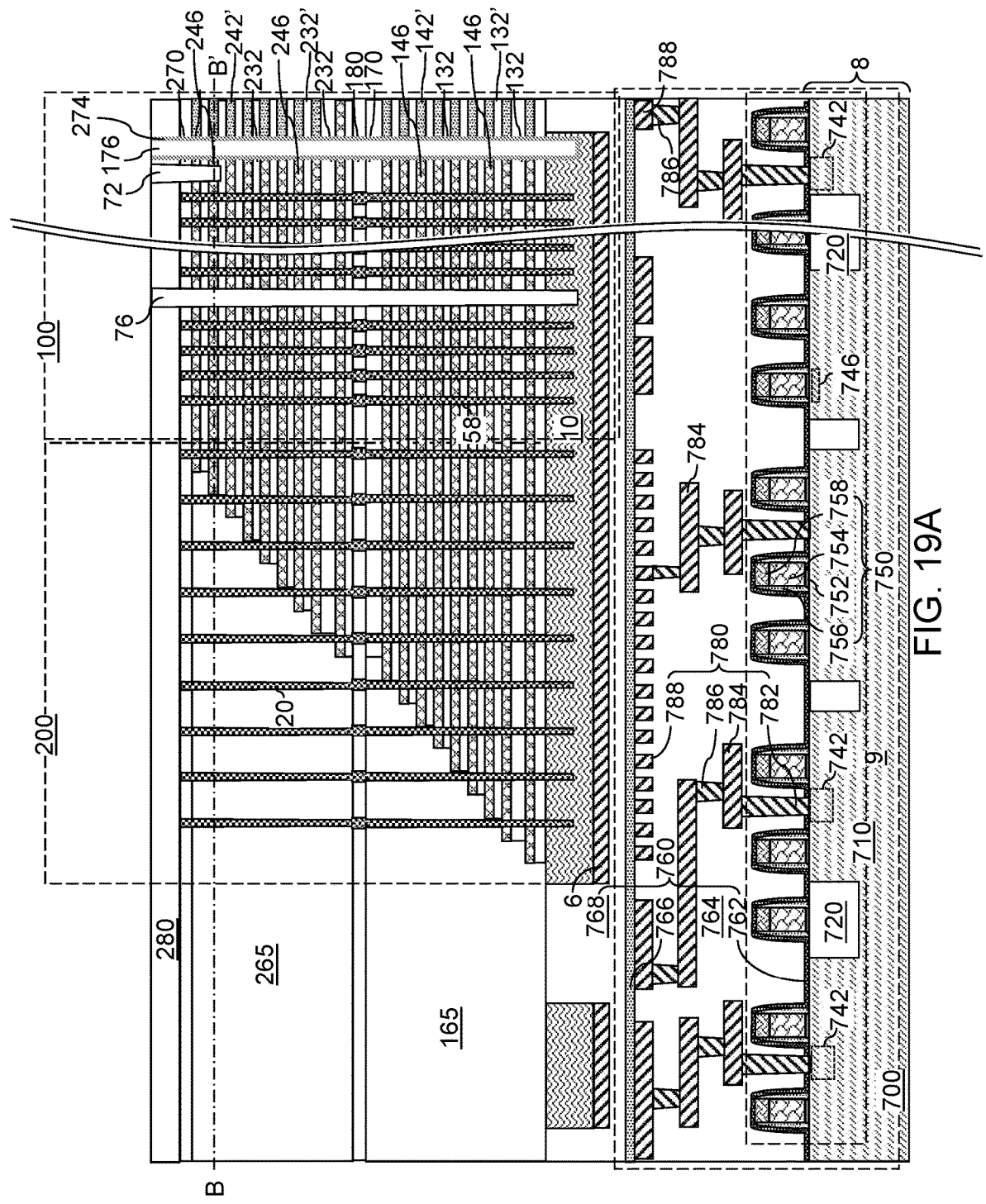
FIG. 19A is a vertical cross-sectional view of the first exemplary structure after formation of dielectric backside trench fill structures and dielectric wall structures according to an embodiment of the present disclosure.
Figure 19C:
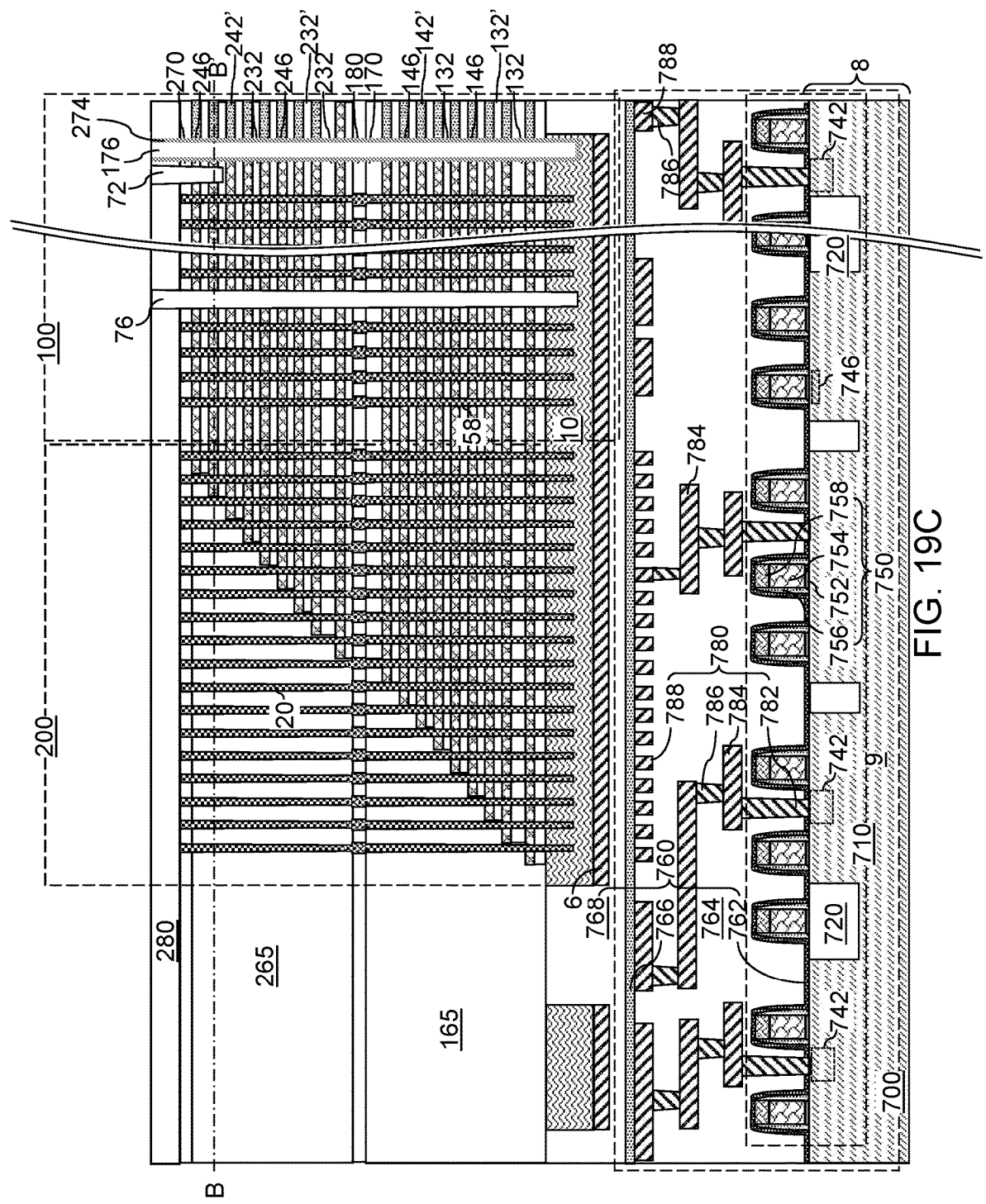
FIG. 19C is a vertical cross-sectional view of the first exemplary structure along the vertical plane C-C' of FIG. 19B.
Figure 19D:
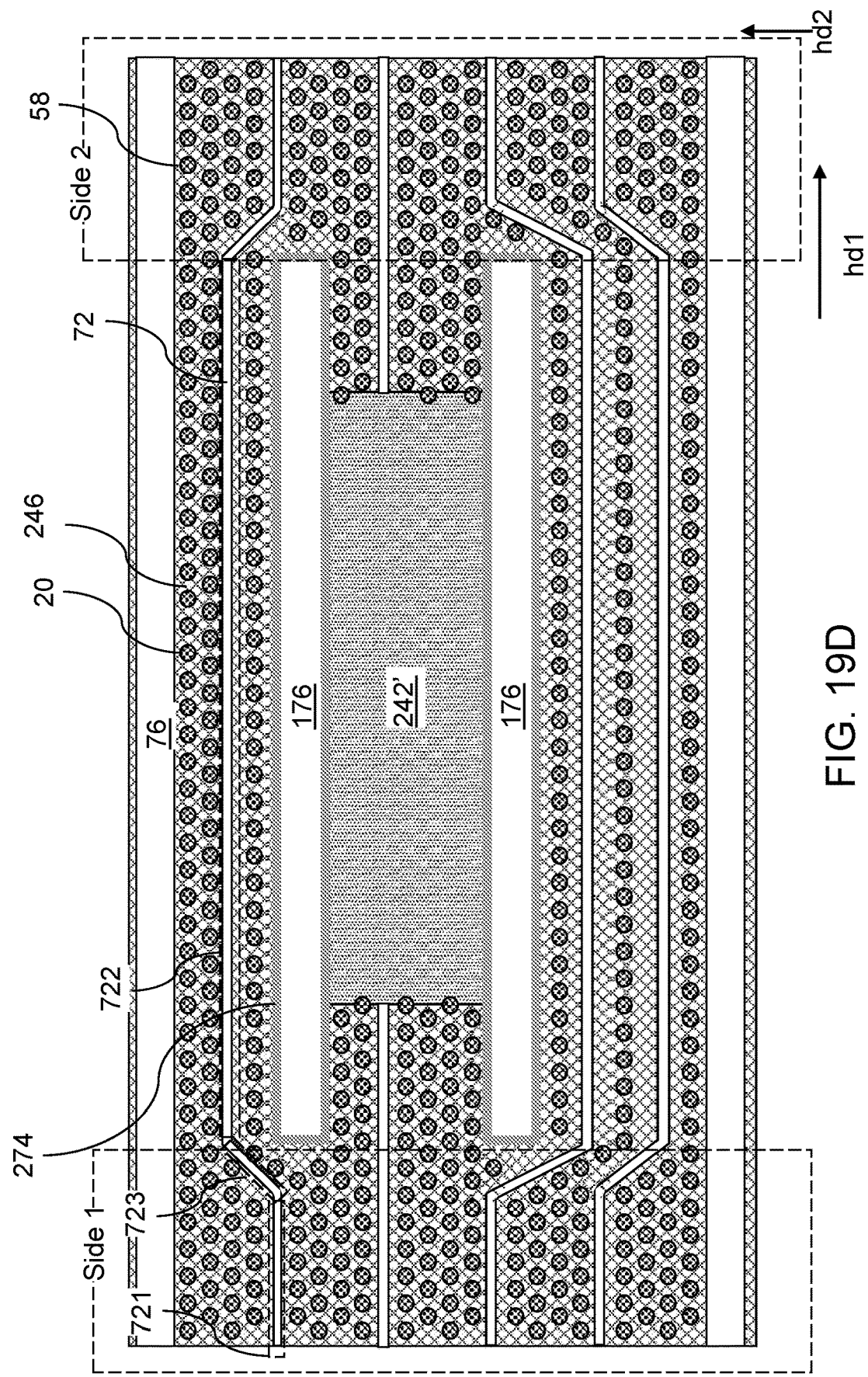
FIG. 19D is a horizontal cross-sectional view of a first alternative configuration of the first exemplary structure along a horizontal plane that corresponds to the horizontal plane B-B' of FIG. 19A.
Figure 19E:
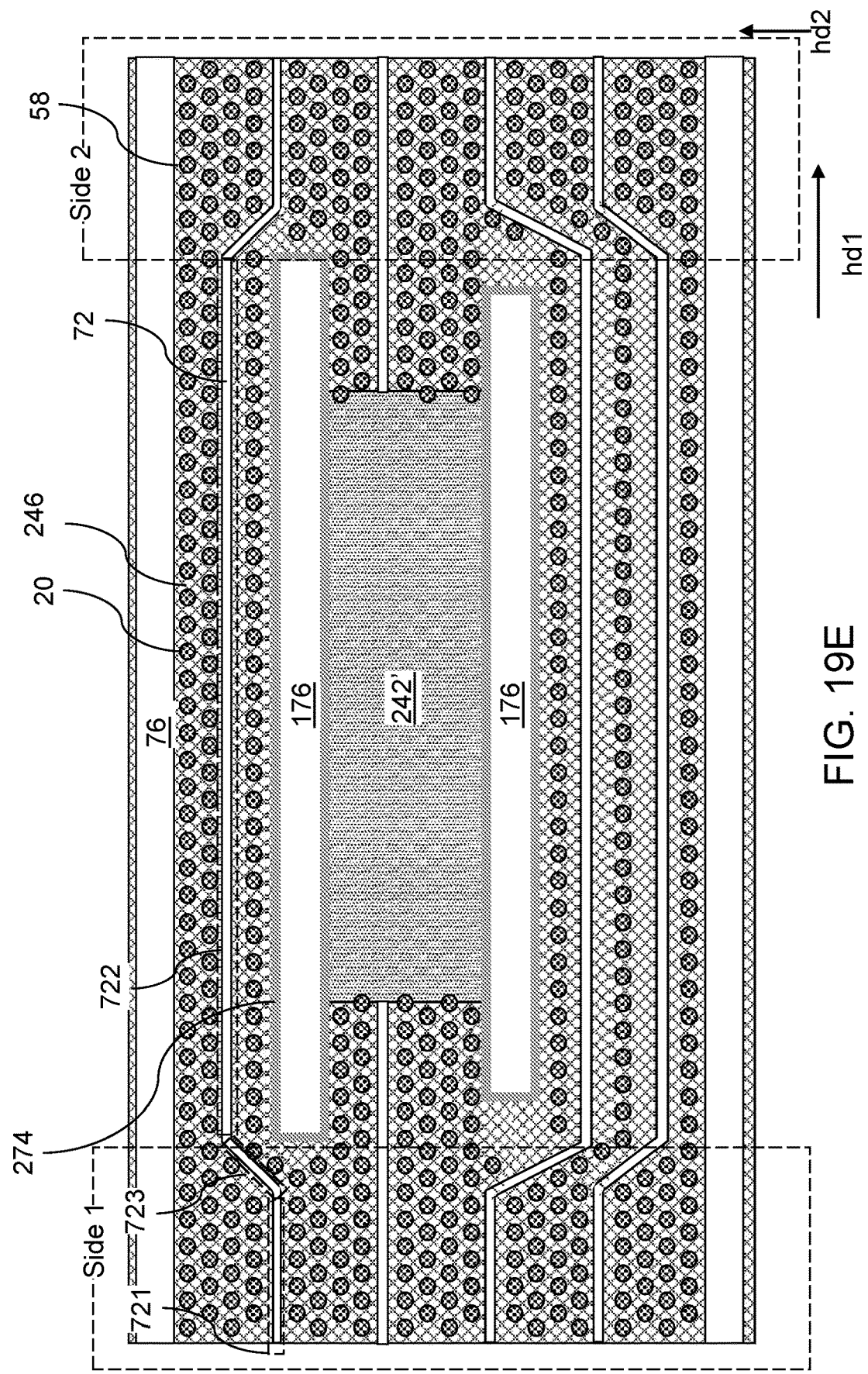
FIG. 19E is a horizontal cross-sectional view of a second alternative configuration of the first exemplary structure along a horizontal plane that corresponds to the horizontal plane B-B' of FIG. 19A.
Figure 19F:
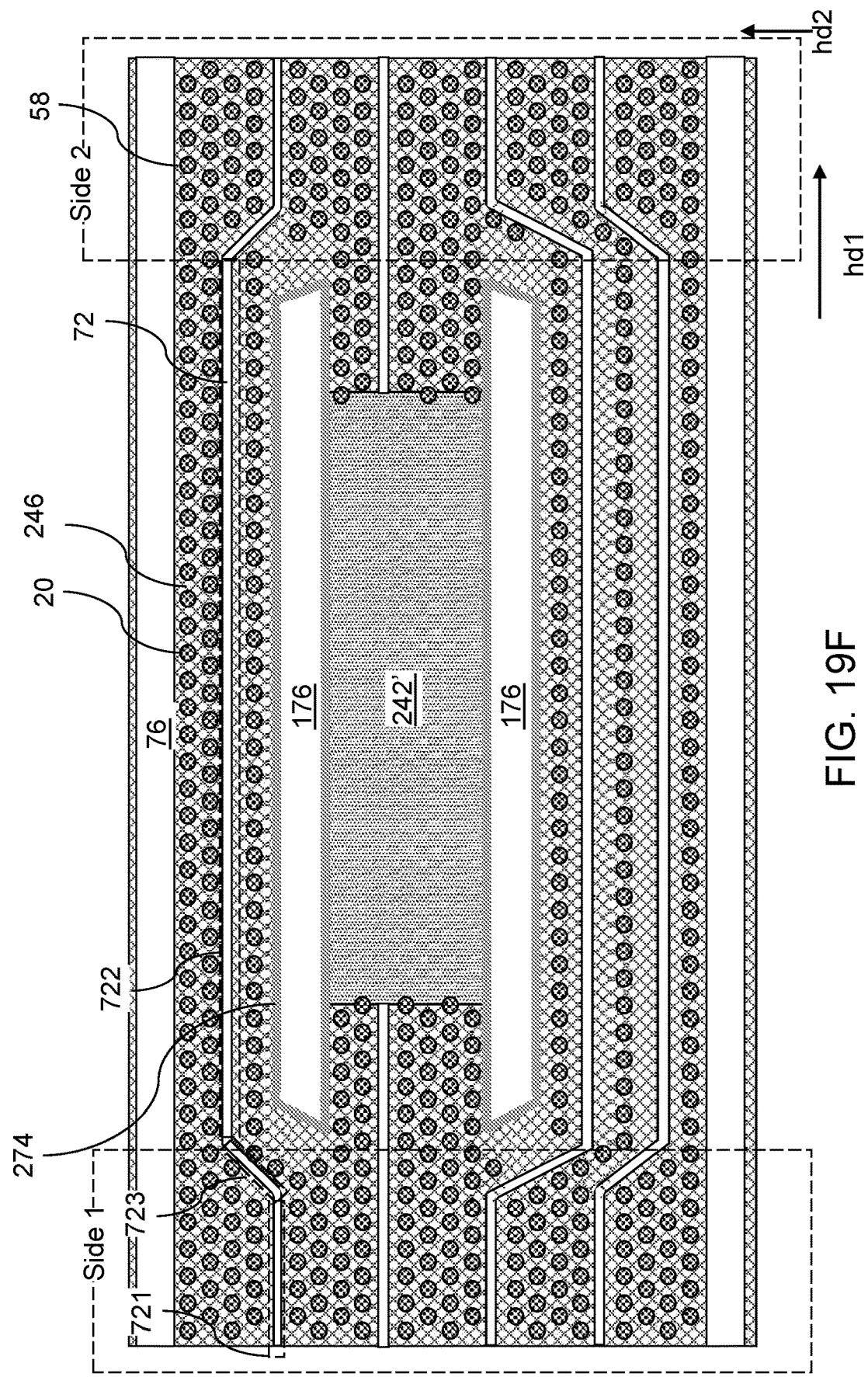
FIG. 19F is a horizontal cross-sectional view of a third alternative configuration of the first exemplary structure along a horizontal plane that corresponds to the horizontal plane B-B' of FIG. 19A.
Figure 19G:
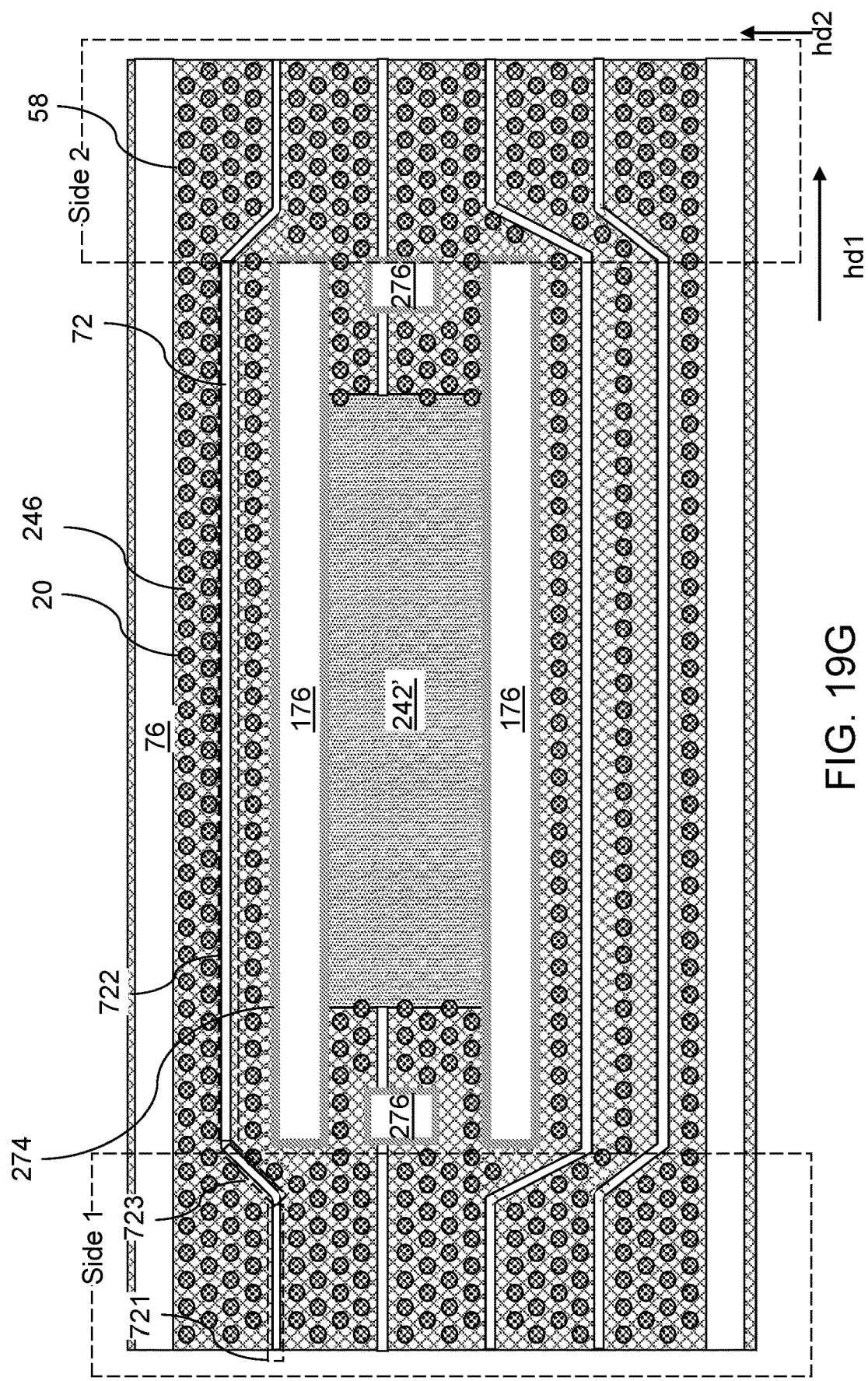
FIG. 19G is a horizontal cross-sectional view of a fourth alternative configuration of the first exemplary structure along a horizontal plane that corresponds to the horizontal plane B-B' of FIG. 19A.
Figure 20A:
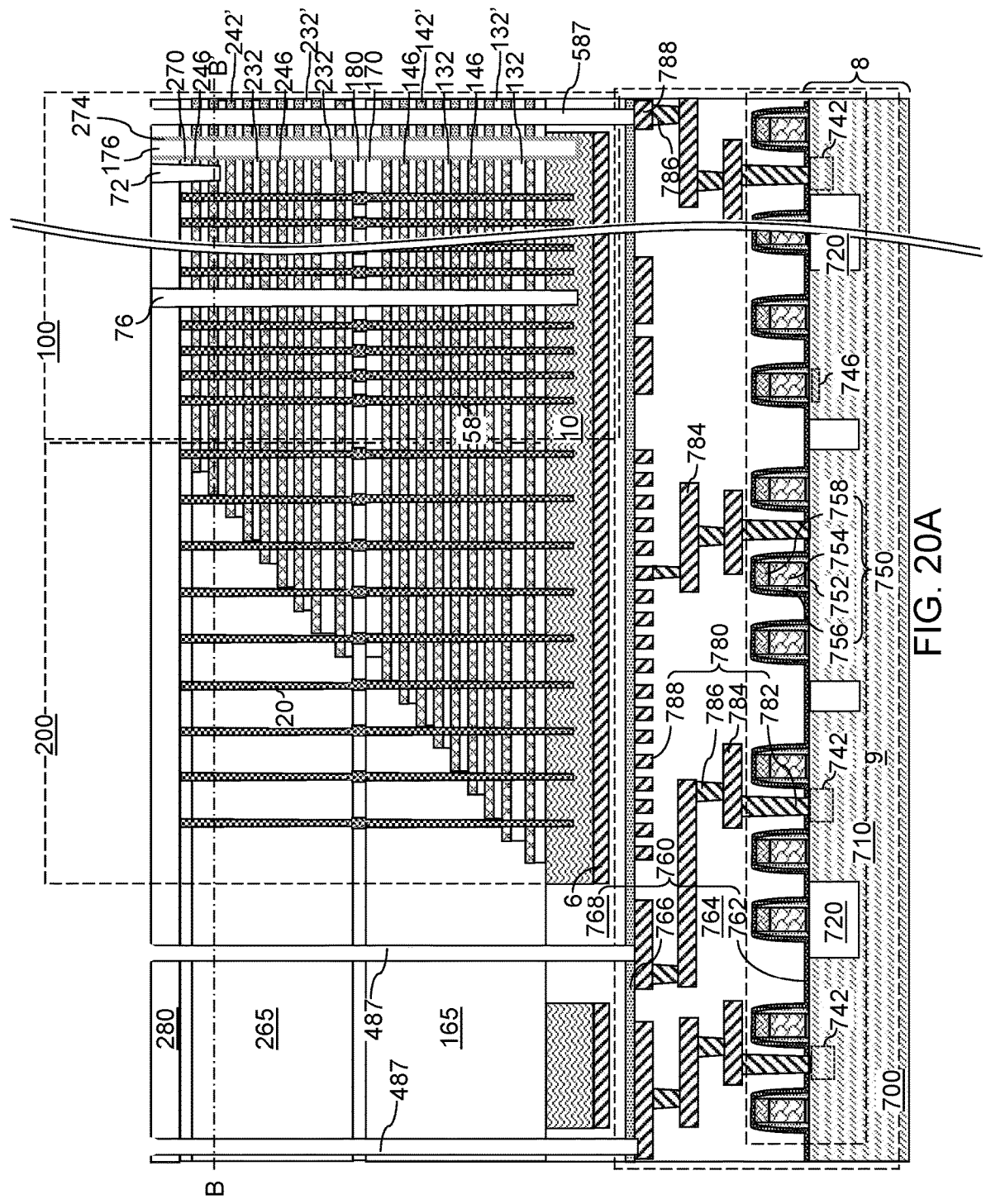
FIG. 20A is a vertical cross-sectional view of the first exemplary structure after formation of contact via cavities according to an embodiment of the present disclosure.
Figure 20B:
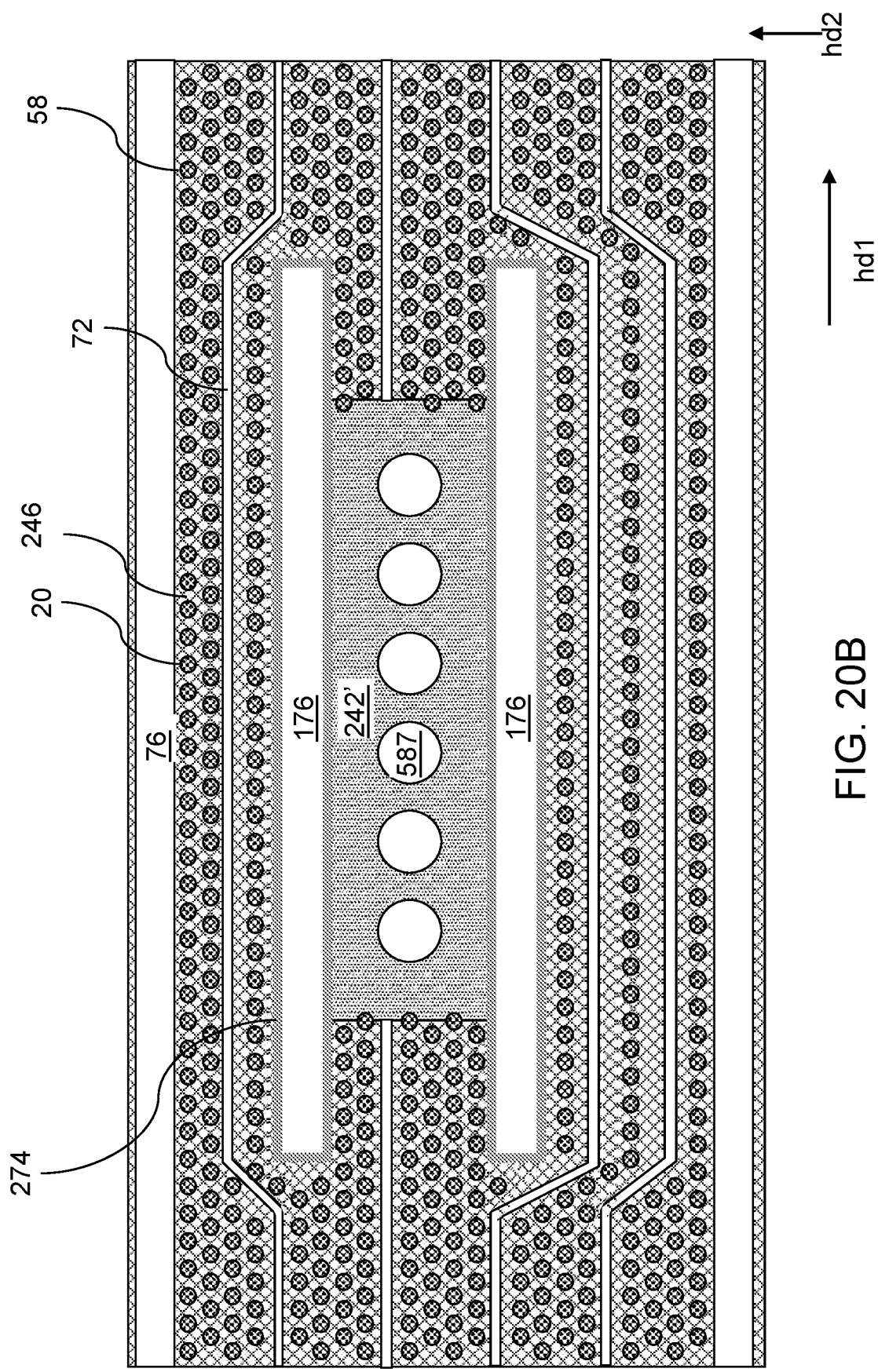
FIG. 20B is a horizontal cross-sectional view of a first alternative configuration of the first exemplary structure along a horizontal plane that corresponds to the horizontal plane B-B' of FIG. 20A.
Figure 20C:
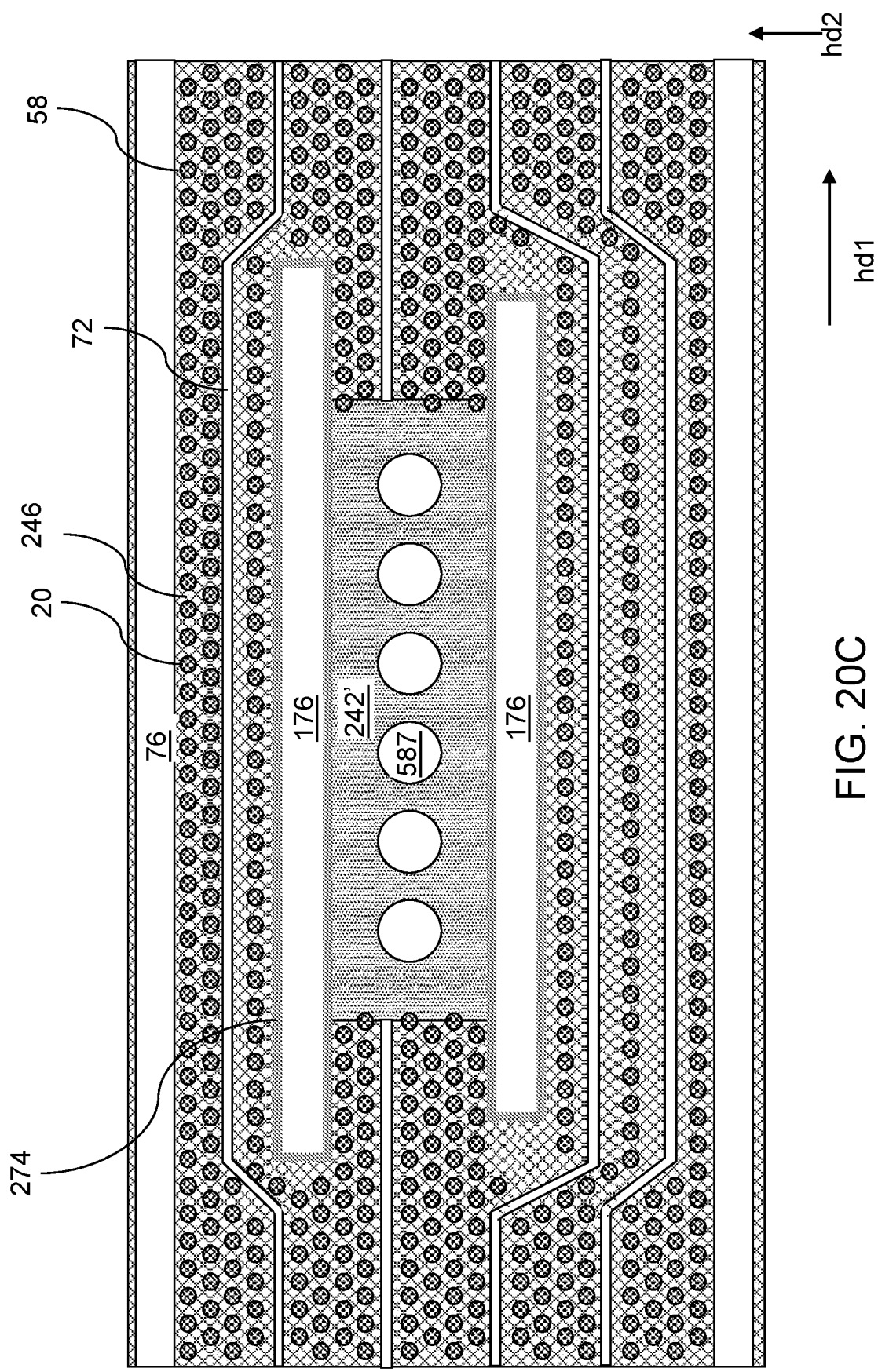
FIG. 20C is a horizontal cross-sectional view of a second alternative configuration of the first exemplary structure along a horizontal plane that corresponds to the horizontal plane B-B' of FIG. 20A.
Figure 20D:
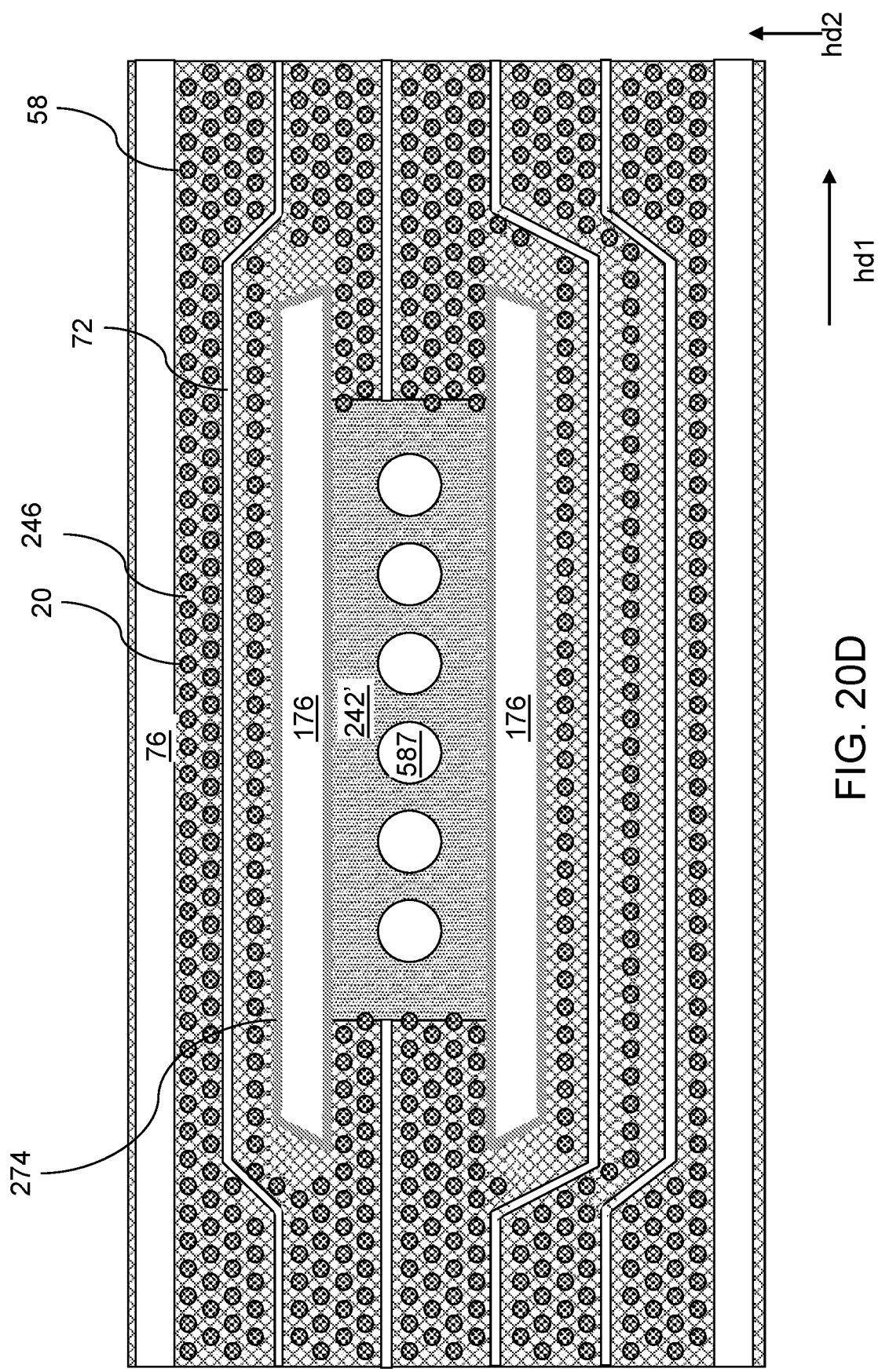
FIG. 20D is a horizontal cross-sectional view of a third alternative configuration of the first exemplary structure along a horizontal plane that corresponds to the horizontal plane B-B' of FIG. 20A.
Figure 20E:
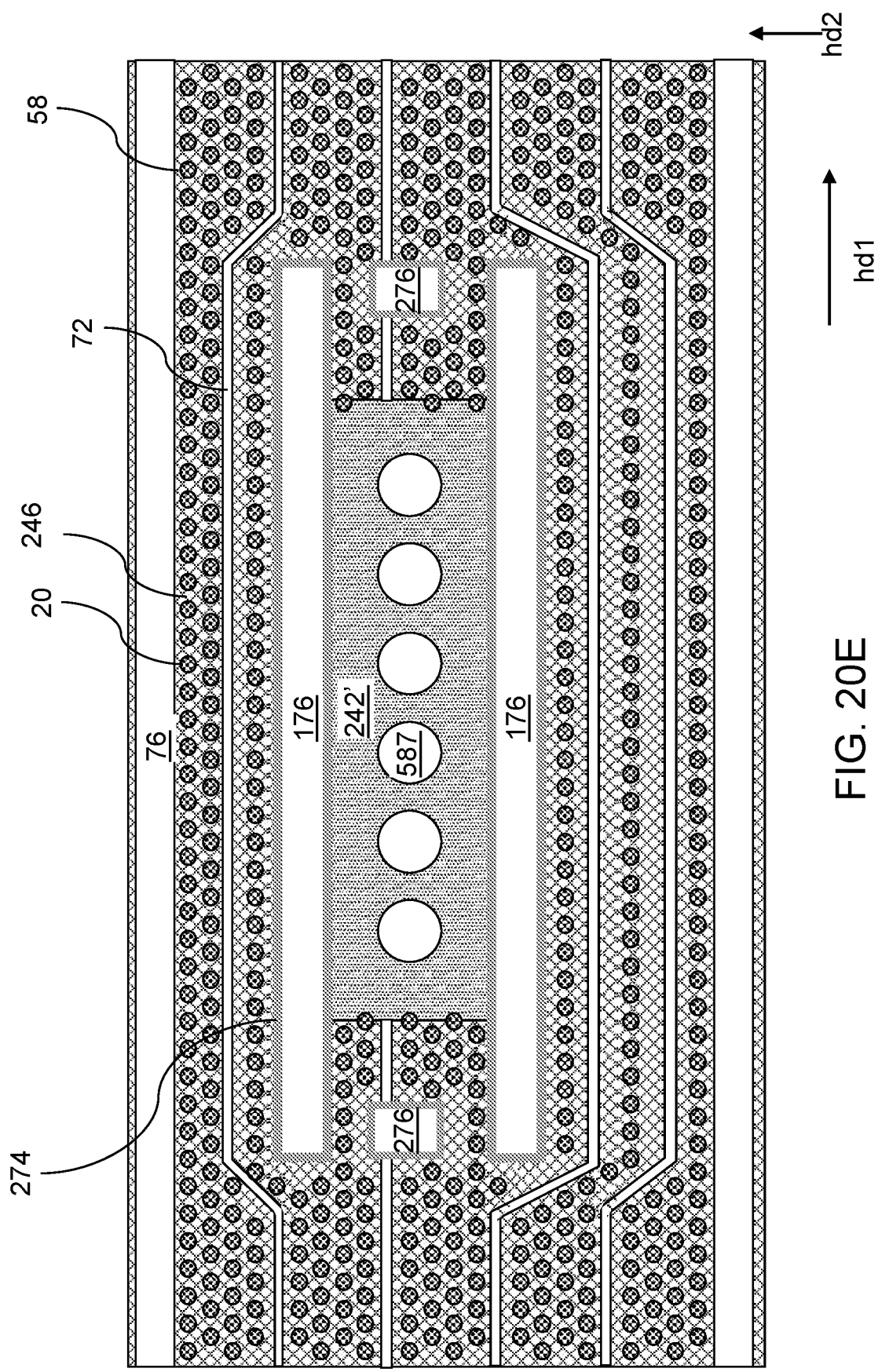
FIG. 20E is a horizontal cross-sectional view of a fourth alternative configuration of the first exemplary structure along a horizontal plane that corresponds to the horizontal plane B-B' of FIG. 20A.
Figure 20F:
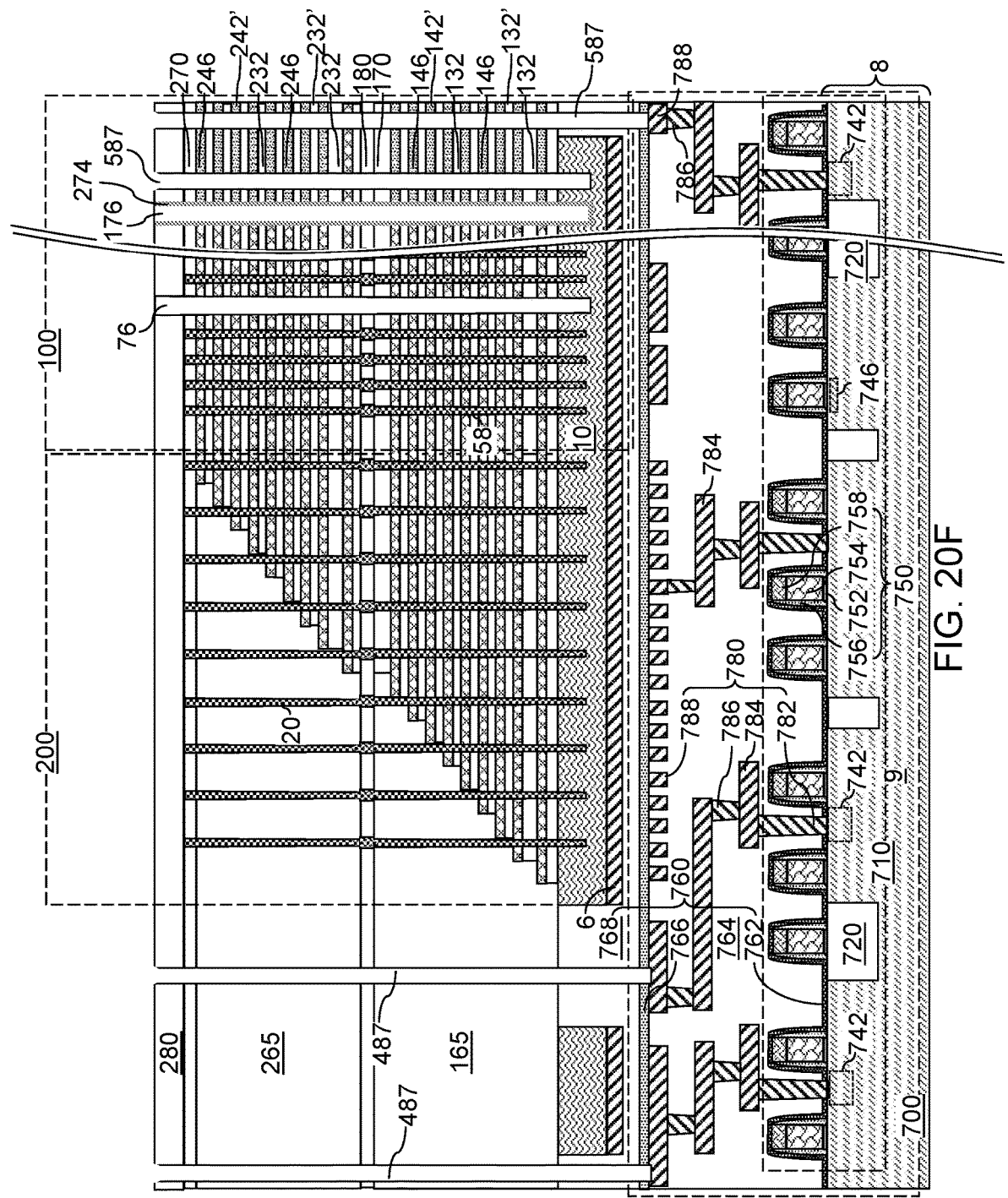
FIG. 20F is a vertical cross-sectional view of another alternative configuration of the first exemplary structure at the processing steps of FIGS. 20A-20E.

At least one of the drain-select-level isolation structures 72 comprises a first dielectric material segment 721 that has a uniform width and extends along the first horizontal direction hd1, a second dielectric material segment 722 that extends along the first horizontal direction hd1 and is laterally offset from the first dielectric material segment 721 by a lateral offset distance, and a connection dielectric material segment 723 connecting the first dielectric material segment 721 and the second dielectric material segment 722 and extending horizontally along a horizontal direction that is at an angle in a range from 15 degrees to 75 degrees with respect to the first horizontal direction hd1. In some embodiments, each of the pair of dielectric wall structures (274, 176) comprises angled sidewalls located within a respective vertical plane that is at an angle in a range from 15 degrees to 75 degrees with respect to a vertical plane including the first horizontal direction hd1 as illustrated in FIG. 19F.

Memory stack structures 55 vertically extend through a respective alternating stack {(132, 146) and/or (232, 246)} of insulating layers (132, 232) and electrically conductive layers (146, 246). Each of the memory stack structures 55 comprises a respective memory film 50 and a respective vertical semiconductor channel 60. A source region (112, 114, 116) is electrically connected to a first end of each of the vertical semiconductor channels 60, and drain regions is electrically connected to a second end of a respective one of the vertical semiconductor channels 60.

Referring to FIGS. 20A-20F, a photoresist layer may be applied over the first contact level dielectric layer 280, and may be lithographically patterned in areas of the dielectric spacer plates (142', 242'), which are contained in vertically alternating sequences of insulating layers (132, 232) and the dielectric spacer plates (142', 242') and located between a respective pair of dielectric wall structures (274, 176). An anisotropic etch process may be performed to etch through the portions of the vertically alternating sequences {(132, 232), (142', 242')} that are not masked by the photoresist layer. Contact via cavities are formed through memory-level material portions of the first exemplary structure, which are herein referred to as through-memory-level contact via cavities (487, 587). The through-memory-level contact via cavities (487, 587) include first through-memory-level contact via cavities 587 that extends through the vertically alternating sequences {(132, 232), (142', 242')} of insulating layers (132, 232) and dielectric spacer plates (142', 242'), and second through-memory-level contact via cavities 487 that extends through the retro-stepped dielectric material portions (165, 265). The first through-memory-level contact via cavities 587 may vertically extend through each layer within the vertically alternating sequences {(132, 232), (142', 242')}. The first through-memory-level contact via cavities 587 may include interconnect contact via cavities that extend through the at least one second dielectric layer 768 to top surfaces of a respective lower-level metal interconnect structure 780, and source contact via cavities that extend to the source contact layer 114.

Referring to FIGS. 21A-21H, at least one conductive material may be deposited in each of the first through-memory-level contact via cavities 587 and the second through-memory-level contact via cavities 487 by at least one conformal deposition process. Excess portions of the at least one conductive material may be removed from above the top surface of the first contact level dielectric layer 280 by a planarization process such as a recess etch or a chemical mechanical planarization process. Each remaining portion of the at least one conductive material in the first through-memory-level contact via cavities 587 constitutes a first through-memory-level interconnection via structure 588. The first through-memory-level interconnection via structures 588 may include interconnect contact via structures 588A that extend through the at least one second dielectric layer 768 and contact top surfaces of a respective lower-level metal interconnect structure 780, and source contact via structures 588B that extend to, and contact, the source contact layer 114. The second through-memory-level interconnection via structures 488 may extend through the retro-stepped dielectric material portions (165, 265) and may contact a respective one of the lower-level metal interconnect structures 780.

Figure 21A:
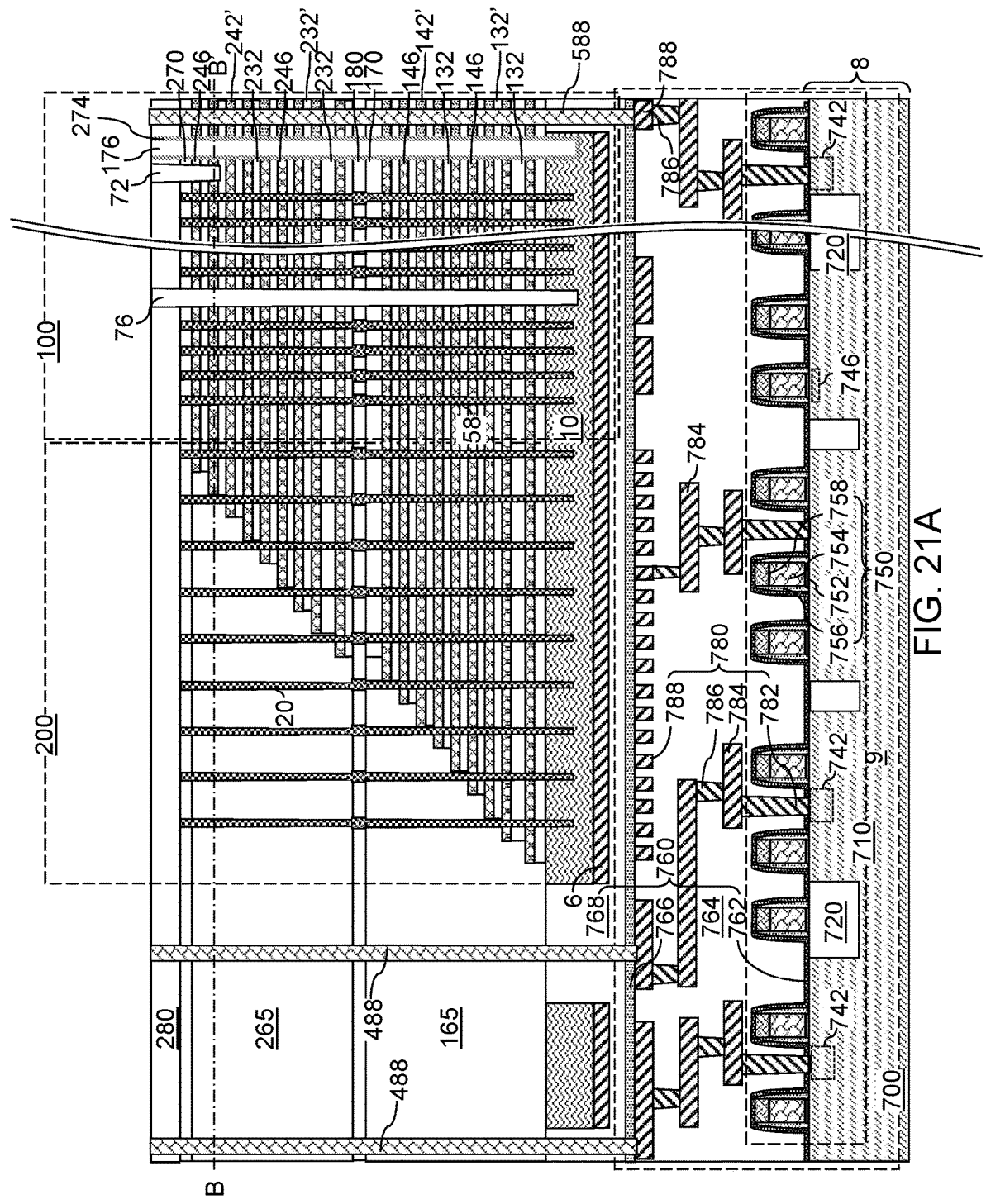
FIG. 21A is a vertical cross-sectional view of the first exemplary structure after formation of conductive via structures according to an embodiment of the present disclosure.
Figure 21B:
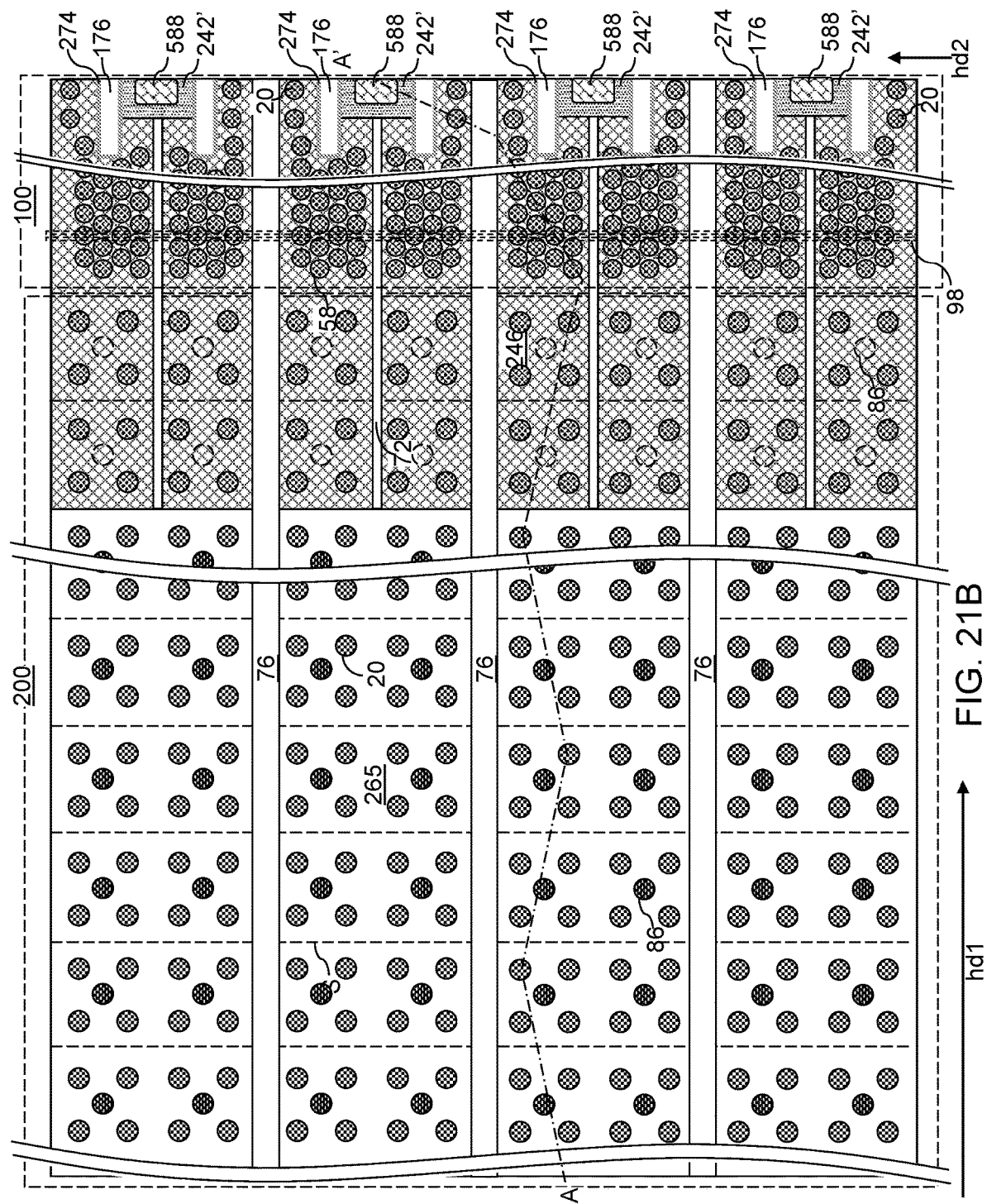
FIG. 21B is a horizontal cross-sectional of the first exemplary structure along the horizontal plane B-B' of FIG. 21A. The hinged vertical plane A-A' corresponds to the plane of the vertical cross-sectional view of FIG. 21A.
Figure 21C:
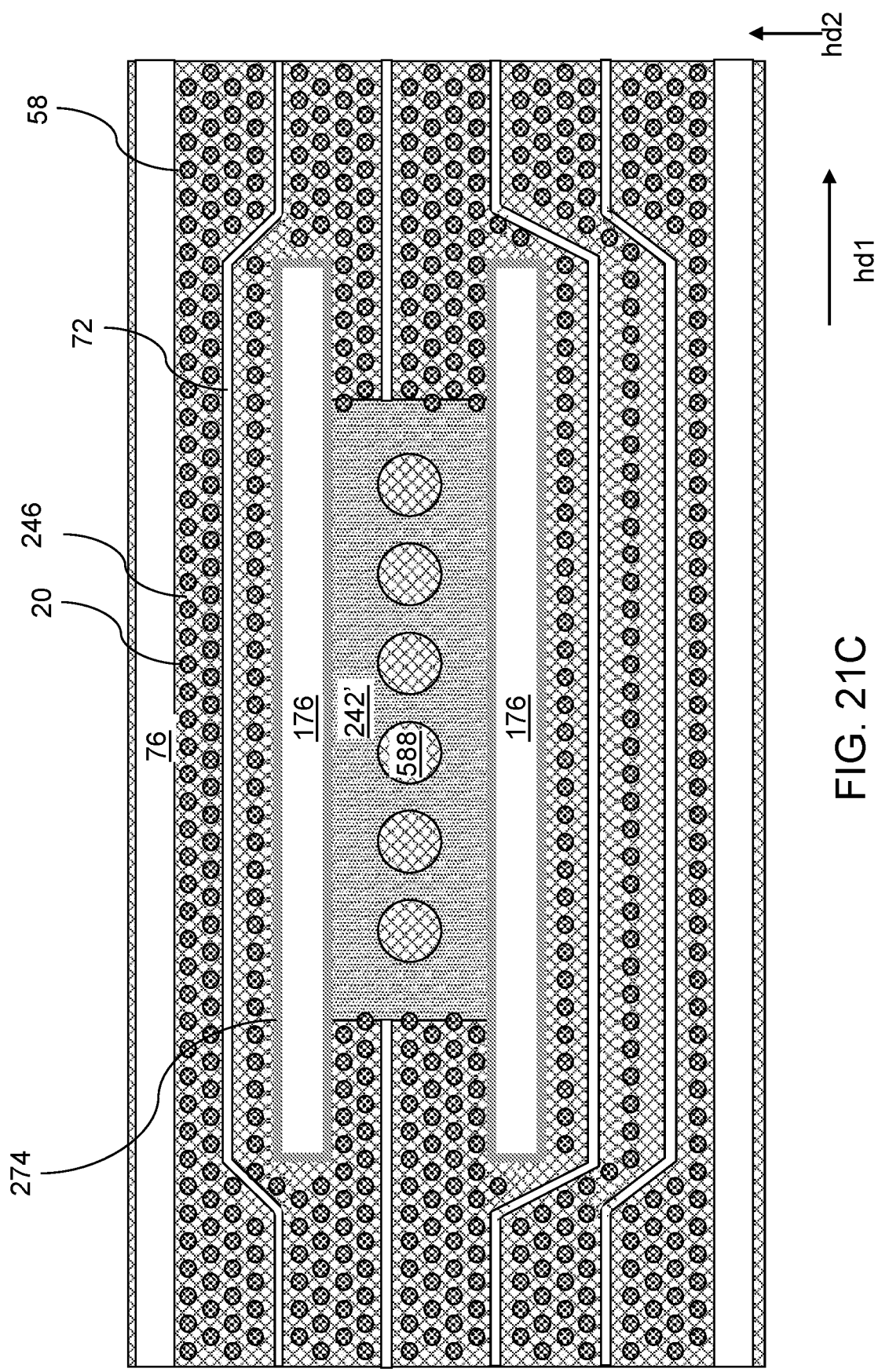
FIG. 21C is a horizontal cross-sectional view of a first alternative configuration of the first exemplary structure along a horizontal plane that corresponds to the horizontal plane B-B' of FIG. 21A.
Figure 21D:
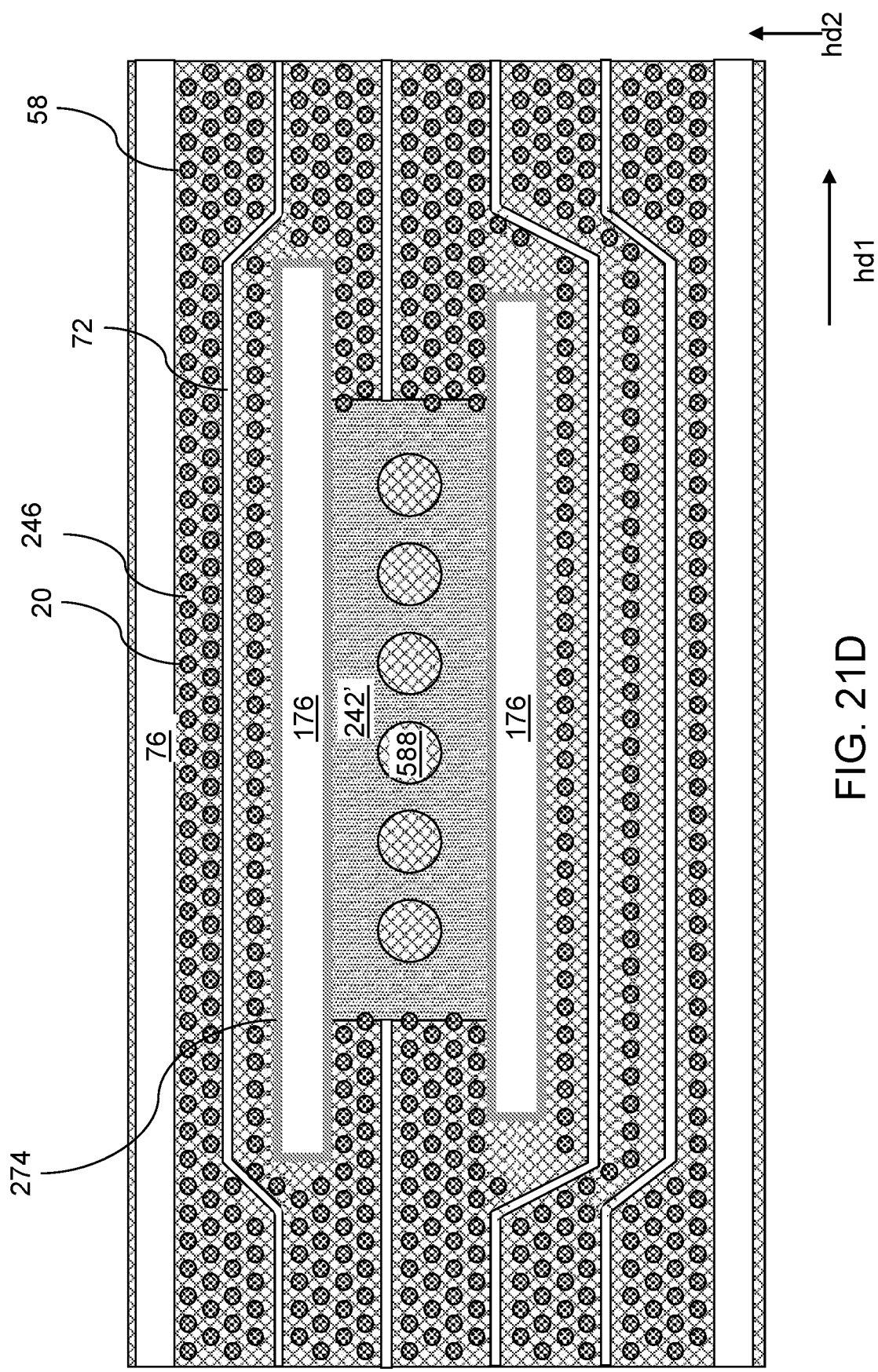
FIG. 21D is a horizontal cross-sectional view of a second alternative configuration of the first exemplary structure along a horizontal plane that corresponds to the horizontal plane B-B' of FIG. 21A.
Figure 21E:
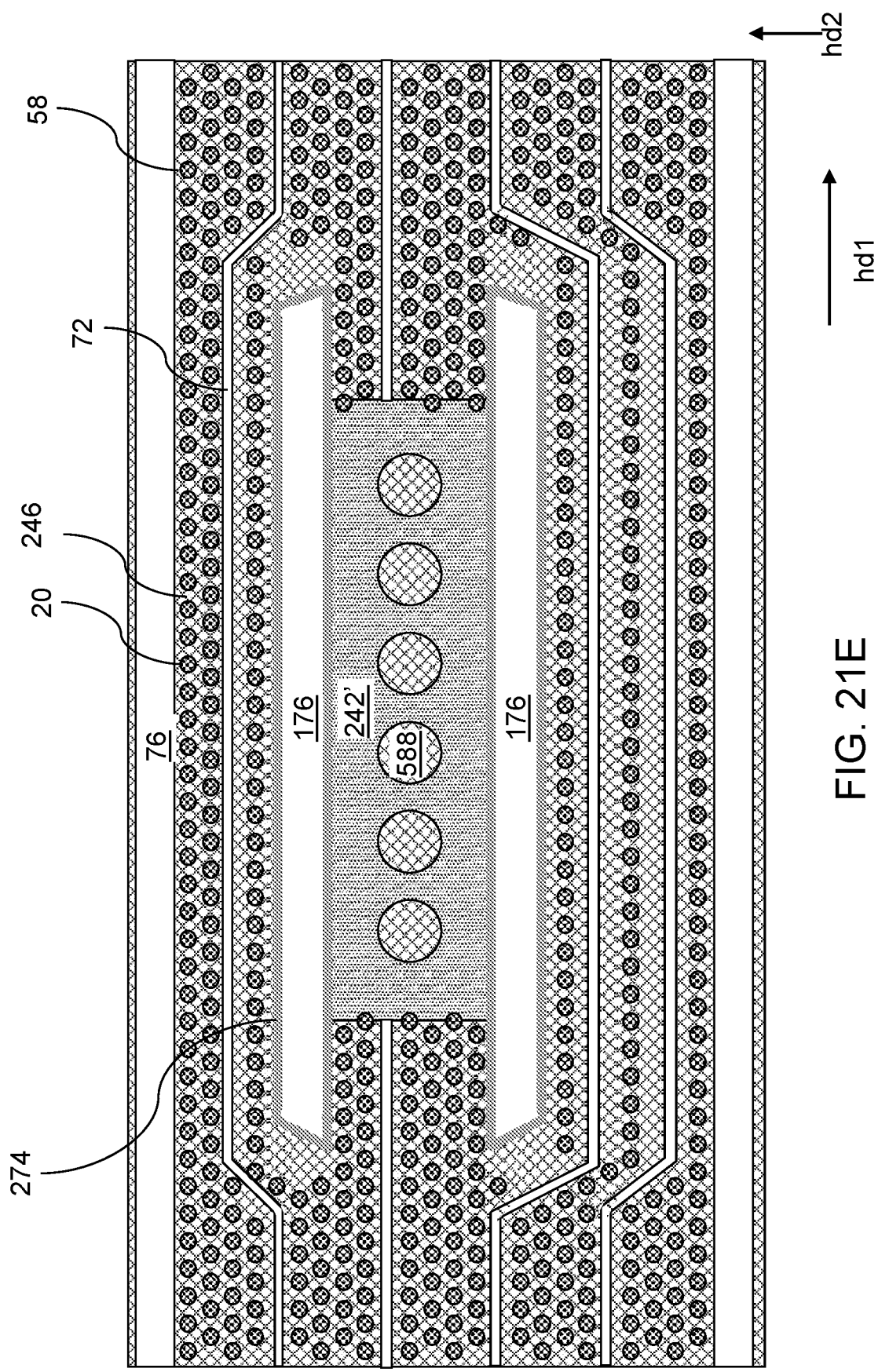
FIG. 21E is a horizontal cross-sectional view of a third alternative configuration of the first exemplary structure along a horizontal plane that corresponds to the horizontal plane B-B' of FIG. 21A.
Figure 21F:
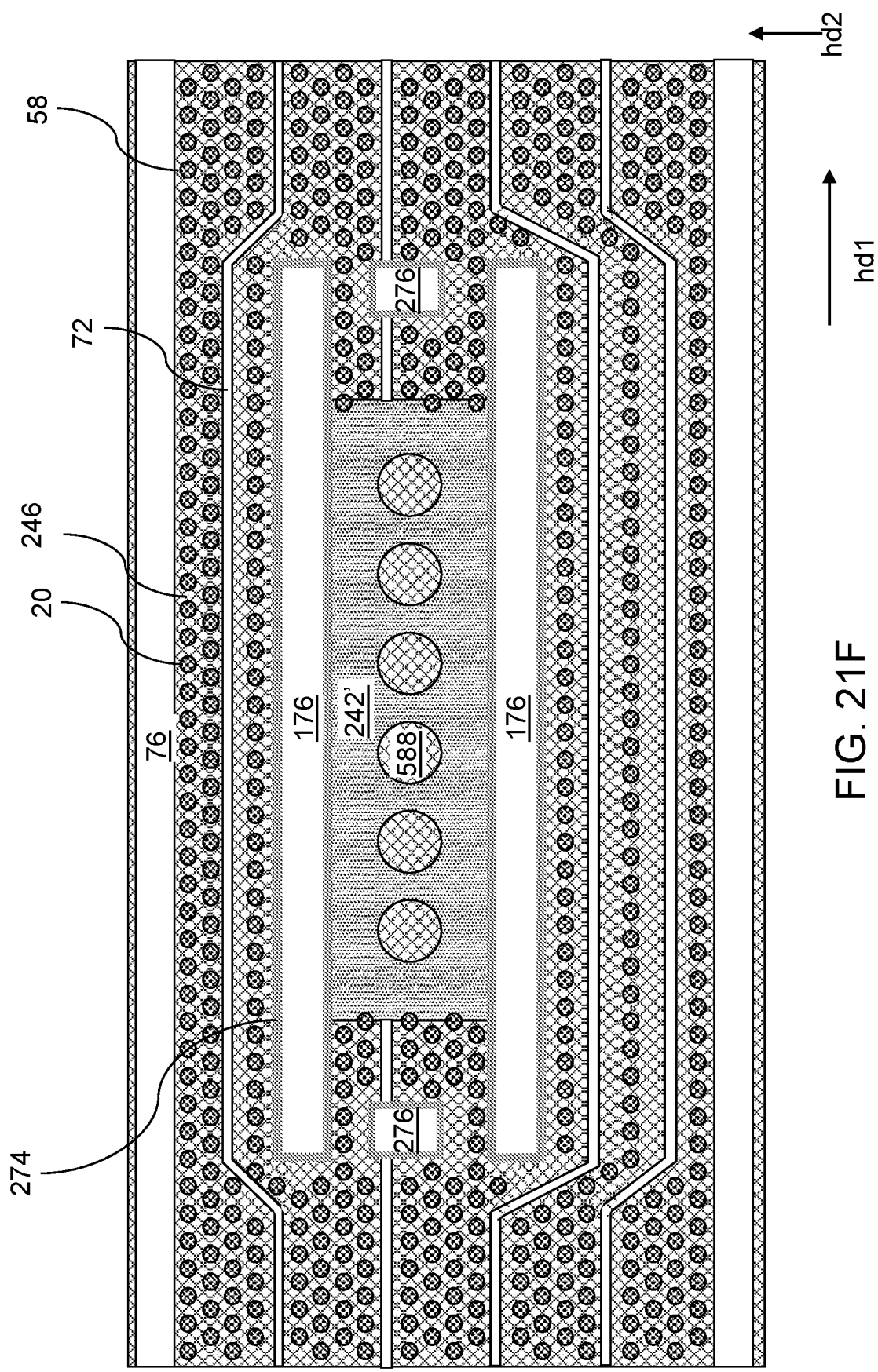
FIG. 21F is a horizontal cross-sectional view of a fourth alternative configuration of the first exemplary structure along a horizontal plane that corresponds to the horizontal plane B-B' of FIG. 21A.
Figure 21G:
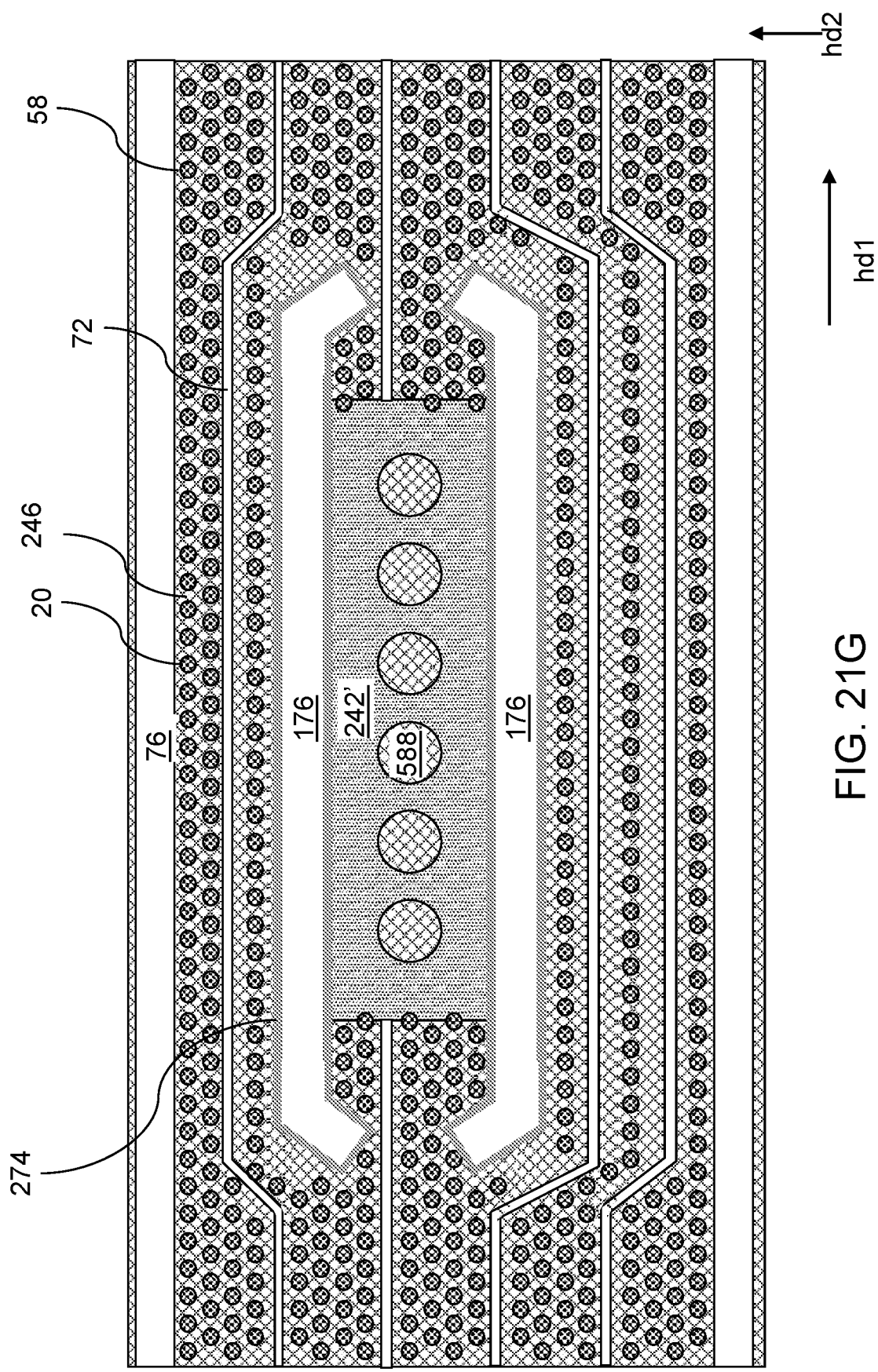
FIG. 21G is a horizontal cross-sectional view of a fourth alternative configuration of the first exemplary structure along a horizontal plane that corresponds to the horizontal plane B-B' of FIG. 21A.
Figure 21H:
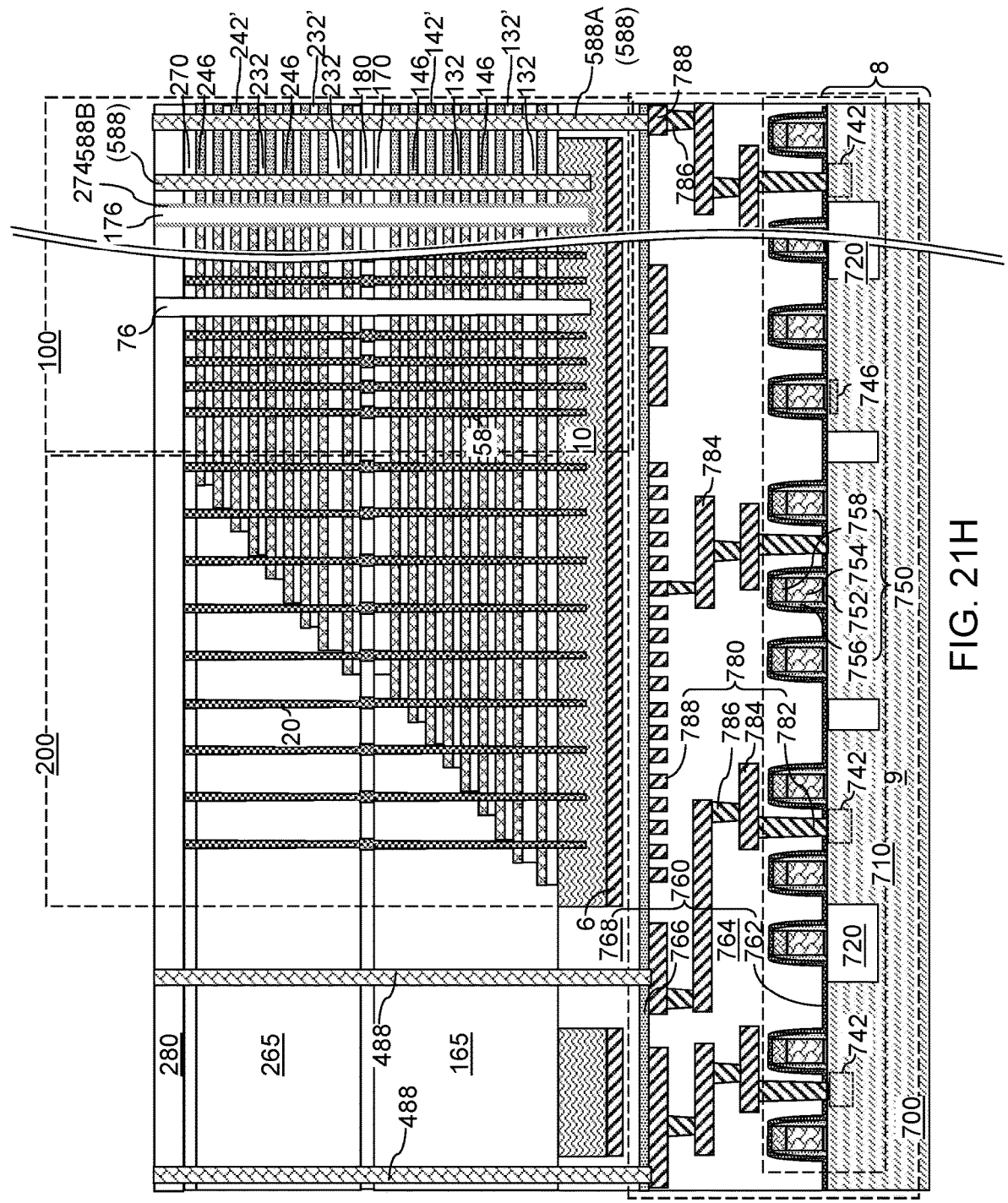
FIG. 21H is a vertical cross-sectional view of another alternative configuration of the first exemplary structure at the processing steps of FIGS. 21A-21G.

If the barrier trenches 179 described above with respect to FIGS. 11A-11F have at least one contoured sidewall having a curvature in a horizontal cross-sectional view that is adjoined to a pair of lengthwise sidewalls that extend along the first horizontal direction hd1, then the embodiment structure shown in FIG. 21G results. In this embodiment, the dielectric wall structures (176, 274) each have at least one end portion that extends at an angle of than 90 degrees, such as 15 to 75 degrees, for example 30 to 60 degrees in a horizontal cross-sectional view with respect to the middle portion of the dielectric wall structures that extends along the first horizontal direction hd1. The end portions partially pinch off the regions between the pair of dielectric wall structures.

Figure 22:
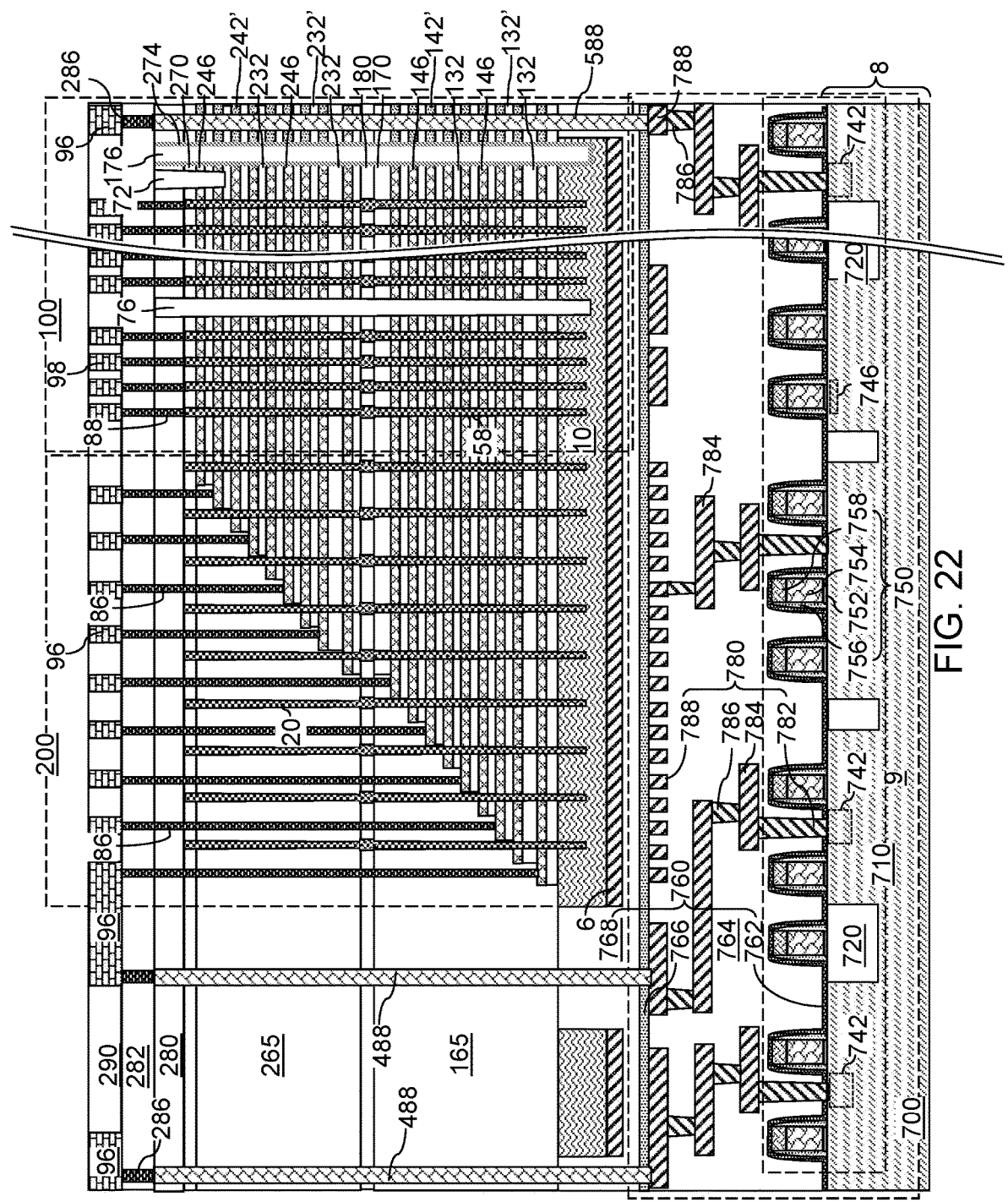
FIG. 22 is a vertical cross-sectional view of the first exemplary structure after formation of a second contact level dielectric layer, various additional contact via structures, a line-level dielectric layer, and various metal line structures according to an embodiment of the present disclosure.

Referring to FIG. 22, a second contact level dielectric layer 282 may be formed over the first contact level dielectric layer 280. The second contact level dielectric layer 282 includes a dielectric material such as silicon oxide, and may have a thickness in a range from 100 nm to 600 nm, although lesser and greater thicknesses may also be used.

A photoresist layer (not shown) may be applied over the second contact level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146, 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55. Interconnection via structures 286 may be formed on top of a respective one of the through-memory-level interconnection via structures (488, 588).

At least one additional dielectric layer may be formed over the contact level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact level dielectric layers (280, 282). The upper-level metal interconnect structures may include bit lines 98 contacting a respective one of the drain contact via structures 88. Further, the upper-level metal interconnect structures may include interconnection line structures 96 contacting, and/or electrically connected to, at least one of the staircase-region contact via structures 86 or the interconnection via structures 286. he bit lines 98 may be electrically connected to a respective subset of the drain regions 63. In one embodiment, the electrically conductive layers (146, 246) may laterally extend along the first horizontal direction hd1 and may have a uniform width along the second horizontal direction hd2. The bit lines 98 may laterally extend along the second horizontal direction hd2.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the semiconductor substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the semiconductor substrate 8, the plurality of control gate electrodes comprise at least a first control gate electrode located in the first device level and a second control gate electrode located in the second device level. The array of monolithic three-dimensional NAND strings comprises a plurality of vertical semiconductor channels 60, wherein at least one end portion of each of the plurality of vertical semiconductor channels 60 extends substantially perpendicular to a top surface of the semiconductor substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of vertical semiconductor channels 60.

Referring to all drawings and according to various embodiments of the present disclosure, a three-dimensional memory device is provided, which comprises: field effect transistors located over a semiconductor substrate 8 including the substrate semiconductor layer 9; lower-level metal interconnect structures 780 formed within lower-level dielectric material layers 760 that overlie the field effect transistors; an alternating stack of insulating layers (132, 232) and composite layers {(146, 142'), (246, 242')} located over the lower-level metal interconnect structures 780 and between a pair of backside trenches 79 that laterally extend along a first horizontal direction hd1, wherein each of the composite layers {(146, 142'), (246, 242')} comprises a respective electrically conductive layer (146, 246) and a respective dielectric spacer plate (142', 242'), and a vertically alternating sequence of the insulating plates (132', 232') and the dielectric spacer plates (142', 242') is provided within a region including the dielectric spacer plates (142', 242'); memory stack structures 55 vertically extending through the alternating stack {132, 232, (146, 142'), (246, 242')}; a pair of dielectric wall structures (274, 176) vertically extending through each layer within the alternating stack {132, 232, (146, 142'), (246, 242')} which do not contact other through another dielectric wall structure, wherein a vertically alternating sequence of the insulating plates (132', 232') and the dielectric spacer plates (142', 242') is located between the pair of dielectric wall structures (274, 176); and at least one conductive via structure 588 vertically extending through the vertically alternating sequence {132, 232, 142', 242')} and contacting a top surface of a respective one of the lower-level metal interconnect structures 780.

In one embodiment, the pair of dielectric wall structures (274, 176) are discrete and unconnected, which means that there is no path from one dielectric wall structure of the pair to the other dielectric wall structure of the pair through another dielectric wall structure. In other words, the pair of dielectric wall structures do not completely surround the alternating sequence of the insulating plates (132', 232') and the dielectric spacer plates (142', 242'), and the alternating sequence of the insulating plates (132', 232') and the dielectric spacer plates (142', 242') are not completely surrounded by dielectric wall structures (176, 274).

In one embodiment, each of the dielectric wall structures (274, 176) includes a respective uniform-width region that laterally extend along the first horizontal direction hd1 with a respective uniform width along a second horizontal direction hd2 that is perpendicular to the first horizontal direction hd1. In one embodiment, each of the dielectric spacer plates (142', 242') comprises lengthwise sidewalls that extend along the first horizontal direction hd1 and contacts a respective one of the pair of dielectric wall structures (274, 176). In one embodiment, each of the pair of dielectric wall structures (274, 176) has a greater lateral extent than the pair of lengthwise sidewalls of the dielectric spacer plates (142', 242').

In one embodiment, the pair of dielectric wall structures (274, 176) has a same lateral extent along the first horizontal direction hd1. In one embodiment, the pair of dielectric wall structures (274, 176) are laterally offset along the second horizontal direction hd2 from a respective proximal backside trench 79 selected from the pair of backside trenches 79 by unequal lateral trench-to-dielectric spacings (as illustrated in FIG. 21D); and a dielectric wall structure (274, 176) of the pair of dielectric wall structures (274, 176) having a greater trench-to-sidewall spacing has a lateral extent along the first horizontal direction hd1 that is less than a lateral extent along the first horizontal direction hd1 for a dielectric wall structure (274, 176) of the pair of dielectric wall structures (274, 176) having a lesser trench-to-sidewall spacing.

In one embodiment, each of the pair of dielectric wall structures (274, 176) comprises angled sidewalls located within a respective vertical plane that is at an angle in a range from 15 degrees to 75 degrees with respect to a vertical plane including the first horizontal direction hd1.

In one embodiment, each of the pair of dielectric wall structures (274, 176) is located within a respective elongated trench that vertically extends through each layer of the alternating stack {132, 232, (146, 142'), (246, 242')} and having a greater lateral dimension along the first horizontal direction hd1 than along the second horizontal direction hd2.

In one embodiment, each of the dielectric wall structures (274, 176) comprises: a respective dielectric liner 274 comprising a dielectric material having a different material composition than the dielectric spacer plates (142', 242'); and a dielectric fill material formed within the respective dielectric liner 274 and constituting a dielectric fill material portion 176. In one embodiment, the insulating layers (132, 232) comprise a silicon oxide material; the dielectric liner 274 comprises a material selected from silicon oxide and a dielectric metal oxide; and the dielectric spacer plates (142', 242') comprise silicon nitride.

In one embodiment, drain-select-level isolation structures 72 may vertically extend through a subset of layers within the alternating stack {132, 232, (146, 142'), (246, 242')} including a topmost one of the composite layers {(146, 142'), (246, 242')}, wherein the drain-select-level isolation structures 72 divide an electrically conductive layer 246 within the topmost one of the composite layers {(146, 142'), (246, 242')} into multiple electrically conductive strips that are electrically isolated from one another. In one embodiment, each of the multiple electrically conductive strips laterally extends continuously from a first side of the vertically alternating sequence {132, 232, 142', 242')}, between a respective one of the pair of backside trenches 79 and a respective one of the dielectric wall structures (274, 176), and to a second side of the vertically alternating sequence {132, 232, 142', 242')} that is laterally spaced from the first side along the first horizontal direction hd1.

A semiconductor material layer (such as a source contact layer 114) may be located between the lower-level dielectric material layers 760 and the alternating stack {132, 232, (146, 142'), (246, 242')}, wherein: each of the memory stack structures 55 comprises a vertical semiconductor channel 60 and a memory film 50; and each sidewall of the pair of dielectric wall structures (274, 176) vertically extend straight from a topmost layer of the alternating stack {132, 232, (146, 142'), (246, 242')} to a bottommost layer of the alternating stack {132, 232, (146, 142'), (246, 242')}.

In one embodiment, the semiconductor material layer comprises an opening that underlies the vertically alternating sequence {132, 232, 142', 242')}; and the at least one conductive via structure 588 vertically extends through, and contacts, a dielectric material located within the opening in the semiconductor material layer.

The various embodiments of the present disclosure may be used to provide a liner-less contact via structure that extends through the memory levels within the memory array region 100. Specifically, the first through-memory-level interconnection via structure 588 do not utilize a dielectric liner because the vertically alternating sequence {132, 232, 142', 242')} functions as an insulating matrix that electrically isolates each of the first through-memory-level interconnection via structure 588 from the electrically conductive layers (146, 246). The first through-memory-level interconnection via structure 588 may be formed with minimal modifications to a process flow for forming a three-dimensional memory device, while providing higher areal efficiency and reduced process cost. By providing the liner-less contact via structure, the wiring connections to semiconductor devices 710 in the underlying peripheral device region 700 may be formed at a lower cost, simplifying the fabrication process and providing the ability to reduce the pitch of the structures. Furthermore, since the alternating sequence of the insulating plates (132', 232') and the dielectric spacer plates (142', 242') are not completely surrounded by dielectric wall structures, more space is available to form memory stack structures 55, there is less likelihood of pattern collapse and over etching at the corners of the barrier trenches. Furthermore, stress is mitigated, which can reduce or prevent insulating layer 32 deflection.

Figure 23A:
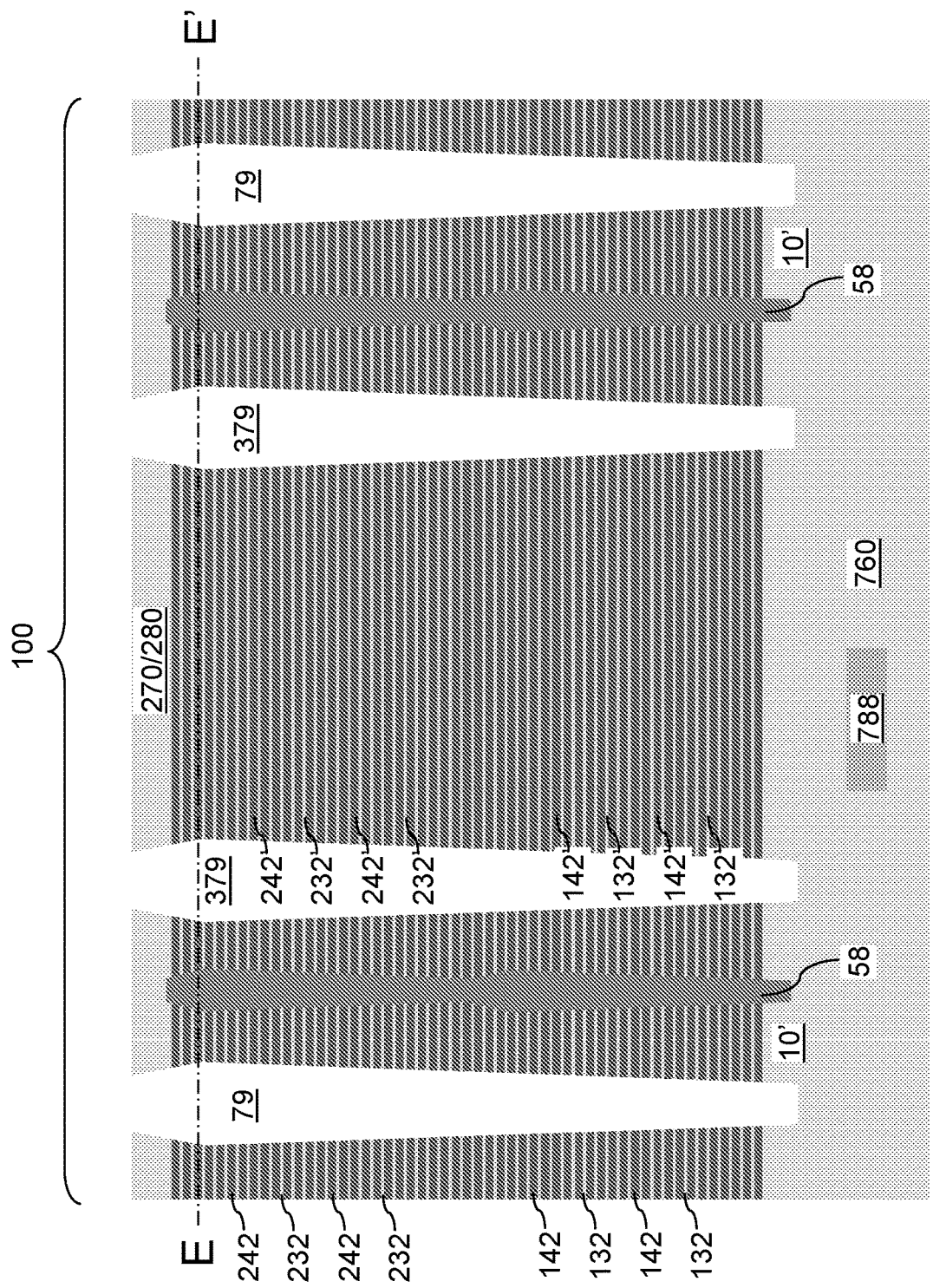
FIG. 23A is a vertical cross-sectional view of a memory array region of a first configuration of a second exemplary structure after formation of backside trenches and moat trenches according to an embodiment of the present disclosure. Drain-select-level isolation structures are not illustrated for clarity.
Figure 23D:
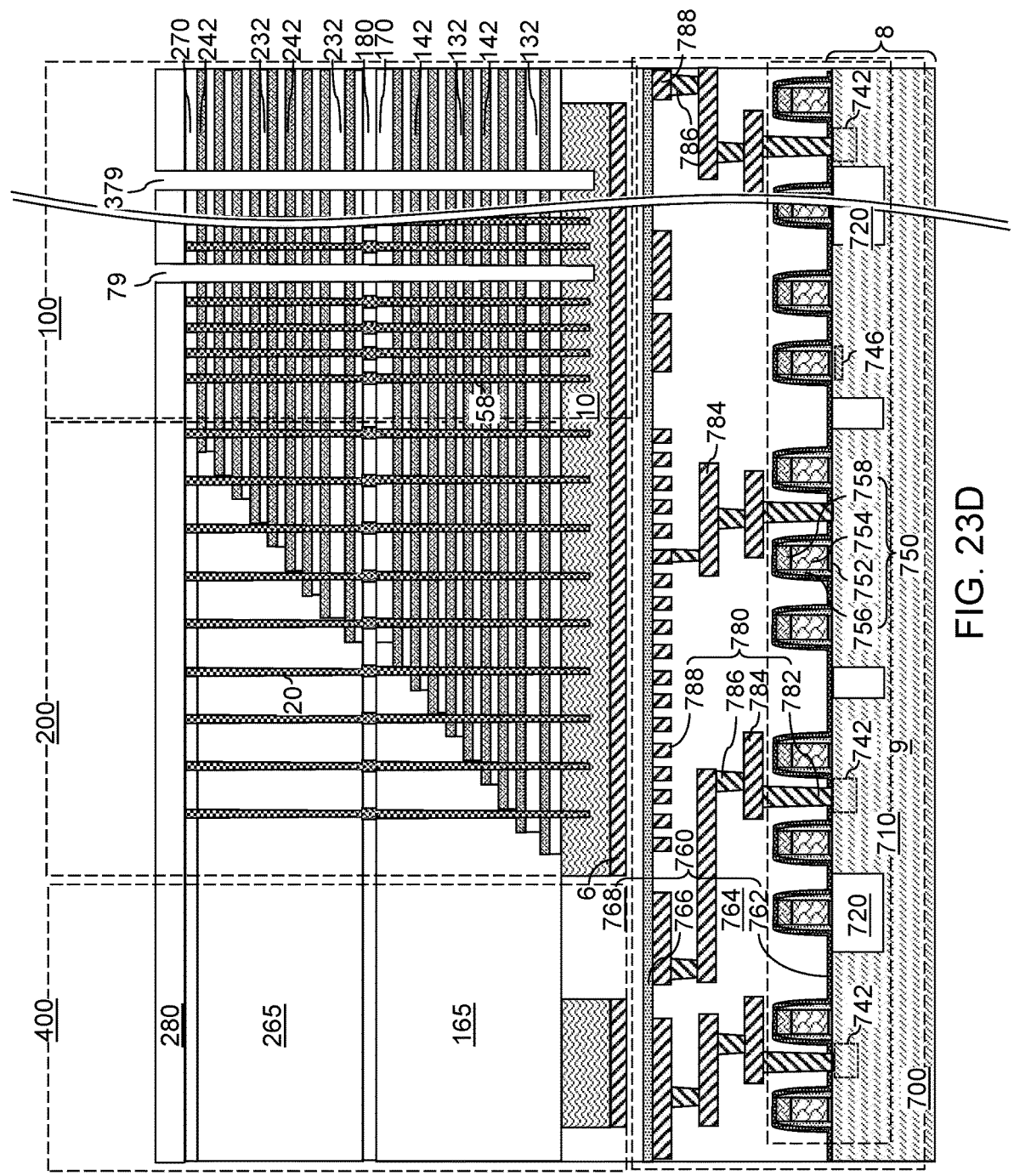
FIG. 23D is a vertical cross-sectional view of the second exemplary structure of FIGS. 23A and 23C or FIGS. 23B and 23C.
Figure 23E:
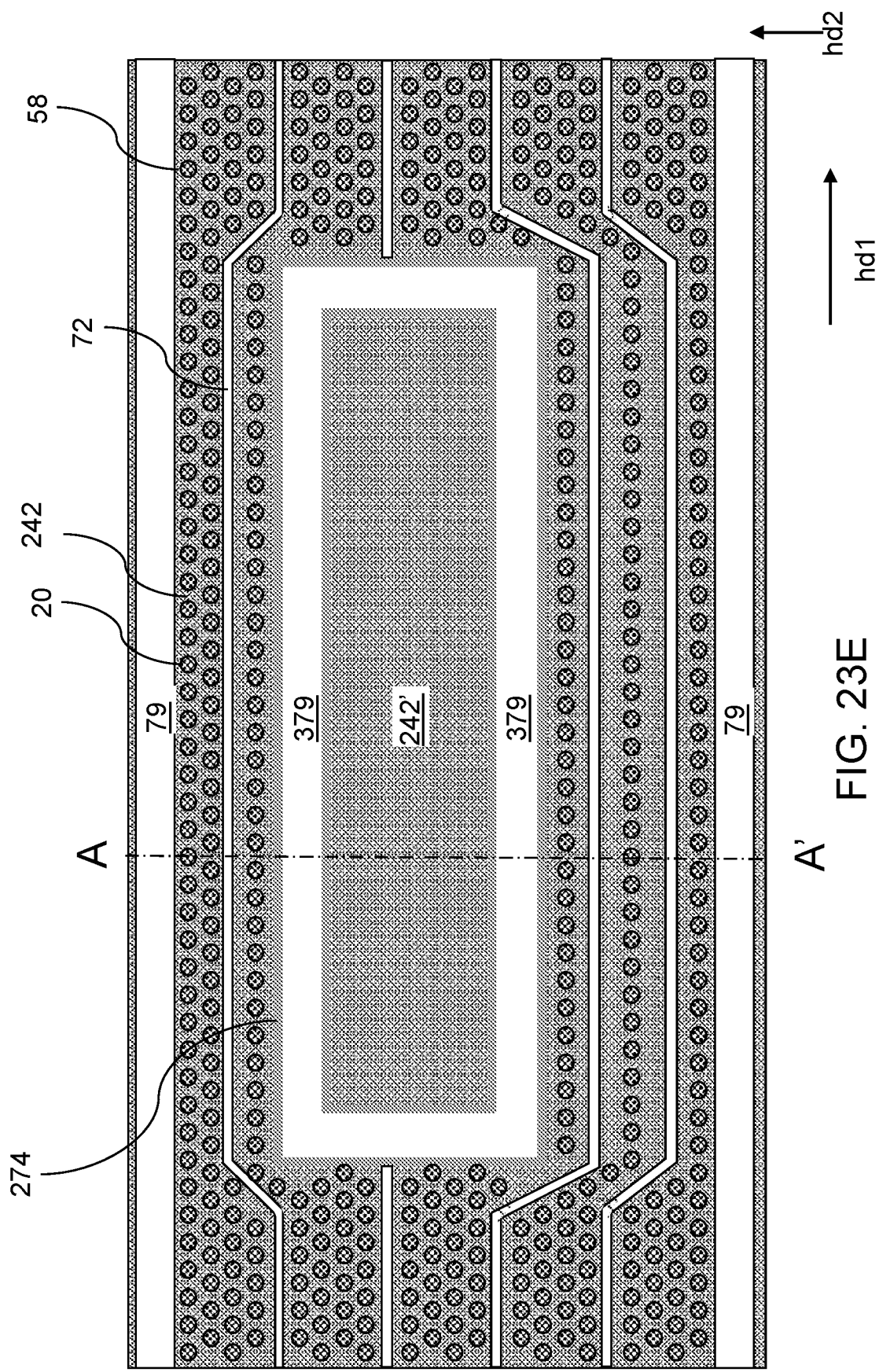
FIG. 23E is a horizontal cross-sectional of the first configuration of the second exemplary structure along the horizontal plane E-E' of FIG. 23A. The vertical plane A-A' corresponds to the plane of the vertical cross-sectional view of FIG. 23A.
Figure 23F:
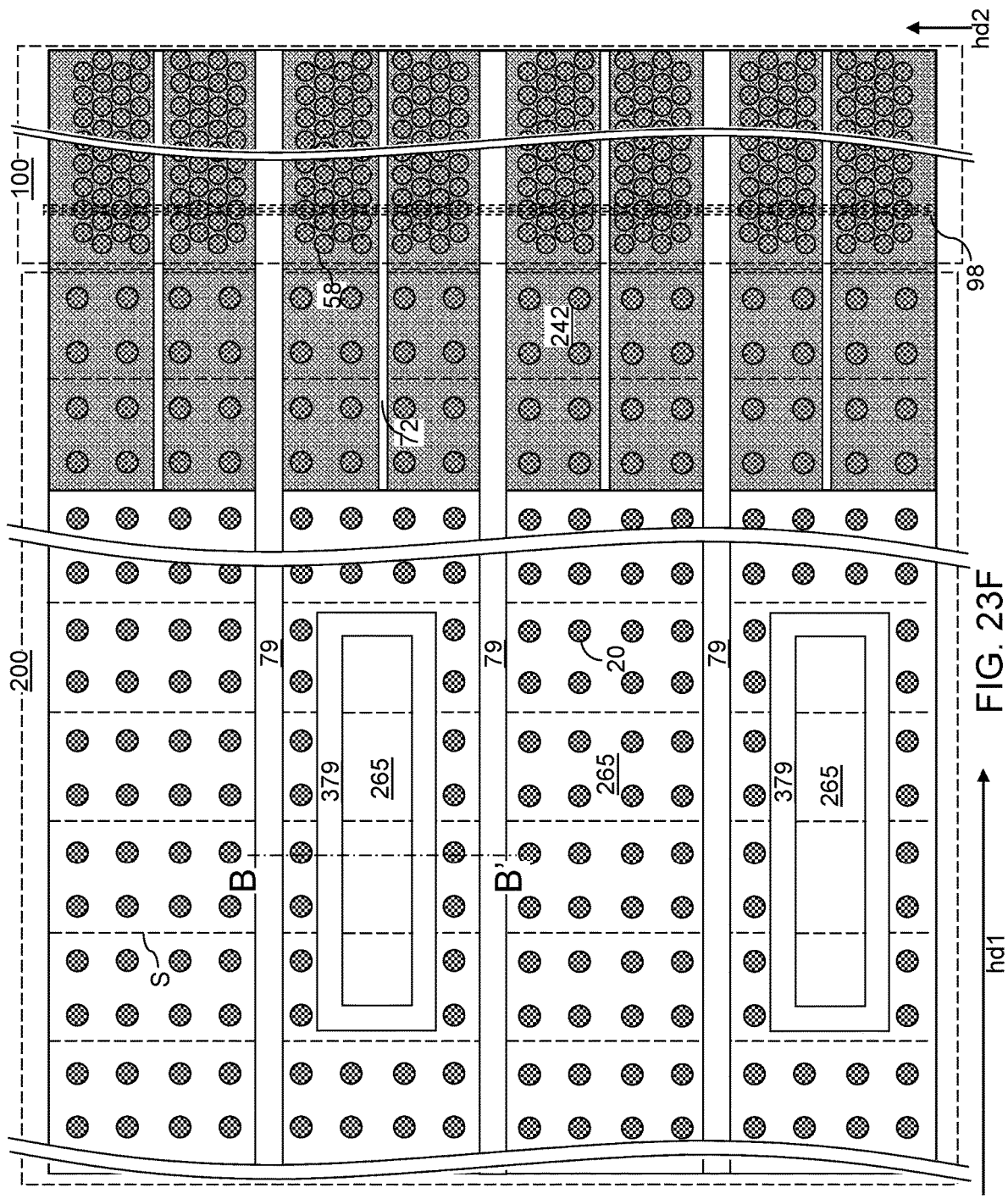
FIG. 23F is a horizontal cross-sectional of the second configuration of the second exemplary structure along the horizontal plane F-F' of FIG. 23B. The vertical plane B-B' corresponds to the plane of the vertical cross-sectional view of FIG. 23B.

Referring to FIGS. 23A-23F, a second exemplary structure according to an embodiment of the present disclosure can be derived from the first exemplary structure of FIG. 10 by forming a first contact level dielectric layer 280, backside trenches 79, and moat trenches 379. FIGS. 23A and 23E illustrate a first configuration of the second exemplary structure. FIGS. 23B and 23F illustrate a second configuration of the second exemplary structure. FIGS. 23C and 23D illustrate both configurations of the second exemplary structure. The first configuration and the second configuration differ by locations of the moat trenches 379. The first configuration and the second configuration of the second exemplary structure may be implemented alternatively or concurrently. In other words, the moat trenches 379 may be formed in the memory array region 100 as shown in the first configuration of FIGS. 23A and 23E, or may be formed in the staircase region 200 as shown in the second configuration of FIGS. 23B and 23F, or a first subset of the moat trenches 379 can be formed in the memory array region 100 and a second subset of the moat trenches 379 can be formed in the staircase region 200.

Because the second exemplary structure is derived from the first exemplary structure, the processing steps of FIGS. 1A-10 can be employed to provide the second exemplary structure of the first and second configurations. It is understood that any arbitrary number of drain-select-level isolation structures 72 can be provided between any neighboring pair of backside trenches 79. The number of drain-select-level isolation structures 72 is a layout parameter. Further, the number of rows of memory opening fill structures between each neighboring pair of drain-select-level isolation structures 72 or backside trenches 79 is a layout parameter that may be optimized to enhance design performance. While the first configuration is illustrated with a single drain-select-level isolation structure 72 between each neighboring pair of backside trenches 79 and the second configuration is illustrated with four drain-select-level isolation structures 72 between each neighboring pair of backside trenches 79, layout variations with different number of drain-select-level isolation structures 72 between each neighboring pair of backside trenches and/or with different number of rows of memory opening fill structures 58 are expressly contemplated herein. The drain-select-level isolation structures 72 are omitted in FIGS. 23A and 23B for clarity.

Generally, the substrate 8 (shown, for example, in FIG. 10) can comprise a semiconductor substrate, and field effect transistors may be formed on the semiconductor substrate. Lower-level metal interconnect structures 780 embedded within lower-level dielectric material layers 760 may be formed over the substrate 8 as shown in FIG. 10. The lower-level metal interconnect structures 780 (shown, for example, in FIG. 10) can be electrically connected to a respective one of the field effect transistors. In-process source-level material layers 10' can be formed over the substrate 8. The in-process source-level material layers 10' can comprise, for example, a source-level sacrificial layer 104, for example, as illustrated in FIG. 1C. At least one alternating stack of insulating layers (132, 232) and sacrificial material layers (142, 242) including dielectric materials can be formed over the source-level material layers 10 as described above. Stepped surfaces can be formed on each alternating stack by patterning each alternating stack in a staircase region 200, for example, employing the processing steps of FIGS. 3, 6A, and 6B. A dielectric material portion (such as the first retro-stepped dielectric material portion 165 and the second retro-stepped dielectric material portion 265) can be formed adjacent to a respective alternating stack and on the substrate 8. Memory stack structures 55 can be formed through each alternating stack as in the first embodiment.

The backside trenches 79 and the moat trench 379 can be formed through the alternating stack {(132, 142), (232, 242)} of insulating layers (132, 232) and sacrificial material layers (142, 242) that include a dielectric material (such as silicon nitride). For example, a photoresist layer (not shown) can be applied over the second insulating cap layer 270 and can be lithographically patterned with patterns of the backside trenches 79 and the moat trenches 379, and the pattern in the photoresist layer can be transferred through the alternating stack {(132, 142), (232, 242)}, the optional source-select-level conductive layer 118, the source-level insulating layer 117, the upper source-level semiconductor layer 116, and the upper sacrificial liner 105 such that the source-level sacrificial layer 104 is physically exposed at the bottom of each backside trench 79. A top surface of the source-level sacrificial layer 104 may be physically exposed at the bottom of each moat trench 379.

Each moat trench 379 has a continuous outer periphery and a continuous inner periphery. The continuous outer periphery of each moat trench 379 can have a first rectangular shape or a first rounded rectangular shape. The continuous inner periphery of each moat trench 379 can have a second rectangular shape or a second rounded rectangular shape that is located entirely within the first rectangular shape or the first rounded rectangular shape. Portions of the insulating layers (132, 232) surrounded by each moat trench constitute insulating plates (132', 232'). The insulating plates (132', 232') include first insulating plates 132' formed by remaining portions of the first insulating layers 132 and second insulating plates 232' formed by remaining portions of the second insulating layers 232. Portions of the sacrificial material layers (142, 242) surrounded by each moat trench 379 constitute dielectric spacer plates (142', 242'). The dielectric spacer plates (142', 242') include first dielectric spacer plates 142' formed by remaining portions of the first sacrificial material layers 142 and second dielectric spacer plates 242' formed by remaining portions of the second sacrificial material layers 242. A vertically alternating sequence of the insulating plates (132', 232') and the dielectric spacer plates (142', 242') is provided surrounded by each moat trench 379.

The moat trenches 379 can be formed in the memory array region 100 as illustrated in the first configuration of FIGS. 23A and 23E, and/or can be formed in the staircase region 200 as illustrated in the second configuration of FIGS. 23B and 23F. In case a moat trench 379 is formed in the memory array region 100 as illustrated in FIGS. 23A and 23E, the moat trench 379 is formed through each layer within the alternating stack {(132, 142), (232, 242)}. The total number of insulating plates (132', 232') within a vertically alternating sequence of the insulating plates (132', 232') and the dielectric spacer plates (142', 242') can be the same as the total number of insulating layers (132, 232) within the alternating stack {(132, 142), (232, 242)}, and the total number of dielectric spacer plates (142', 242') within the vertically alternating sequence of the insulating plates (132', 232') and the dielectric spacer plates (142', 242') can be the same as the total number of sacrificial material layers (142, 222) within the alternating stack {(132, 142), (232, 242)}.

In case a moat trench 379 is formed in the staircase region 200 as illustrated in FIGS. 23B and 23F, the moat trench 379 can be formed through a portion of the dielectric material portion such as the second retro-stepped dielectric material portion 265 and/or the first retro-stepped dielectric material portion 165. In one embodiment, a topmost one of the sacrificial material layers (142, 242) (such as a topmost second sacrificial material layer 242) within the alternating stack {(132, 242), (232, 242)} is laterally spaced from, and is not physically exposed to, a moat trench 379. The dielectric material portion includes stepped bottom surfaces that contact the stepped surfaces on the alternating stack {(132, 242), (232, 242)}. A moat trench 379 can laterally enclose a patterned sub-portion of the dielectric material portion over the vertically alternating sequence {(132', 142', 232', 242')}.

In one embodiment, the backside trenches 79 can laterally extend along a first horizontal direction (e.g., word line direction) hd1, and the backside trenches 79 can be laterally spaced apart along a second horizontal direction (e.g., bit line direction) hd2 that is perpendicular to the first horizontal direction hd1. In one embodiment, a moat trench 379 can comprise a pair of lengthwise outer sidewalls that extend along the first horizontal direction hd1, a pair of lengthwise inner sidewalls that extend along the first horizontal direction hd1, a pair of widthwise outer sidewalls that extend along the second horizontal direction hd2, and a pair of widthwise inner sidewalls that extend along the second horizontal direction hd2.

Figure 24A:
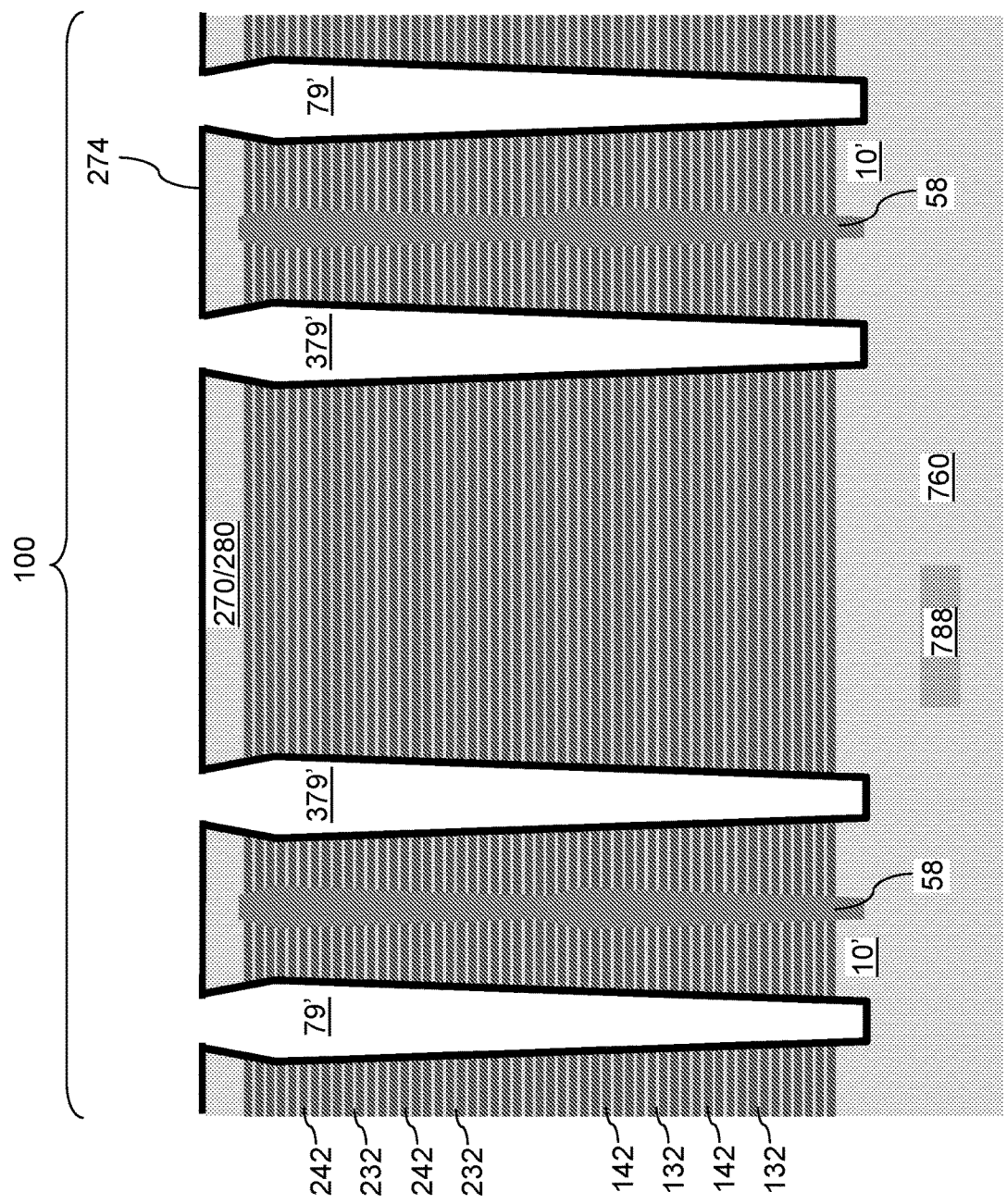
FIG. 24A is a vertical cross-sectional view of the first configuration of the second exemplary structure after formation of a dielectric liner according to an embodiment of the present disclosure.
Figures 24B, 24C:
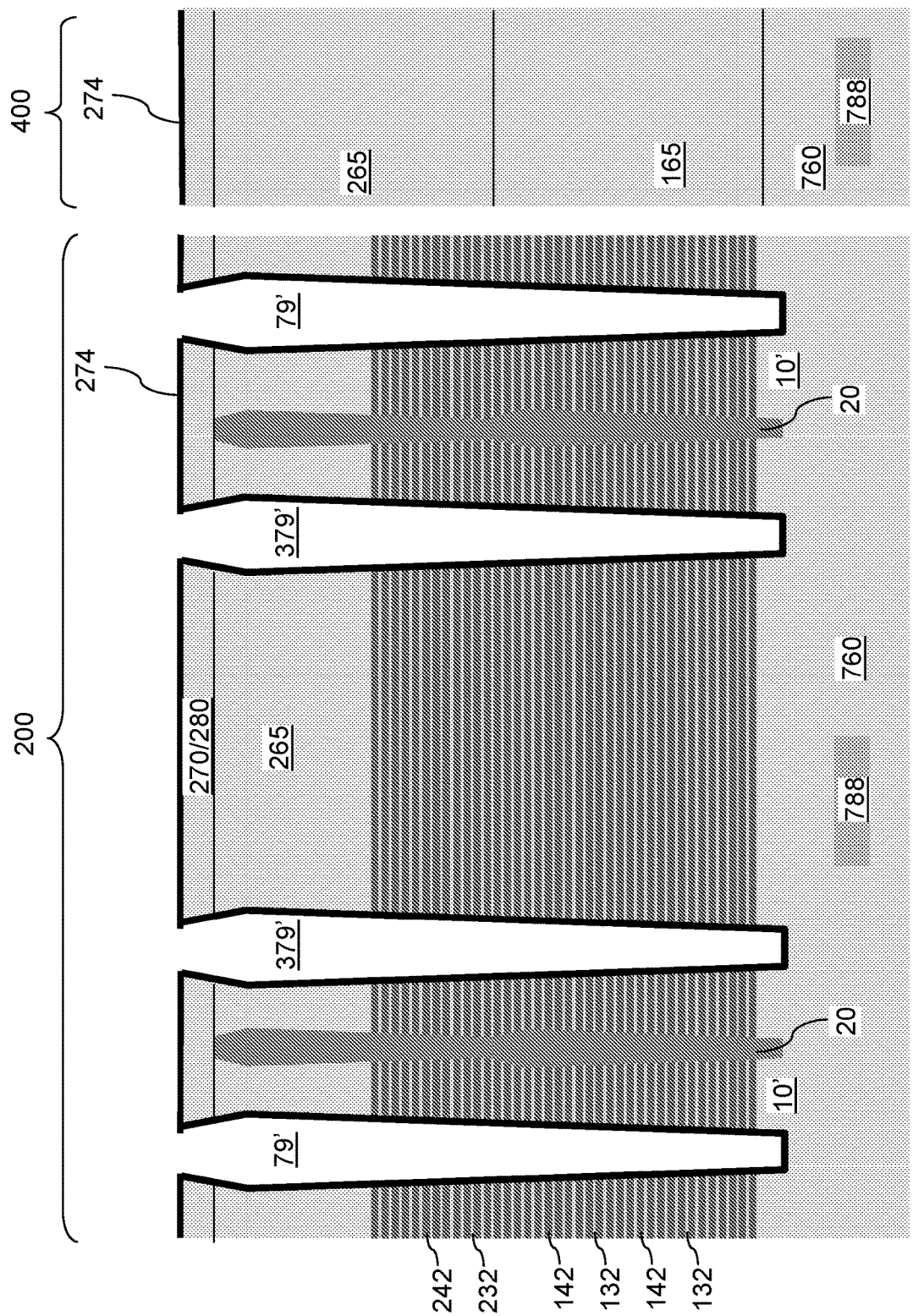
FIG. 24B is a vertical cross-sectional view of the second configuration of the second exemplary structure after formation of the dielectric liner according to an embodiment of the present disclosure.
FIG. 24C is a vertical cross-sectional view of the second exemplary structure in the peripheral region at the processing steps of FIGS. 24A and 24B.

Referring to FIGS. 24A-24C, a dielectric liner 274 may be formed by a conformal deposition in the backside trenches 79, in the moat trenches 379, and over the first contact level dielectric layer 280. The dielectric liner 274 may include a dielectric material that is different from the dielectric material of the sacrificial material layers (142, 242). For example, the dielectric liner 274 may include silicon oxide or a dielectric metal oxide (such as aluminum oxide). The thickness of the dielectric liner 274 may be in a range from 4 nm to 40 nm, although lesser and greater thicknesses may also be used. An unfilled volume is present within each backside trench 79, which is herein referred to as a backside cavity 79'. An unfilled volume is present within each moat trench 379, which is herein referred to as a moat cavity 379'.

Figure 25A:
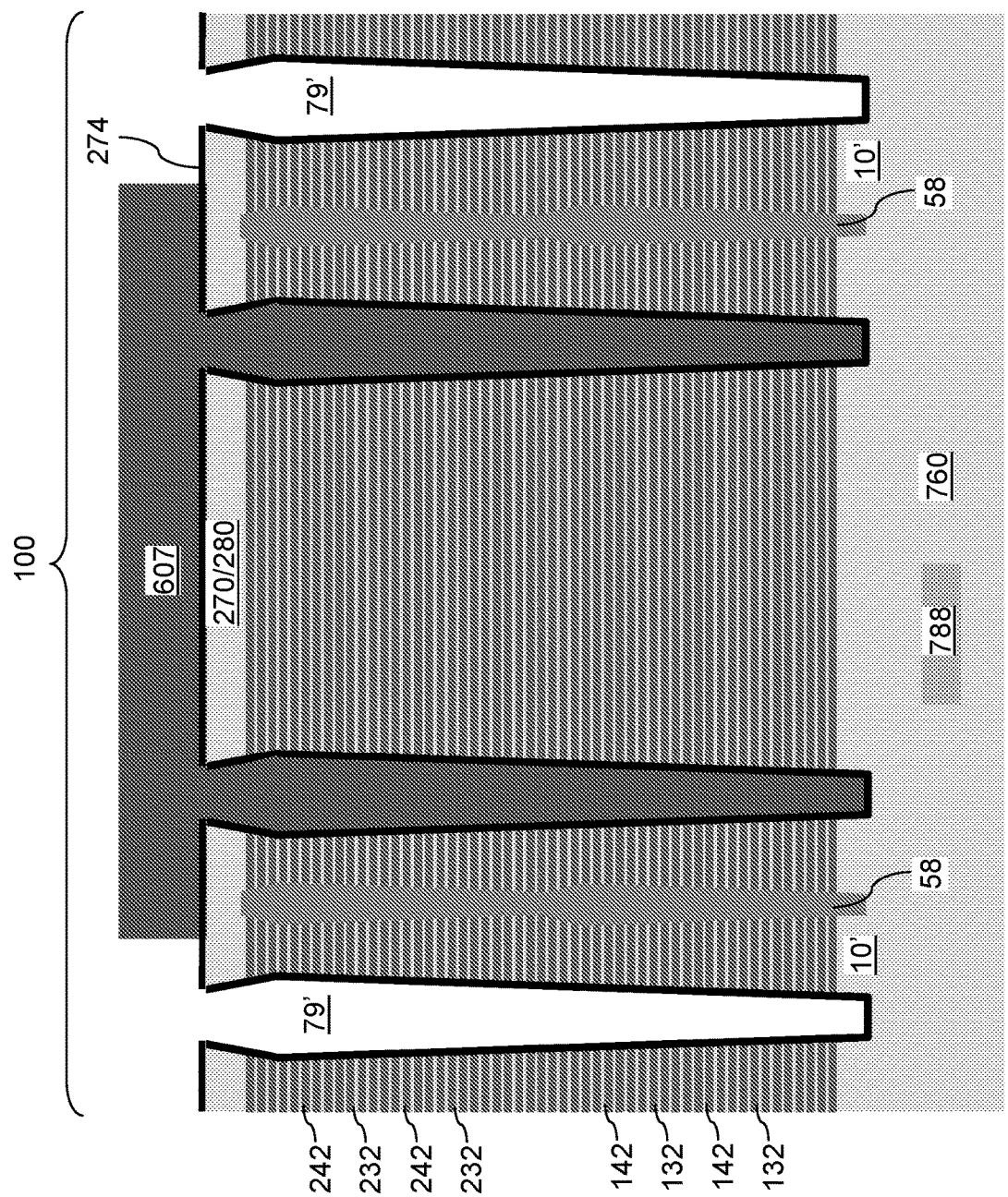
FIG. 25A is a vertical cross-sectional view of the first configuration of the second exemplary structure after application and patterning of a photoresist layer according to an embodiment of the present disclosure.
Figures 25B, 25C:
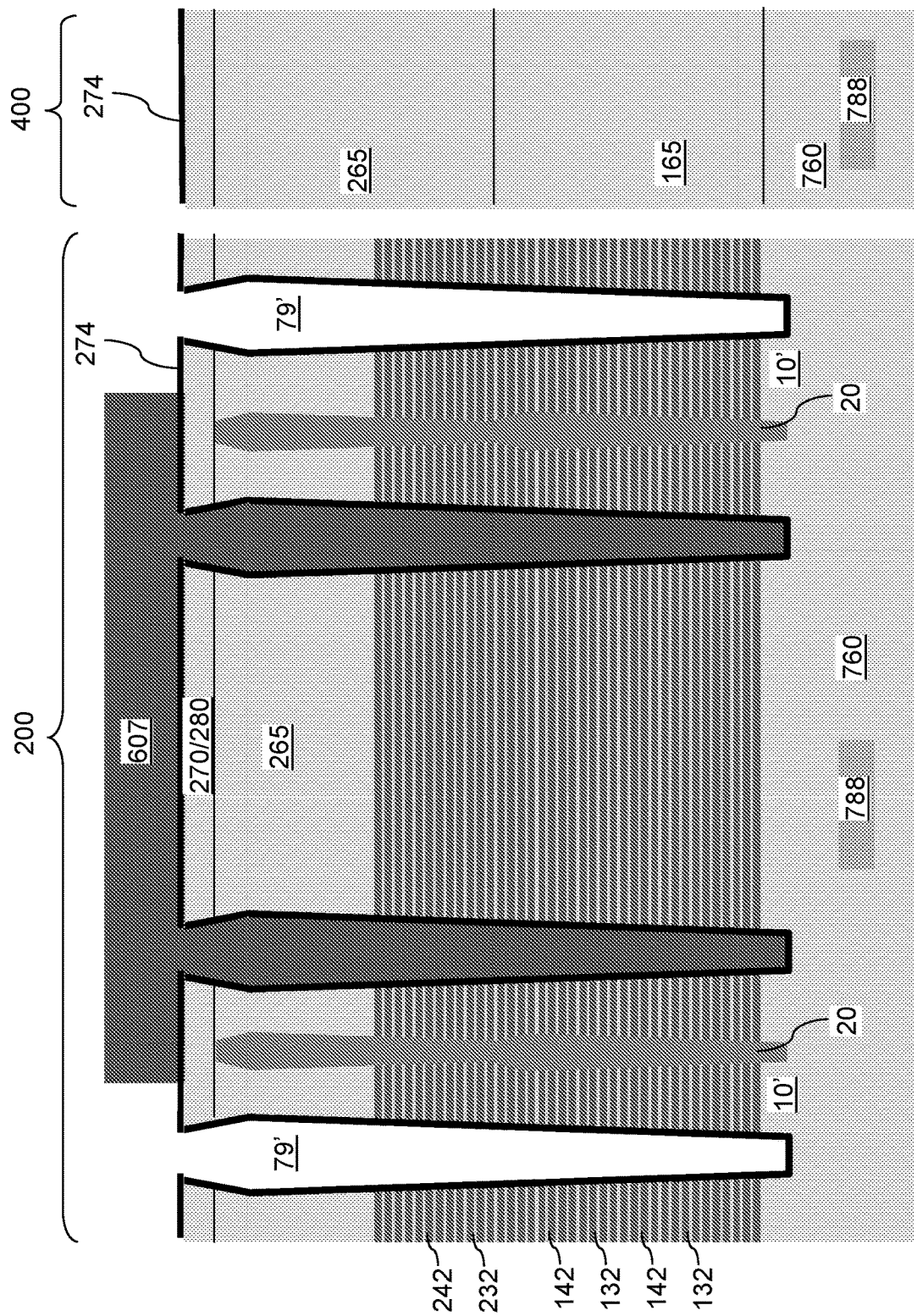
FIG. 25B is a vertical cross-sectional view of the second configuration of the second exemplary structure after application and patterning of a photoresist layer according to an embodiment of the present disclosure.
FIG. 25C is a vertical cross-sectional view of the second exemplary structure in the peripheral region at the processing steps of FIGS. 25A and 25B.

Referring to FIGS. 25A-25C, a photoresist layer 607 may be applied over the first exemplary structure, and may be lithographically patterned to cover the moat trenches 379 and the discrete via openings 279 (if present) without covering the backside trenches 79. A backside cavity 79' that is not filled within the photoresist layer 607 may be present within each backside trench 79.

Figure 26A:
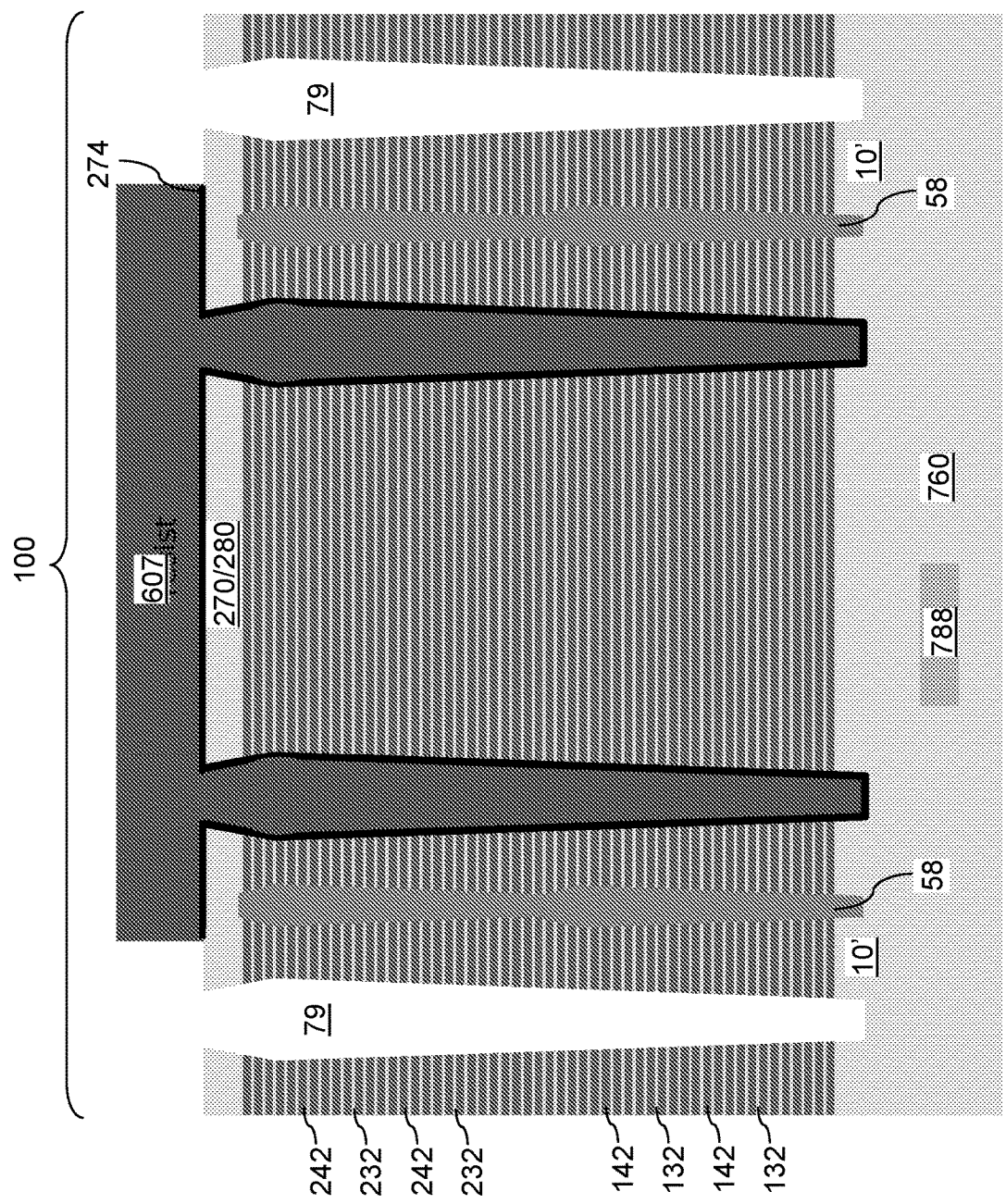
FIG. 26A is a vertical cross-sectional view of the first configuration of the second exemplary structure after removal of unmasked portions of the dielectric liner according to an embodiment of the present disclosure.

Referring to FIGS. 26A-26C, an isotropic etch process may be performed to remove portions of the dielectric liner 274 that are not masked by the photoresist layer 607. The dielectric liner 274 may be divided into multiple dielectric liners 274 located between a respective neighboring pair of backside trenches 79 and covering a subset of the moat trenches 379 between the respective neighboring pair of backside trenches 79. A top surface of the source-level sacrificial layer 104 may be physically exposed at the bottom of each backside trench 79. Further, sidewalls of insulating layers (132, 232) and sacrificial material layers (142, 242) may be physically exposed around each backside trench 79.

Figure 27A:
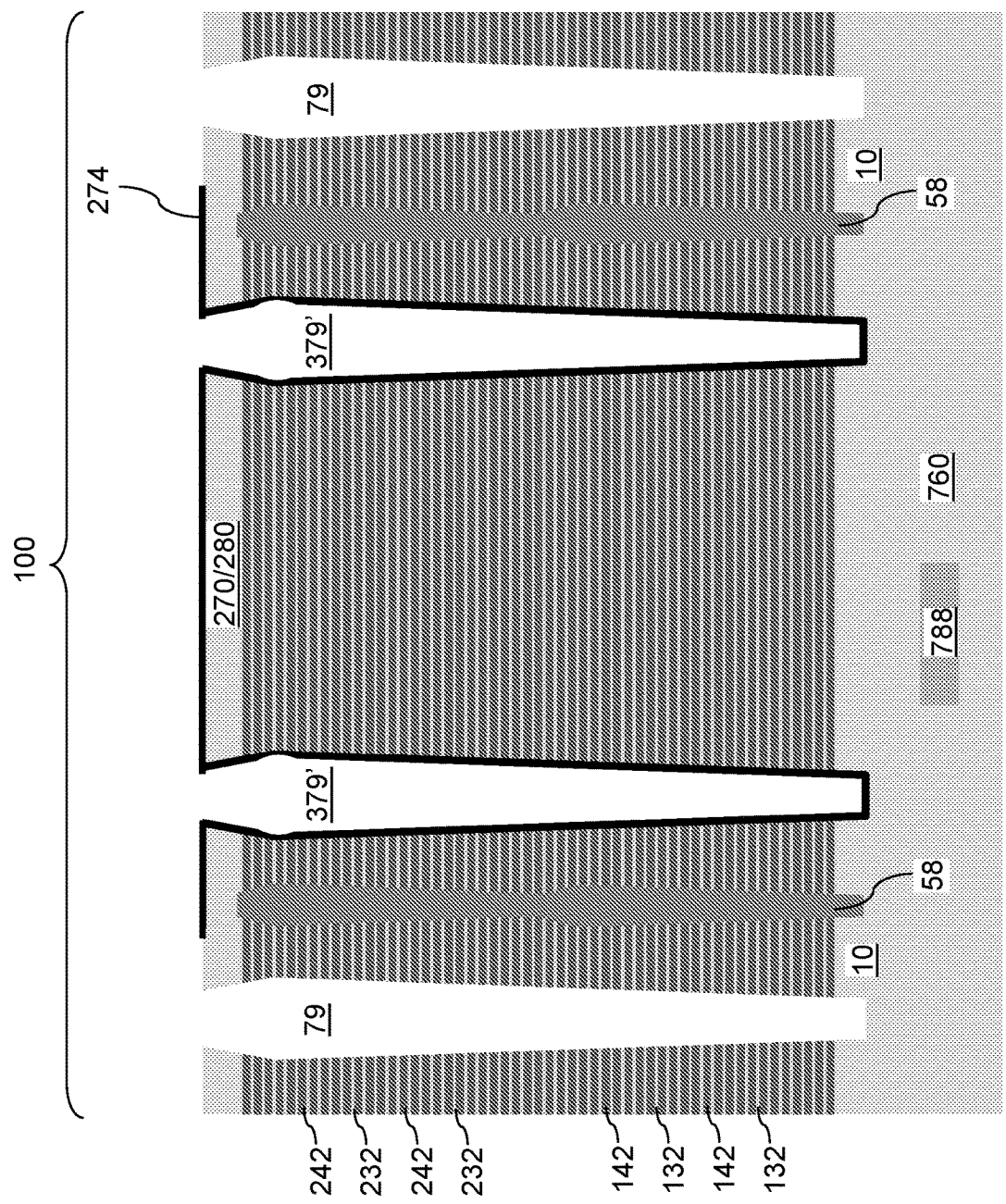
FIG. 27A is a vertical cross-sectional view of the first configuration of the second exemplary structure after formation of source-level material layers and removal of the patterned photoresist layer according to an embodiment of the present disclosure.

Referring to FIGS. 27A-27C, the photoresist layer 607 can be removed, for example, by ashing. Sidewalls of each moat trench 379 can be covered with a respective dielectric liner 274, and sidewalls of each backside trench 79 can be physically exposed.

Subsequently, processing steps of FIGS. 15B-15E and 16 can be subsequently formed to replace the source-level sacrificial layer 104 and the upper and lower sacrificial liners (105, 103) with a source contact layer 114, and to form dielectric semiconductor oxide plates. For example, the source-level sacrificial layer 104 can be removed by applying an isotropic etchant that etches the material of the source-level sacrificial layer 104 selective to materials of the alternating stack {(132, 142}, (232, 242)} through the backside trenches 79 as illustrated in FIG. 15B. A source cavity 109 is formed in a volume from which the source-level sacrificial layer 104 is removed. Sidewalls of the vertical semiconductor channels 60 are physically exposed by removing portions of the memory films 50 around the source cavity 109 as illustrated in FIG. 15C. The source contact layer 114 is formed in the source cavity 109 directly on physically exposed sidewalls of the vertical semiconductor channels 10 as illustrated in FIG. 15D. The source-level material layers 10 can be formed by replacing the source-level sacrificial layer 104 with a source contact layer 114 as illustrated in FIG. 15D. The processing steps of FIGS. 15E and 16 can be subsequently formed.

Figure 28A:
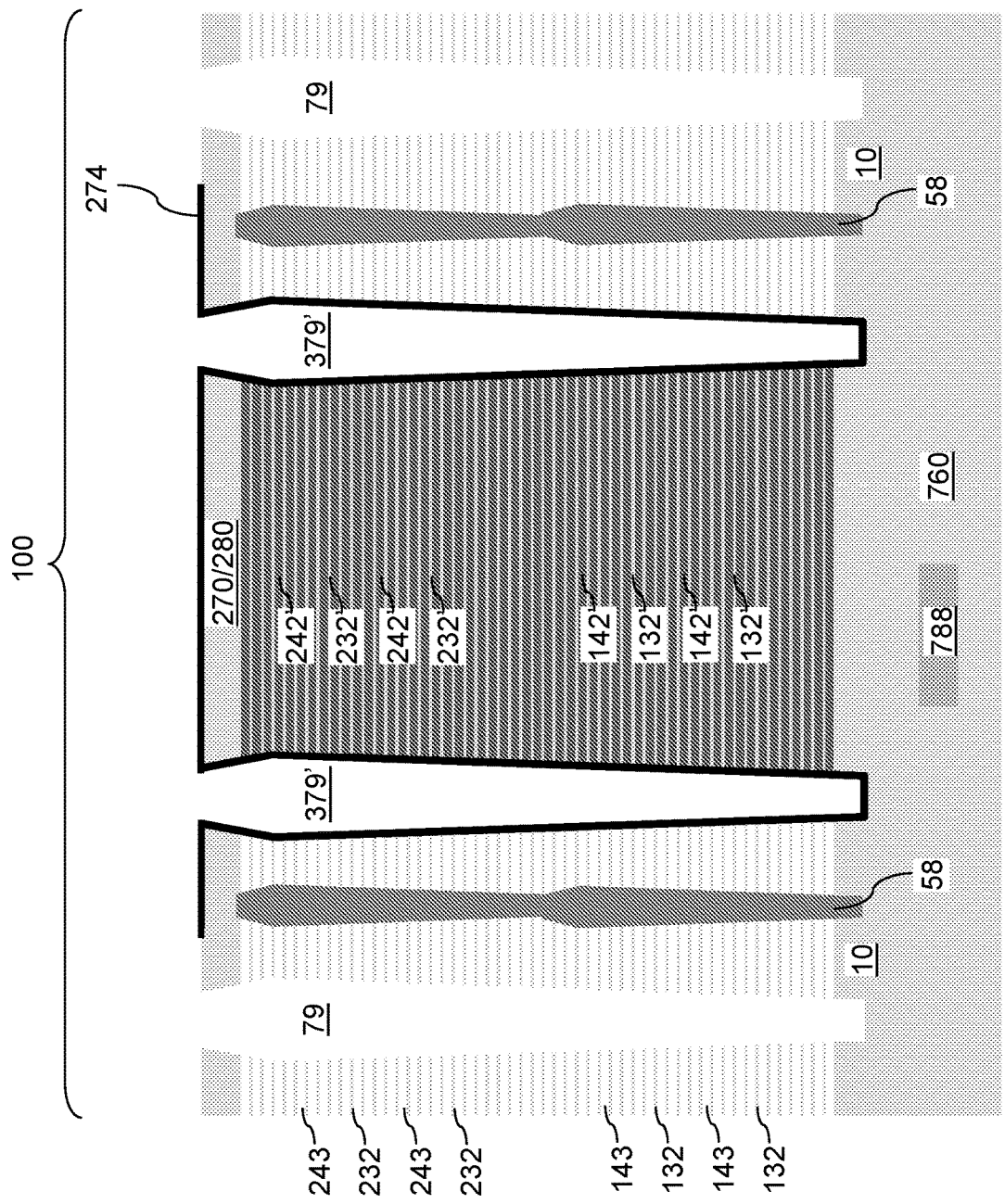
FIG. 28A is a vertical cross-sectional view of the first configuration of the second exemplary structure after removal of sacrificial material layers and formation of backside recesses according to an embodiment of the present disclosure.
Figures 28B, 28C:
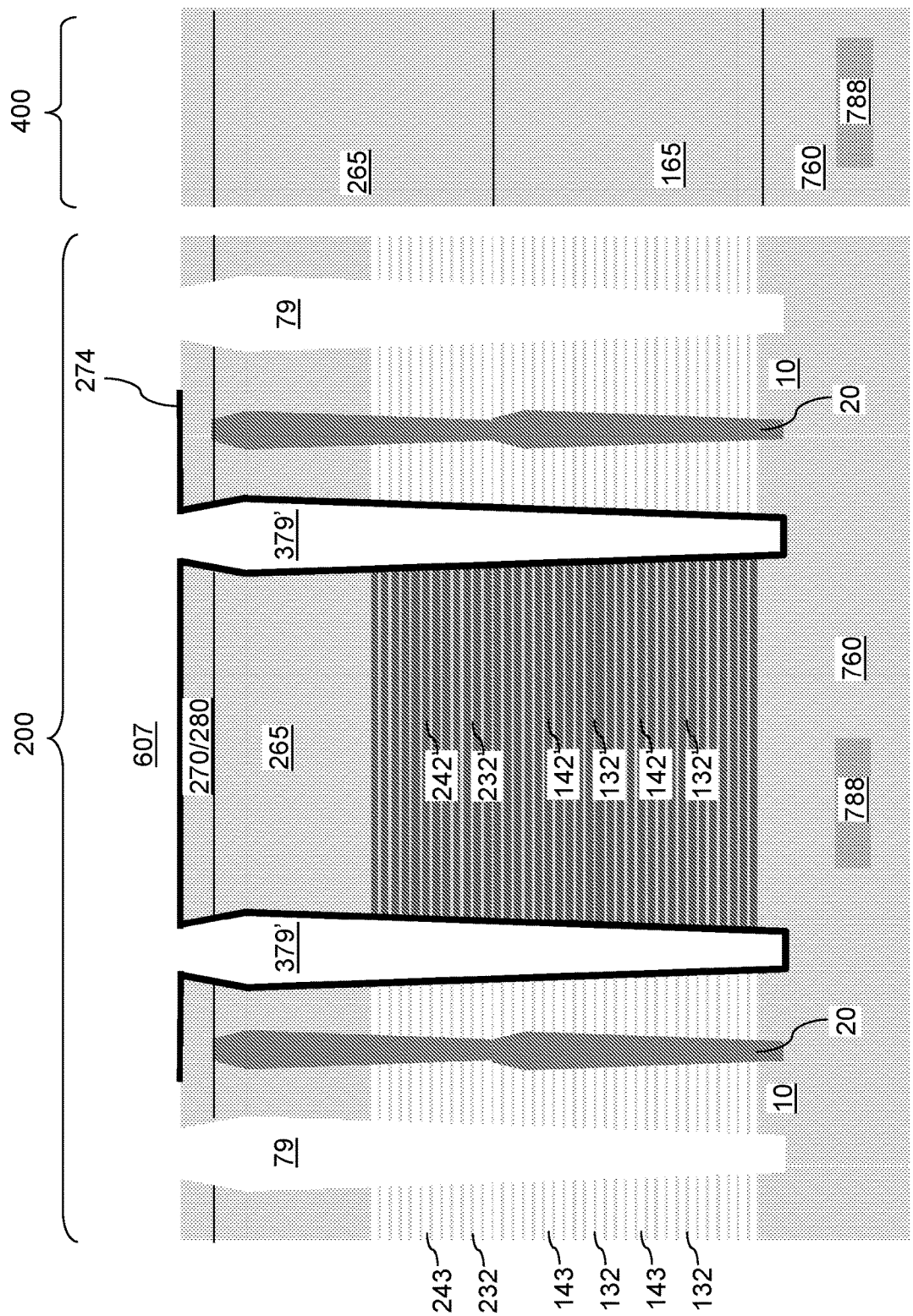
FIG. 28B is a vertical cross-sectional view of the second configuration of the second exemplary structure after removal of sacrificial material layers and formation of backside recesses according to an embodiment of the present disclosure.
FIG. 28C is a vertical cross-sectional view of the second exemplary structure in the peripheral region at the processing steps of FIGS. 28A and 28B.

Referring to FIGS. 28A-28C, the processing steps of FIGS. 17A-17E can be performed. Portions of the sacrificial material layers (142, 242) adjacent to the backside trenches 79 can be isotropically etched selective to the insulating layers (132, 232) by introducing an isotropic etchant into the backside trenches 79 while the moat trenches 379 are covered by the dielectric liners 274. Backside recesses (143, 243) are formed in volumes from which portions of the sacrificial material layers (142, 242) are removed. The backside recesses (143, 243) can laterally extend to outer sidewalls of a respective dielectric liner 274 that contacted patterned portions of the insulating layers (132, 232) located outside a respective moat trench 379.

Figure 29A:
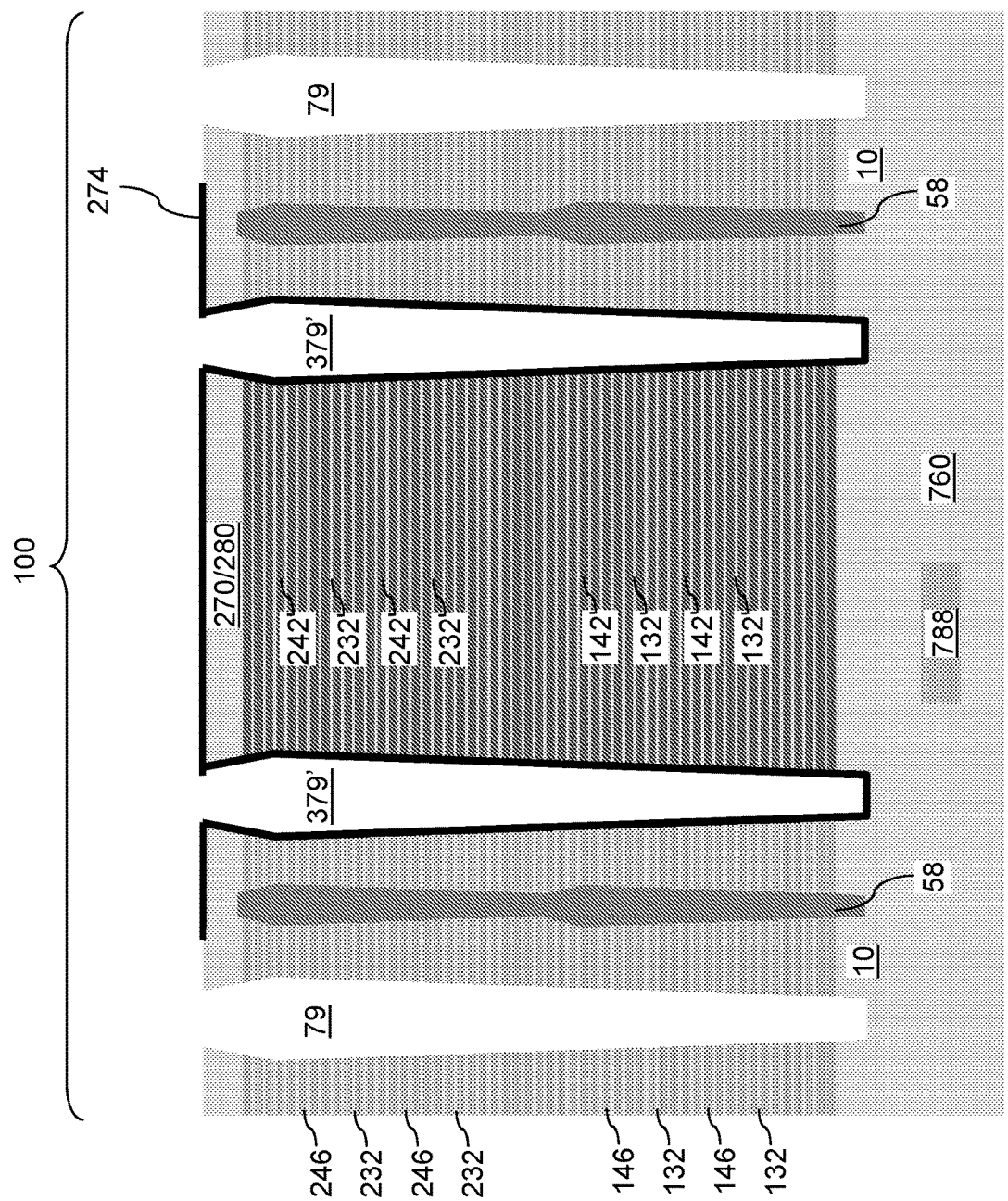
FIG. 29A is a vertical cross-sectional view of the first configuration of the second exemplary structure after formation of electrically conductive layers according to an embodiment of the present disclosure.

Referring to FIGS. 29A-29C, the processing steps of FIG. 18 can be performed to form electrically conductive layers (146, 246) in the backside recesses (143, 243). First electrically conductive layers 146 are formed in the first backside recesses 143, and second electrically conductive layers 246 are formed in the second backside recesses 243. Portions of the sacrificial material layers (142, 242) outside each moat trench 379 can be replaced with electrically conductive layers (146, 246) without replacing the vertically alternating sequence of the insulating plates (132', 232') and the dielectric spacer plates (142', 242').

Figure 30A:
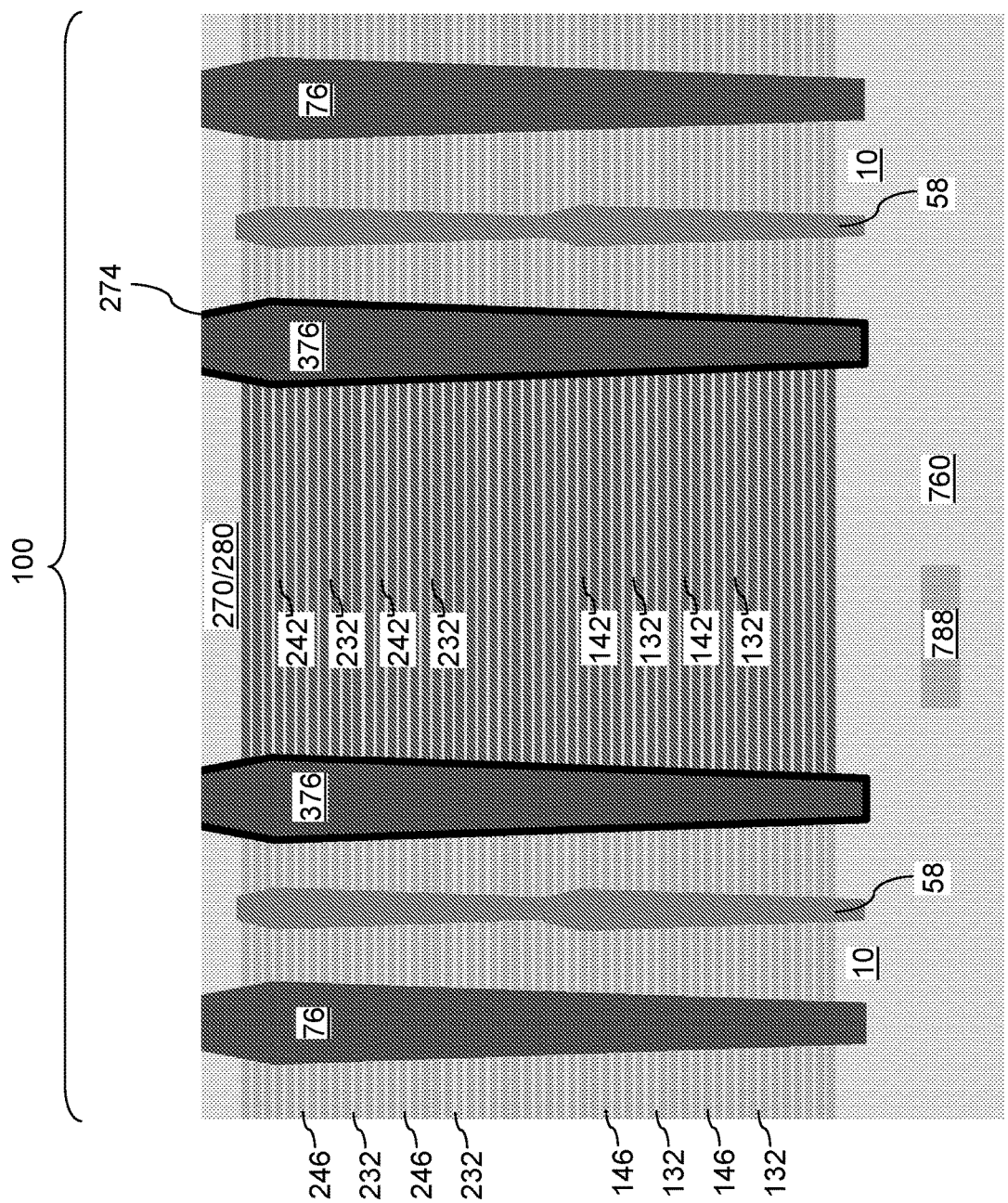
FIG. 30A is a vertical cross-sectional view of the first configuration of the second exemplary structure after formation of dielectric backside trench fill structures and dielectric fill material portions according to an embodiment of the present disclosure.

Referring to FIGS. 30A-30C, the processing steps of FIGS. 19A-19G can be performed to deposit a dielectric fill material in the backside cavities 79' and the moat cavities 379'. For example, the dielectric fill material may include silicon oxide. Excess portions of the dielectric fill material overlying the first contact level dielectric layer 280 may be removed by a planarization process, which may include chemical mechanical planarization (CMP) and/or a recess etch. Each remaining portion of the dielectric fill material that fills a moat cavity 379' constitutes a first dielectric fill material portion 376, which vertically extends through at least two layers within an alternating stack {(132, 146), (232, 246)} of insulating layers (132, 232) and electrically conductive layers (146, 246). Each contiguous set of a first dielectric fill material portion 376 and a dielectric liner 274 that fills a moat trench 379 constitutes a dielectric moat trench fill structure (274, 376). Each remaining portion of the dielectric fill material that fills a backside trench 79 constitutes a second dielectric fill material portion, which is herein referred to as a dielectric backside trench fill structure 76. Each dielectric backside trench fill structure 76 laterally extends along the first horizontal direction hd1 and vertically extends through each layer within a neighboring pair of alternating stacks {(132, 146), (232, 246)} of insulating layers (132, 232) and electrically conductive layers (146, 246). The first dielectric fill material portions 376 and the second dielectric fill material portions (i.e., the dielectric backside trench fill structures 76) can be formed simultaneously in the moat trenches 379 and in the backside trenches 79 employing a same dielectric material deposition process and a same planarization process.

Figure 31A:
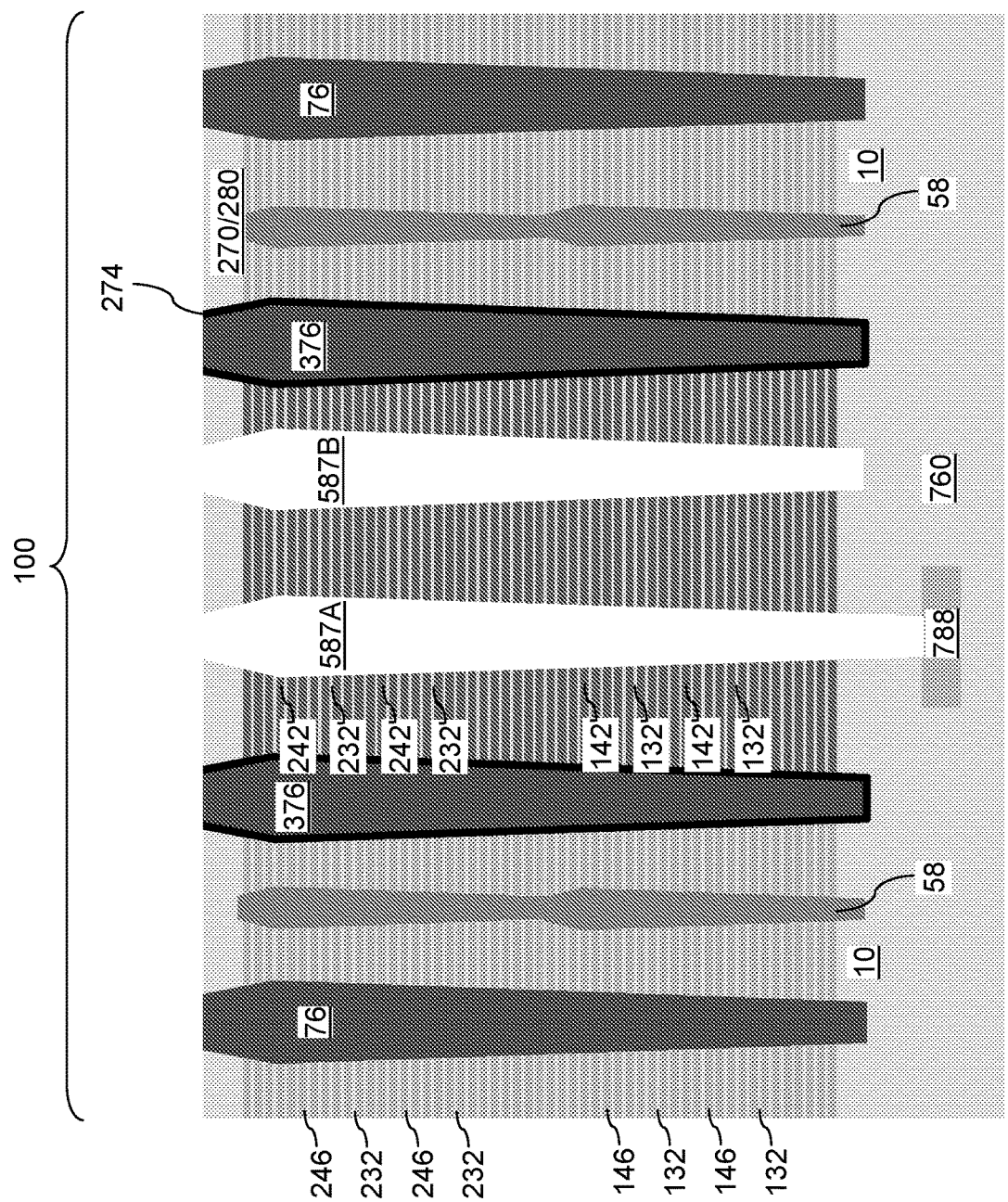
FIG. 31A is a vertical cross-sectional view of the first configuration of the second exemplary structure after formation of device-region interconnection via cavities and source contact via cavities according to an embodiment of the present disclosure.
Figure 32A:
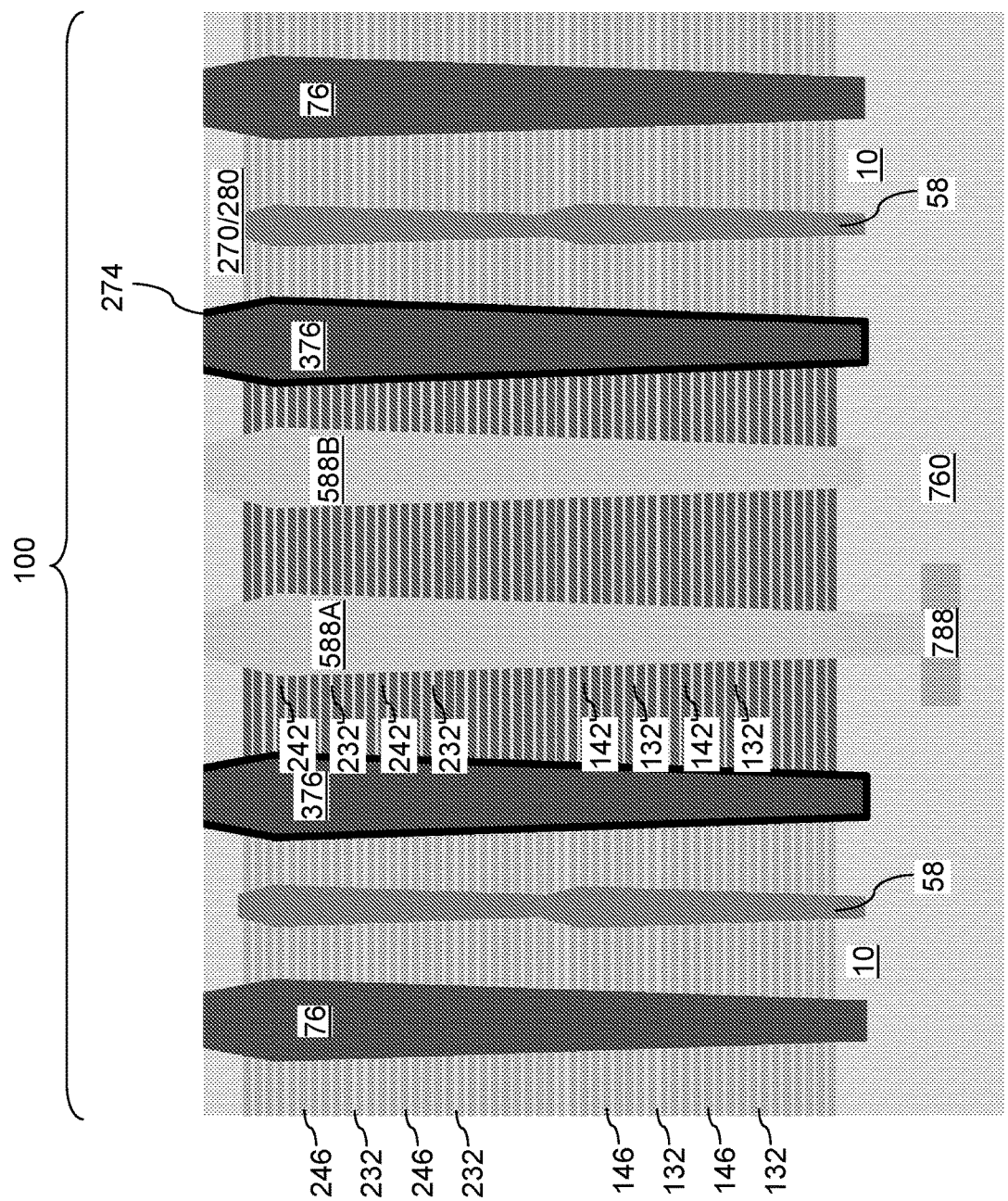
FIG. 32A is a vertical cross-sectional view of the first configuration of the second exemplary structure after formation of through-memory-level interconnection via structures according to an embodiment of the present disclosure.
Figure 32D:
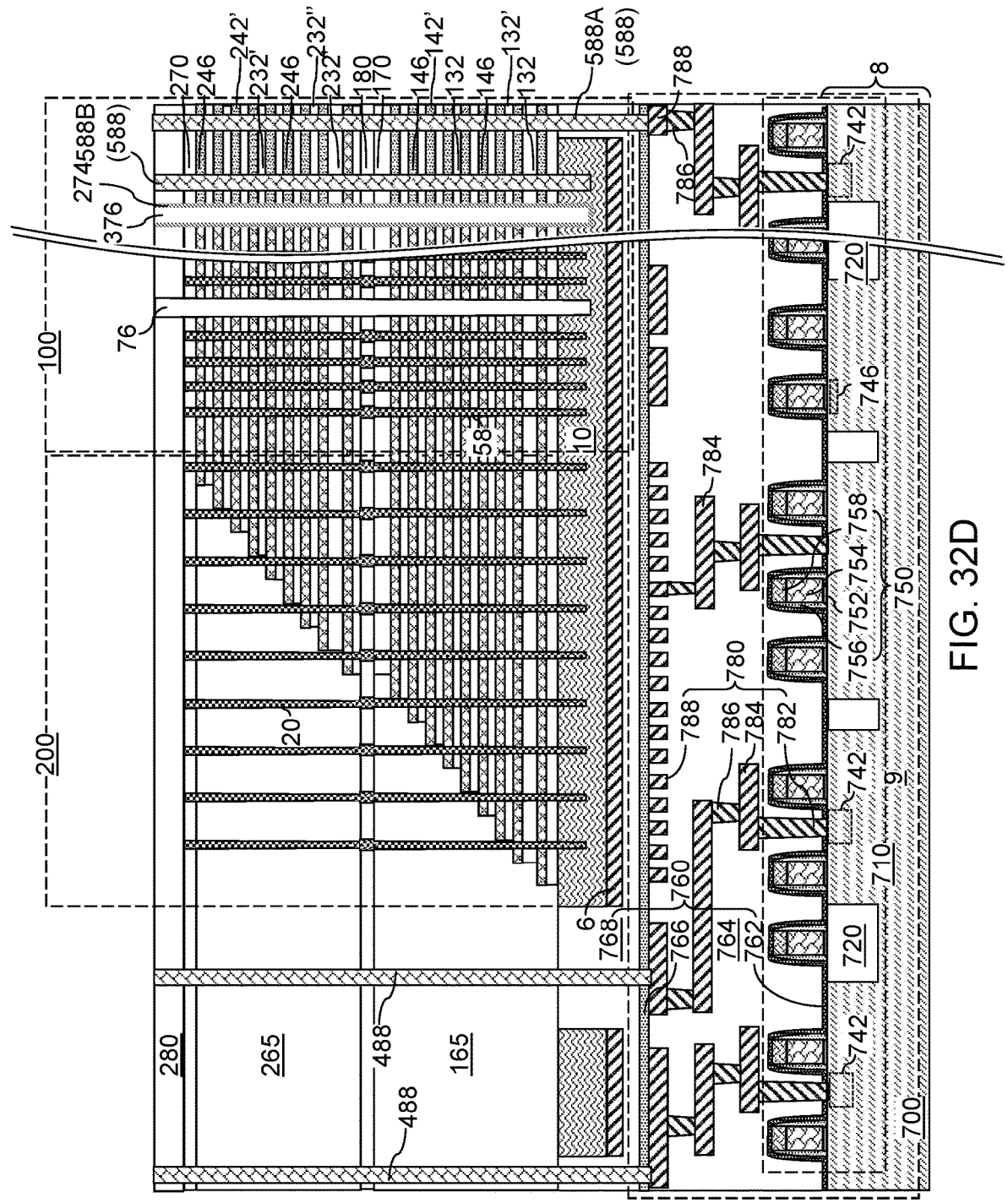
FIG. 32D is a vertical cross-sectional view of the second exemplary structure of FIGS. 32A and 32C or FIGS. 32B and 32C.
Figure 32E:
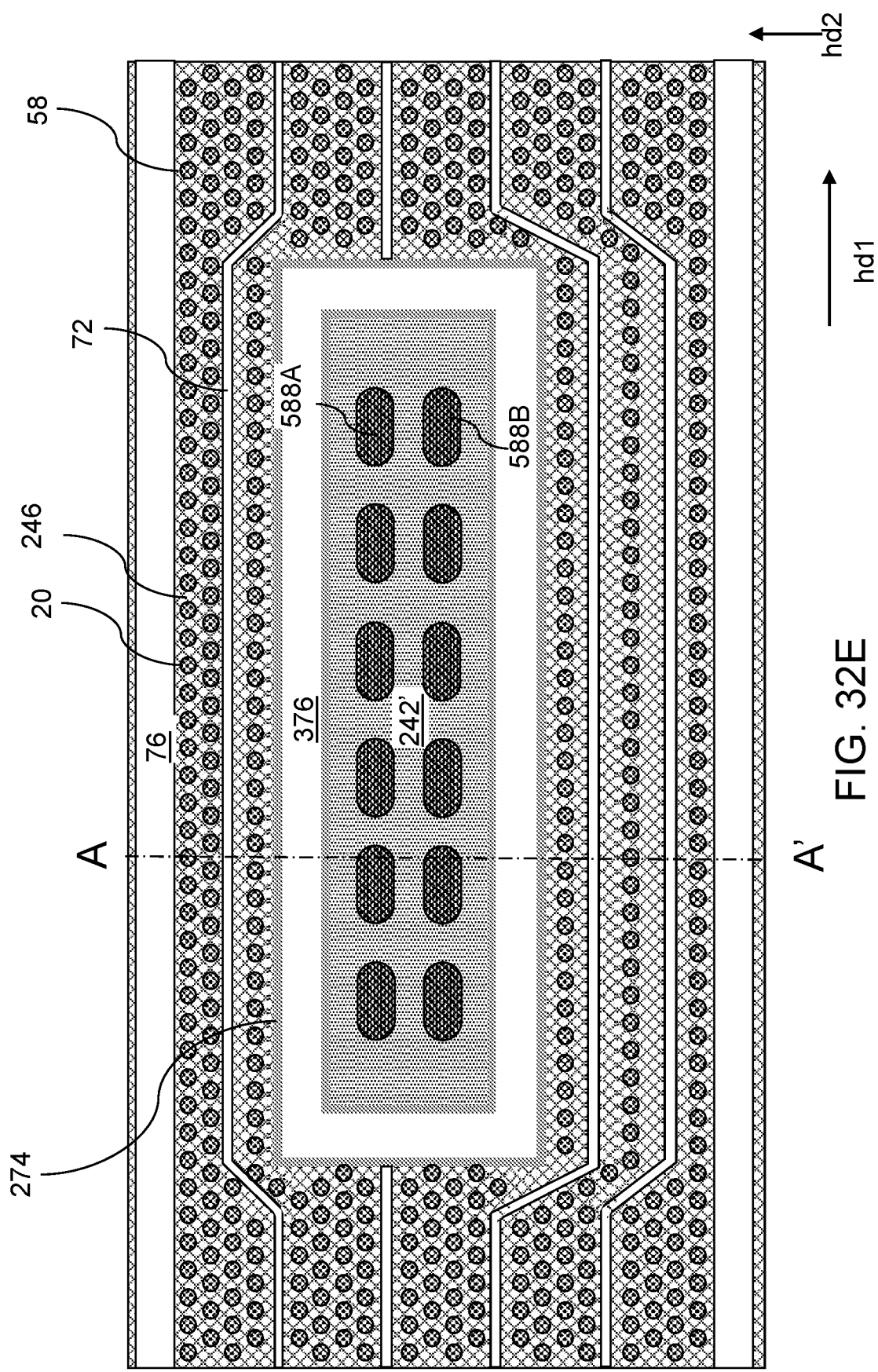
FIG. 32E is a horizontal cross-sectional of the first configuration of the second exemplary structure along the horizontal plane E-E' of FIG. 32A. The vertical plane A-A' corresponds to the plane of the vertical cross-sectional view of FIG. 32A.
Figure 32F:
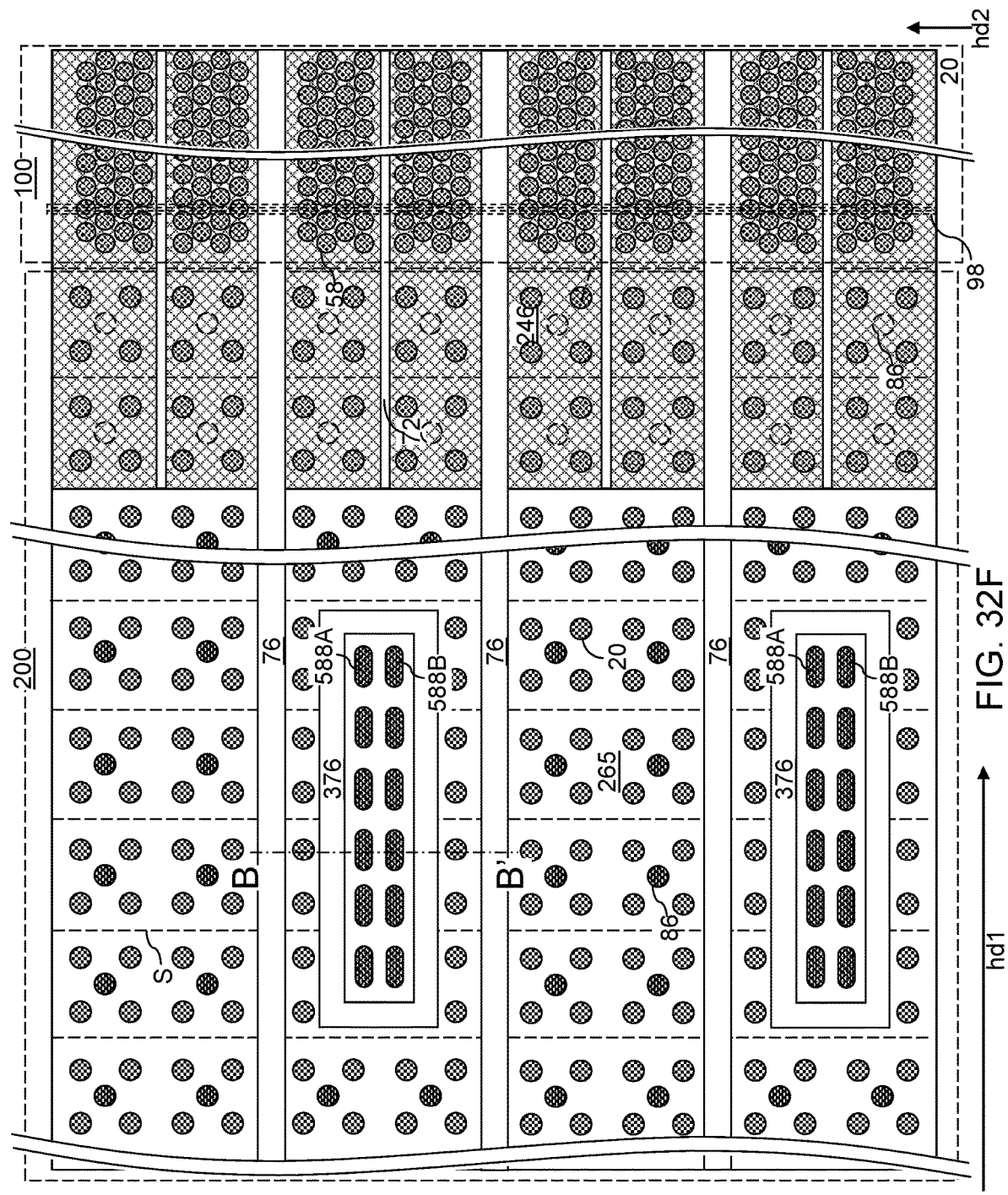
FIG. 32F is a horizontal cross-sectional of the second configuration of the second exemplary structure along the horizontal plane F-F' of FIG. 32B. The vertical plane B-B' corresponds to the plane of the vertical cross-sectional view of FIG. 32B.

Referring to FIGS. 31A-31C, via cavities (587A, 587B, 487) can be simultaneously formed through each vertically alternating sequence of insulating plates (132', 232') and dielectric spacer plates (142', 242') in the memory array region 100 and/or in the staircase region 200, and through each dielectric material portion located in the peripheral region 400 between a horizontal plane including the bottom surface of the bottommost layer of the alternating stacks of insulating layers (132, 232) and the electrically conductive layers (146, 246) and a horizontal plane including the top surface of the topmost layer of the alternating stacks {(132, 146), (232, 246)}. For example, a photoresist layer (not shown) can be applied over the first contact level dielectric layer 280, and can be lithographically patterned to form openings within the areas of the vertically alternating sequences {(132', 142'), (232', 242')} and within the areas of the peripheral region 400 in which the alternating stacks {(132, 146), (232, 246)} are absent. An anisotropic etch can be performed to transfer the pattern of openings in the photoresist layer through the alternating sequences {(132', 142'), (232', 242')} and through the dielectric material portions in the peripheral region 400 to form the via cavities (587A, 587B, 487). The photoresist layer can be subsequently removed, for example, by ashing.

The vie cavities (587A, 587B, 487) can include device-region interconnection via cavities 587A vertically extending through a respective vertically alternating sequence of insulating plates (132', 232') and dielectric spacer plates (142', 242'), through an upper portion of the lower-level dielectric material layers 760 located within an opening in the source-level material layers 10, and down to a top surface of a lower-level metal interconnect structures 780 (such as landing-pad-level metal line structures 788). Alternatively or additionally, the via cavities (587A, 587B, 487) can include source contact via cavities 587B vertically extending through a respective vertically alternating sequence of insulating plates (132', 232') and dielectric spacer plates (142', 242') and into the source-level material layers 10. A surface of the source-level material layers 10 (such as a surface of a source contact layer 114) can be physically exposed at the bottom of each source contact via cavity 587B. The via cavities (587A, 587B, 487) can include peripheral-region interconnection via cavities 487 that are formed in the peripheral region 400. The device-region interconnection via cavities 587A and the source contact via cavities 587B are herein referred to as first through-memory-level via cavities (587A, 587B). As used herein, a "through-memory-level via cavity" refers to a via cavity that extends through layers of the memory levels, i.e., through layers located at levels that contain memory cells comprising charge storage elements within the charge storage layers 54.

The peripheral-region interconnection via cavities 487 vertically extend through the first contact level dielectric layer 280, the second insulating cap layer 270, the second retro-stepped dielectric material portion 265, the first retro-stepped dielectric material portion 165, and an upper portion of the lower-level dielectric material layers 760. Each peripheral-region interconnection via cavities 487 can vertically extend down to a top surface of a lower-level metal interconnect structures 780 (such as landing-pad-level metal line structures 788). The peripheral-region interconnection via cavities 487 are herein referred to as second through-memory-level via cavities.

Referring to FIGS. 32A-32F, at least one conductive material can be deposited in the first through-memory-level via cavities (587A, 587B) and in the second through-memory-level via cavities (i.e., the peripheral-region interconnection via cavities 487). Excess portions of the at least one conductive material can be removed from above the horizontal plane including the top surface of the first contact level dielectric layer 280. The at least one conductive material can include, for example, a metallic nitride liner material such as TiN, TaN, or WN, and at least one conductive fill material such as W, Cu, Co, Ru, Mo, a heavily-doped semiconductor material, or alloys or combinations thereof.

Each portion of the at least one conductive material deposited in a first through-memory-level via cavity (587A, 587B) constitutes a first through-memory-level interconnection via structure (588A, 588B). The first through-memory-level interconnection via structures (588A, 588B) include device-region through-memory-level interconnection via structures 588A that are formed in the device-region interconnection via cavities 587A and source contact through-memory-level interconnection via structures 588B that are formed in the source contact via cavities 587B. Each portion of the at least one conductive material deposited in a second through-memory-level via cavity 487 constitutes a second through-memory-level interconnection via structure, which is also referred to as a peripheral through-memory-level interconnection via structure 488. Thus, the first through-memory-level interconnection via structures (588A, 588B) extending through a vertically alternating sequence {(132', 142'), (232', 242')} inside a respective moat trench 379 and second through-memory-level interconnection via structures (i.e., the peripheral through-memory-level interconnection via structure 488) extending through the dielectric material portion(s) (such as the second and first retro-stepped dielectric material portions (265, 165)) can be simultaneously formed employing a same conductive material deposition process and a same planarization process.

In one embodiment, a subset of the first through-memory-level interconnection via structures (588A, 588B) (such as the device-region through-memory-level interconnection via structures 588A) and the second through-memory-level interconnection via structures (i.e., the peripheral through-memory-level interconnection via structure 488) can be formed on a respective one of the lower-level metal interconnect structures 788.

Subsequently, upper-level metal interconnect structures embedded within upper-level dielectric material layers can be formed over the first through-memory-level interconnection via structures (588A, 588B) and the second through-memory-level interconnection via structures (i.e., the peripheral through-memory-level interconnection via structure 488), for example, by performing the processing steps of FIG. 22. Each of the first through-memory-level interconnection via structures (588A, 588B) and the second through-memory-level interconnection via structures (i.e., the peripheral through-memory-level interconnection via structure 488) can be electrically connected to a respective one of the upper-level metal interconnect structures.

Simultaneous formation of the first through-memory-level interconnection via structures (588A, 588B) and the second through-memory-level interconnection via structures (i.e., the peripheral through-memory-level interconnection via structure 488) reduce the processing cost for forming the three-dimensional memory device of the embodiments of the present disclosure by reducing the total number of processing steps. Formation of an insulating liner around any through-memory-level interconnection via structure (588A, 588B, 488) is not necessary because the dielectric material portions in the peripheral region 400 and the vertically alternating sequences of insulating plates (132', 232') and dielectric spacer plates (142', 242') in the memory array region 100 consist of dielectric materials. Thus, the processing sequences of embodiments of the present disclosure can provide a low cost manufacturing solution for three-dimensional memory devices employing various through-memory-level interconnection via structures.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   field effect transistors located over a semiconductor substrate;
   lower-level metal interconnect structures formed within lower-level dielectric material layers that overlie the field effect transistors;
   an alternating stack of insulating layers and composite layers located over the lower-level metal interconnect structures and between a pair of backside trenches that laterally extend along a first horizontal direction, wherein each of the composite layers comprises a respective electrically conductive layer and a respective dielectric spacer plate, and a vertically alternating sequence of the insulating plates and the dielectric spacer plates is provided within a region including the dielectric spacer plates;
   memory stack structures vertically extending through the alternating stack;
   a pair of dielectric wall structures vertically extending through each layer within the alternating stack which do not contact each other through another dielectric wall structure, wherein a vertically alternating sequence of the insulating plates and the dielectric spacer plates is located between the pair of dielectric wall structures; and
   at least one conductive via structure vertically extending through the vertically alternating sequence and contacting a top surface of a respective one of the lower-level metal interconnect structures.

2. The three-dimensional memory device of claim 1, wherein the dielectric spacer plates are not completely surrounded by dielectric wall structures.

3. The three-dimensional memory device of claim 1, wherein each of the dielectric wall structures includes a respective uniform-width region that laterally extend along the first horizontal direction with a respective uniform width along a second horizontal direction that is perpendicular to the first horizontal direction.

4. The three-dimensional memory device of claim 3, wherein:
   each of the dielectric spacer plates comprises lengthwise sidewalls that extend along the first horizontal direction and contacts a respective one of the pair of dielectric wall structures; and
   each of the pair of dielectric wall structures has a greater lateral extent than the pair of lengthwise sidewalls of the dielectric spacer plates.

5. The three-dimensional memory device of claim 4, wherein the pair of dielectric wall structures has a same lateral extent along the first horizontal direction.

6. The three-dimensional memory device of claim 4, wherein:
   the pair of dielectric wall structures are laterally offset along the second horizontal direction from a respective proximal backside trench selected from the pair of backside trenches by unequal lateral trench-to-dielectric spacings; and
   a dielectric wall structure of the pair of dielectric wall structures having a greater trench-to-sidewall spacing has a lateral extent along the first horizontal direction that is less than a lateral extent along the first horizontal direction for a dielectric wall structure of the pair of dielectric wall structures having a lesser trench-to-sidewall spacing.

7. The three-dimensional memory device of claim 4, wherein each of the pair of dielectric wall structures comprises angled sidewalls located within a respective vertical plane that is at an angle in a range from 15 degrees to 75 degrees with respect to a vertical plane including the first horizontal direction.

8. The three-dimensional memory device of claim 2, wherein each of the pair of dielectric wall structures is located within a respective elongated trench that vertically extends through each layer of the alternating stack and has a greater lateral dimension along the first horizontal direction than along the second horizontal direction.

9. The three-dimensional memory device of claim 1, wherein each of the dielectric wall structures comprises:

a respective dielectric liner comprising a dielectric material having a different material composition than the dielectric spacer plates; and a dielectric fill material formed within the respective dielectric liner.

10. The three-dimensional memory device of claim 9, wherein:

the insulating layers comprise a silicon oxide material;

the dielectric liner comprises a material selected from silicon oxide and a dielectric metal oxide; and the dielectric spacer plates comprise silicon nitride.

11. The three-dimensional memory device of claim 1, further comprising drain-select-level isolation structures that vertically extend through a subset of layers within the alternating stack including a topmost one of the composite layers, wherein the drain-select-level isolation structures divide an electrically conductive layer within the topmost one of the composite layers into multiple electrically conductive strips that are electrically isolated from one another.

12. The three-dimensional memory device of claim 11, wherein each of the multiple electrically conductive strips laterally extends continuously from a first side of the vertically alternating sequence, between a respective one of the pair of backside trenches and a respective one of the dielectric wall structures, and to a second side of the vertically alternating sequence that is laterally spaced from the first side along the first horizontal direction.

13. The three-dimensional memory device of claim 11, wherein at least one of the drain-select-level isolation structures comprises a first dielectric material segment that has a uniform width and extends along the first horizontal direction, a second dielectric material segment that extends along the first horizontal direction and is laterally offset from the first dielectric material segment by a lateral offset distance, and a connection dielectric material segment connecting the first dielectric material segment and the second dielectric material segment and extending horizontally along a horizontal direction that is at an angle in a range from 15 degrees to 75 degrees with respect to the first horizontal direction.

14. The three-dimensional memory device of claim 1, further comprising a semiconductor material layer located between the lower-level dielectric material layers and the alternating stack, wherein:

each of the memory stack structures comprises a vertical semiconductor channel and a memory film; and each sidewall of the pair of dielectric wall structures vertically extend straight from a topmost layer of the alternating stack to a bottommost layer of the alternating stack.

15. The three-dimensional memory device of claim 14, wherein:

the semiconductor material layer comprises an opening that underlies the vertically alternating sequence; and the at least one conductive via structure vertically extends through, and contacts, a dielectric material located within the opening in the semiconductor material layer.

16. A method for forming a three-dimensional memory device, comprising:

forming an alternating stack of insulating layers and sacrificial material layers over a semiconductor substrate, wherein the sacrificial material layers comprise a dielectric material;

forming memory stack structures through the alternating stack;

patterning the alternating stack by performing an anisotropic etch process using a patterned mask layer, wherein the alternating stack is divided into a plurality of alternating stacks of respective insulating layers and respective sacrificial material layers by backside trenches, and wherein a pair of unconnected barrier trenches is formed through each of the plurality of alternating stacks;

forming backside recesses by isotropically etching portions of the sacrificial material layers of the plurality of alternating stacks selective to the insulating layers of the plurality of alternating stacks by introducing an isotropic etchant into the backside trenches while the barrier trenches are covered by a respective dielectric liner that blocks access of the isotropic etchant to adjacent portions of the sacrificial material layers, wherein remaining portions of the sacrificial material layers between each neighboring pair of barrier trenches constitute dielectric spacer plates, and a vertically alternating sequence of the insulating plates and the dielectric spacer plates is provided between the pair of barrier trenches;

forming electrically conductive layers in the backside recesses; and forming at least one conductive via structure through the vertically alternating sequence.

17. The method of claim 16, further comprising:

forming field effect transistors on the semiconductor substrate; and forming lower-level metal interconnect structures formed within lower-level dielectric material layers that overlie the field effect transistors, wherein:

the vertically-alternating layer stack is formed over the lower-level dielectric material layers; and the at least one conductive via structure is formed on a respective one of the lower-level metal interconnect structures.

18. The method of claim 16, further comprising: depositing a dielectric fill material on each of the dielectric liners after formation of the electrically conductive materials, wherein each material portion of the dielectric fill material and a dielectric liner that fills a respective one of the barrier trenches constitutes a dielectric wall structure.

19. The method of claim 18, wherein each pair of dielectric wall structures formed in a respective pair of barrier trenches has a greater lateral extent than the pair of lengthwise sidewalls of the dielectric spacer plates.

20. The method of claim 18, wherein each pair of dielectric wall structures formed in a respective pair of barrier trenches comprises angled sidewalls located within a respective vertical plane that is at an angle in a range from 15 degrees to 75 degrees with respect to a vertical plane including the first horizontal direction.

* * * * *